(12) United States Patent
Chang et al.

(10) Patent No.: US 11,048,065 B2
(45) Date of Patent: *Jun. 29, 2021

(54) OPTICAL IMAGE CAPTURING MODULE

(71) Applicant: ABILITY OPTO-ELECTRONICS TECHNOLOGY CO., LTD., Taichung (TW)

(72) Inventors: Yeong-Ming Chang, Taichung (TW); Chien-Hsun Lai, Taichung (TW); Yao-Wei Liu, Taichung (TW)

(73) Assignee: ABILITY OPTO-ELECTRONICS TECHNOLOGY CO., LTD., Taichung (TW)

( * ) Notice: Subject to any disclaimer, the term of this patent is extended or adjusted under 35 U.S.C. 154(b) by 301 days.

This patent is subject to a terminal disclaimer.

(21) Appl. No.: 16/223,639

(22) Filed: Dec. 18, 2018

(65) Prior Publication Data
US 2020/0057265 A1    Feb. 20, 2020

(30) Foreign Application Priority Data

Aug. 16, 2018    (TW) .................................. 107128674

(51) Int. Cl.
| G02B 7/02 | (2021.01) |
| G02B 13/00 | (2006.01) |
| G02B 5/20 | (2006.01) |
| G02B 9/62 | (2006.01) |
| G02B 9/64 | (2006.01) |
| G02B 9/60 | (2006.01) |
| H01L 27/146 | (2006.01) |
| G02B 9/16 | (2006.01) |
| G02B 9/34 | (2006.01) |

(52) U.S. Cl.
CPC ......... *G02B 13/0045* (2013.01); *G02B 5/208* (2013.01); *G02B 7/021* (2013.01); *G02B 9/16* (2013.01); *G02B 9/34* (2013.01); *G02B 9/60* (2013.01); *G02B 9/62* (2013.01); *G02B 9/64* (2013.01); *G02B 13/004* (2013.01); *G02B 13/0035* (2013.01); *H01L 27/14618* (2013.01); *H01L 27/14636* (2013.01)

(58) Field of Classification Search
None
See application file for complete search history.

*Primary Examiner* — Christopher Stanford
*Assistant Examiner* — Journey F Sumlar
(74) *Attorney, Agent, or Firm* — Muncy, Geissler, Olds & Lowe, P.C.

(57) ABSTRACT

An optical image capturing module includes a lens assembly and a circuit assembly including a circuit substrate, a sensor holder disposed on the circuit substrate, and an image sensing component connected to the circuit substrate and having a sensing surface and multiple image contacts. The circuit substrate has multiple circuit contacts. The image contacts are electrically connected to the circuit contacts. The lens assembly includes a lens base disposed on the sensor holder and a lens group. The lens base has a receiving hole penetrating through two ends of the lens base, thereby the lens base is hollow, and the receiving hole directly faces the image sensing component. The lens base is disposed on the circuit substrate, thereby the image sensing component is located in the receiving hole. The lens group includes at least two lenses, and is disposed on the lens base and is located in the receiving hole.

25 Claims, 19 Drawing Sheets

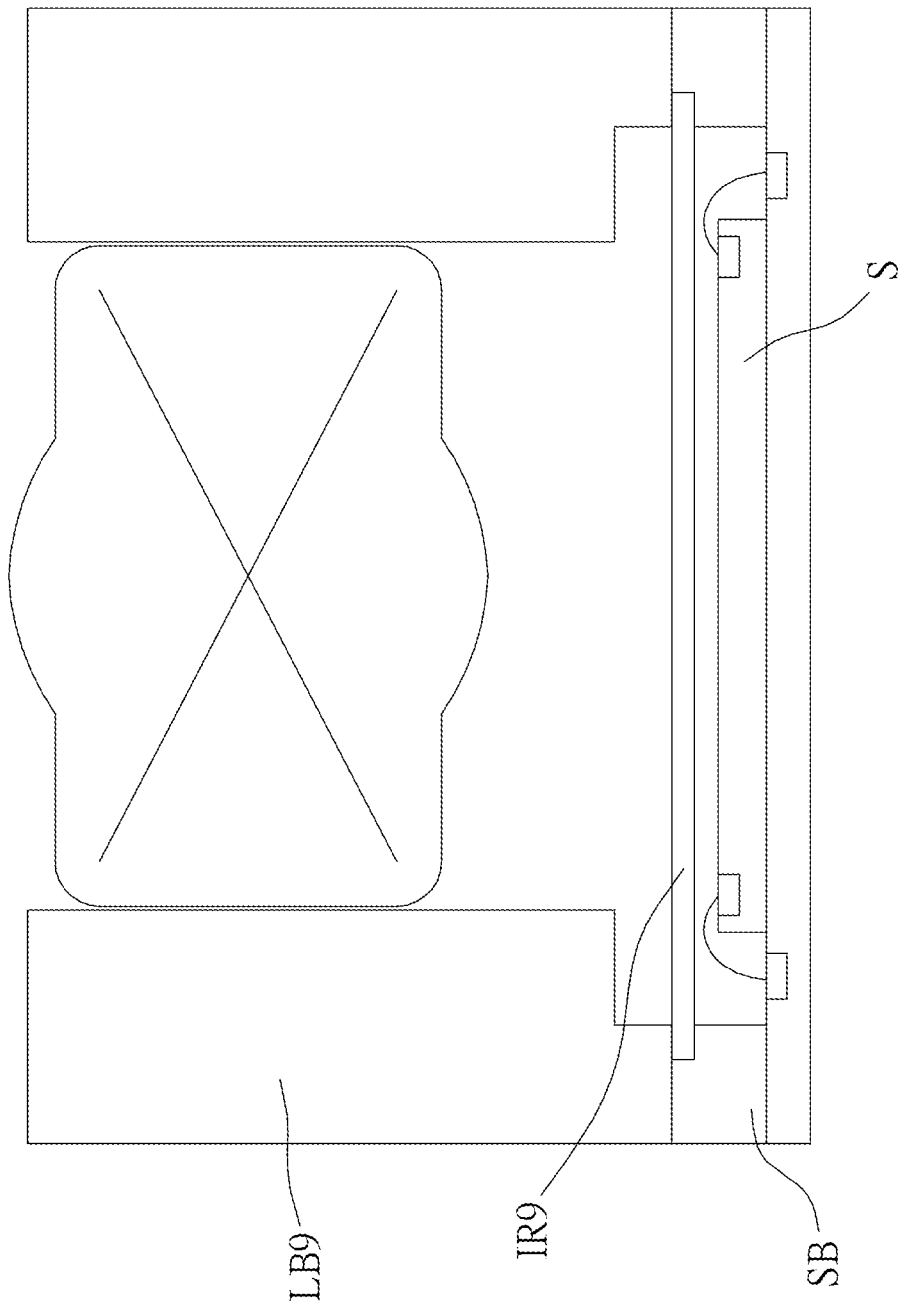

OPTICAL IMAGE CAPTURING MODULE

BACKGROUND OF THE INVENTION

Technical Field

The present invention generally relates to an optical image capturing module, and more particularly to a compact optical image capturing module for an electronic device.

Description of Related Art

In recent years, with the rise of portable electronic devices having camera functionalities, the demand for an optical image capturing system is raised gradually. The image sensing device of the ordinary photographing camera is commonly selected from charge coupled device (CCD) or complementary metal-oxide semiconductor sensor (CMOS Sensor). Also, as advanced semiconductor manufacturing technology enables the minimization of the pixel size of the image sensing device, the development of the optical image capturing system towards the field of high pixels. Therefore, the requirement for high imaging quality is rapidly raised.

The conventional optical system of the portable electronic device usually has five or sixth lenses. However, the optical system is asked to take pictures in a dark environment, in other words, the optical system is asked to have a large aperture. The conventional optical system provides high optical performance as required.

It is an important issue to increase the quantity of light entering the lens. Also, the modern lens is also asked to have several characters, including high image quality.

BRIEF SUMMARY OF THE INVENTION

The aspect of embodiment of the present disclosure directs to an optical image capturing module which use structural size design and combination of refractive powers, convex and concave surfaces of at least two optical lenses (the convex or concave surface in the disclosure denotes the geometrical shape of an image-side surface or an object-side surface of each lens on an optical axis) to reduce the size and increase the quantity of incoming light of the optical image capturing module, thereby the optical image capturing module could has a better amount of light entering therein and could improve imaging total pixels and imaging quality for image formation, so as to be applied to minimized electronic products.

The term and its definition to the structural component parameter in the embodiment of the present are shown as below for further reference.

Take FIG. 1A as an example to illustrate the structural component of the optical image capturing module. The optical image capturing module mainly includes a circuit assembly and a lens assembly, wherein the circuit assembly includes a circuit substrate EB, a sensor holder SB, and an image sensing component S. In the present invention, the image sensing component S is fixed on the circuit substrate in a Chip On Board (COB) package.

The lens assembly includes a lens base LB1 and a lens group L, wherein the lens base LB1 is made of metal (such as aluminum, copper, silver, gold, and etc.), plastic (e.g. polycarbonate (PC)), or liquid crystal plastic (LCP), which are opaque materials. In addition, a maximum value of a minimum length on a periphery of the lens base LB1 perpendicular to an optical axis of the lens group L is denoted by PhiD, wherein the lens base LB1 has a receiving hole penetrating through both ends thereof to be hollow, and is disposed on the sensor holer SB, so that the receiving hole directly faces the image sensing component S. More specifically, the lens base LB1 has a lens holder LH1 and a lens barrel B1, wherein the lens holder LH1 is hollow and is opaque, and the lens barrel B1 is hollow and is opaque and is disposed in the lens holder LH1. An inside of the lens barrel B1 and the lens holder LH1 constitute the receiving hole. Moreover, a maximum thickness of the lens holder LH1 is denoted by TH1, and a minimum thickness of the lens barrel B1 is denoted by TH2.

The lens group L includes at least two lenses with refractive power which are disposed on the lens base LB1 and are located in the receiving hole. The term and its definition to the lens parameter in the embodiment of the present are shown as below for further reference.

The lens parameter related to a length or a height in the lens:

A maximum height for image formation of the optical image capturing module is denoted by HOI. A height of the optical image capturing module (i.e., a distance between an object-side surface of the first lens and an image plane on an optical axis) is denoted by HOS. A distance from the object-side surface of the first lens to the image-side surface of the seventh lens is denoted by InTL. A distance from the first lens to the second lens is denoted by IN12 (instance). A central thickness of the first lens of the optical image capturing module on the optical axis is denoted by TP1 (instance).

The lens parameter related to a material in the lens:

An Abbe number of the first lens in the optical image capturing module is denoted by NA1 (instance). A refractive index of the first lens is denoted by Nd1 (instance).

The lens parameter related to a view angle of the lens:

A view angle is denoted by AF. Half of the view angle is denoted by HAF. A major light angle is denoted by MRA.

The lens parameter related to exit/entrance pupil in the lens:

An entrance pupil diameter of the optical image capturing module is denoted by HEP. For any surface of any lens, a maximum effective half diameter (EHD) is a perpendicular distance between an optical axis and a crossing point on the surface where the incident light with a maximum viewing angle of the optical image capturing module passing the very edge of the entrance pupil. For example, the maximum effective half diameter of the object-side surface of the first lens is denoted by EHD11, the maximum effective half diameter of the image-side surface of the first lens is denoted by EHD12, the maximum effective half diameter of the object-side surface of the second lens is denoted by EHD21, the maximum effective half diameter of the image-side surface of the second lens is denoted by EHD22, and so on. In the optical image capturing module, a maximum effective diameter of the image-side surface of the lens closest to the image plane is denoted by PhiA, which satisfies the condition: PhiA=2*EHD. If the surface is aspherical, a cut-off point of the largest effective diameter is the cut-off point containing the aspheric surface. An ineffective half diameter (IHD) of any surface of one single lens refers to a surface segment between cut-off points of the maximum effective half diameter of the same surface extending in a direction away from the optical axis, wherein said a cut-off point is an end point of the surface having an aspheric coefficient if said surface is aspheric. In the optical image capturing module, a maximum diameter of the image-side surface of the lens closest to the image plane is denoted by PhiB, which satisfies the condition: PhiB=2*(maximum effective half diameter EHD+maximum ineffective half diameter IHD) =PhiA+2*(maximum ineffective half diameter IHD).

In the optical image capturing module, a maximum effective diameter of the image-side surface of the lens closest to the image plane (i.e., the image space) could be also called optical exit pupil, and is denoted by PhiA. If the optical exit pupil is located on the image-side surface of the third lens, then it is denoted by PhiA3; if the optical exit pupil is located on the image-side surface of the fourth lens, then it is denoted by PhiA4; if the optical exit pupil is located on the image-side surface of the fifth lens, then it is denoted by PhiA5; if the optical exit pupil is located on the image-side surface of the sixth lens, then it is denoted by PhiA6, and so on. A pupil magnification ratio of the optical image capturing module is denoted by PMR, which satisfies the condition: PMR=PhiA/HEP.

The lens parameter related to an arc length of the shape of a surface and a surface profile:

For any surface of any lens, a profile curve length of the maximum effective half diameter is, by definition, measured from a start point where the optical axis of the belonging optical image capturing module passes through the surface of the lens, along a surface profile of the lens, and finally to an end point of the maximum effective half diameter thereof. In other words, the curve length between the aforementioned start and end points is the profile curve length of the maximum effective half diameter, which is denoted by ARS. For example, the profile curve length of the maximum effective half diameter of the object-side surface of the first lens is denoted by ARS11, the profile curve length of the maximum effective half diameter of the image-side surface of the first lens is denoted by ARS12, the profile curve length of the maximum effective half diameter of the object-side surface of the second lens is denoted by ARS21, the profile curve length of the maximum effective half diameter of the image-side surface of the second lens is denoted by ARS22, and so on.

For any surface of any lens, a profile curve length of a half of the entrance pupil diameter (HEP) is, by definition, measured from a start point where the optical axis of the belonging optical image capturing module passes through the surface of the lens, along a surface profile of the lens, and finally to a coordinate point of a perpendicular distance where is a half of the entrance pupil diameter away from the optical axis. In other words, the curve length between the aforementioned stat point and the coordinate point is the profile curve length of a half of the entrance pupil diameter (HEP), and is denoted by ARE. For example, the profile curve length of a half of the entrance pupil diameter (HEP) of the object-side surface of the first lens is denoted by ARE11, the profile curve length of a half of the entrance pupil diameter (HEP) of the image-side surface of the first lens is denoted by ARE12, the profile curve length of a half of the entrance pupil diameter (HEP) of the object-side surface of the second lens is denoted by ARE21, the profile curve length of a half of the entrance pupil diameter (HEP) of the image-side surface of the second lens is denoted by ARE22, and so on.

The lens parameter related to a depth of the lens shape:

A displacement from a point on the object-side surface of the sixth lens, which is passed through by the optical axis, to a point on the optical axis, where a projection of the maximum effective semi diameter of the object-side surface of the sixth lens ends, is denoted by InRS61 (the depth of the maximum effective semi diameter). A displacement from a point on the image-side surface of the sixth lens, which is passed through by the optical axis, to a point on the optical axis, where a projection of the maximum effective semi diameter of the image-side surface of the seventh lens ends, is denoted by InRS62 (the depth of the maximum effective semi diameter). The depth of the maximum effective semi diameter (sinkage) on the object-side surface or the image-side surface of any other lens is denoted in the same manner.

The lens parameter related to the lens shape:

A critical point C is a tangent point on a surface of a specific lens, and the tangent point is tangent to a plane perpendicular to the optical axis and the tangent point cannot be a crossover point on the optical axis. Following the above description, a distance perpendicular to the optical axis between a critical point C51 on the object-side surface of the fifth lens and the optical axis is HVT51 (instance), and a distance perpendicular to the optical axis between a critical point C52 on the image-side surface of the fifth lens and the optical axis is HVT52 (instance). A distance perpendicular to the optical axis between a critical point C61 on the object-side surface of the sixth lens and the optical axis is HVT61 (instance), and a distance perpendicular to the optical axis between a critical point C62 on the image-side surface of the sixth lens and the optical axis is HVT62 (instance). A distance perpendicular to the optical axis between a critical point on the object-side or image-side surface of other lenses is denoted in the same manner.

The object-side surface of the seventh lens has one inflection point IF711 which is nearest to the optical axis, and the sinkage value of the inflection point IF711 is denoted by SGI711 (instance). A distance perpendicular to the optical axis between the inflection point IF711 and the optical axis is HIF711 (instance). The image-side surface of the seventh lens has one inflection point IF721 which is nearest to the optical axis, and the sinkage value of the inflection point IF721 is denoted by SGI721 (instance). A distance perpendicular to the optical axis between the inflection point IF721 and the optical axis is HIF721 (instance).

The object-side surface of the seventh lens has one inflection point IF712 which is the second nearest to the optical axis, and the sinkage value of the inflection point IF712 is denoted by SGI712 (instance). A distance perpendicular to the optical axis between the inflection point IF712 and the optical axis is HIF712 (instance). The image-side surface of the seventh lens has one inflection point IF722 which is the second nearest to the optical axis, and the sinkage value of the inflection point IF722 is denoted by SGI722 (instance). A distance perpendicular to the optical axis between the inflection point IF722 and the optical axis is HIF722 (instance).

The object-side surface of the seventh lens has one inflection point IF713 which is the third nearest to the optical axis, and the sinkage value of the inflection point IF713 is denoted by SGI713 (instance). A distance perpendicular to the optical axis between the inflection point IF713 and the optical axis is HIF713 (instance). The image-side surface of the seventh lens has one inflection point IF723 which is the third nearest to the optical axis, and the sinkage value of the inflection point IF723 is denoted by SGI723 (instance). A distance perpendicular to the optical axis between the inflection point IF723 and the optical axis is HIF723 (instance).

The object-side surface of the seventh lens has one inflection point IF714 which is the fourth nearest to the optical axis, and the sinkage value of the inflection point IF714 is denoted by SGI714 (instance). A distance perpendicular to the optical axis between the inflection point IF714 and the optical axis is HIF714 (instance). The image-side surface of the seventh lens has one inflection point IF724 which is the fourth nearest to the optical axis, and the sinkage value of the inflection point IF724 is denoted by SGI724 (instance). A distance perpendicular to the optical axis between the inflection point IF724 and the optical axis is HIF724 (instance).

An inflection point, a distance perpendicular to the optical axis between the inflection point and the optical axis, and a sinkage value thereof on the object-side surface or image-side surface of other lenses is denoted in the same manner.

The lens parameter related to an aberration:

Optical distortion for image formation in the optical image capturing module is denoted by ODT. TV distortion for image formation in the optical image capturing module is denoted by TDT. Further, the range of the aberration offset for the view of image formation may be limited to 50%-100% field. An offset of the spherical aberration is denoted by DFS. An offset of the coma aberration is denoted by DFC.

The present invention provides an optical image capturing module, which is capable of focusing visible and infrared (i.e., dual-mode) at the same time and achieving certain performance, wherein the sixth lens thereof is provided with an inflection point at the object-side surface or at the image-side surface to adjust the incident angle of each view field and modify the ODT and the TDT. In addition, the surfaces of the sixth lens are capable of modifying the optical path to improve the imagining quality.

The optical image capturing module of the present invention includes a circuit assembly, a sensor holder, and a lens assembly. The circuit assembly includes a circuit substrate and an image sensing component, wherein the circuit substrate has a plurality of circuit contacts thereon. The sensor holder is disposed on the circuit substrate. The image sensing component has a first surface and a second surface, wherein the first surface is connected to the circuit substrate. The second surface has a sensing surface and a plurality of image contacts. Each of the image contacts is electrically connected to one of the circuit contacts on the circuit substrate via a plurality of signal transmission elements. The image sensing component and the signal transmission elements are surrounded by the sensor holder. The lens assembly includes a lens base and a lens group, wherein the lens base is made of an opaque material and has a receiving hole penetrating through two ends of the lens base, so that the lens base is hollow. The lens base is disposed on the sensor holder, so that the receiving hole directly faces the image sensing component. The lens group includes at least two lenses having refractive power, and is disposed on the lens base and is located in the receiving hole. An image plane of the lens group is located on the sensing surface, and an optical axis of the lens group overlaps with a central normal of the sensing surface, so that a light passes through the lens group in the receiving hole and projects onto the sensing surface. The optical image capturing module further satisfies:

$1.0 \leq f/HEP \leq 10.0$; $0 \deg < HAF \leq 150 \deg$; $0 \text{ mm} < PhiD \leq 18 \text{ mm}$; $0 < PhiA/PhiD \leq 0.99$; and $0.9 \leq 2(ARE/HEP) \leq 2.0$;

where f is a focal length of the lens group; HEP is an entrance pupil diameter of the lens group; HAF is a half of a maximum field angle of the lens group; PhiD is a maximum value of a minimum length on a periphery of the lens base perpendicular to the optical axis of the lens group; PhiA is a maximum effective diameter of an image-side surface of the at least two lenses of the lens group closest to the image plane; ARE is a profile curve length measured from a start point where the optical axis of the lens group passes through any surface of one of the at least two lenses, along a surface profile of the corresponding lens, and finally to a coordinate point of a perpendicular distance where is a half of the entrance pupil diameter away from the optical axis.

The length of the contour curve of any surface of a single lens in the range of the maximum effective radius affects the surface correction aberration and the optical path difference between the fields of view. The longer the profile curve length, the better the ability to correct the aberration, but at the same time It will increase the difficulty in manufacturing, so it is necessary to control the length of the profile curve of any surface of a single lens within the maximum effective radius, in particular to control the profile length (ARS) and the surface within the maximum effective radius of the surface. The proportional relationship (ARS/TP) between the thicknesses (TP) of the lens on the optical axis. For example, the length of the contour curve of the maximum effective radius of the side surface of the first lens object is represented by ARS11, and the thickness of the first lens on the optical axis is TP1, and the ratio between the two is ARS11/TP1, and the maximum effective radius of the side of the first lens image side. The length of the contour curve is represented by ARS12, and the ratio between it and TP1 is ARS12/TP1. The length of the contour curve of the maximum effective radius of the side of the second lens object is represented by ARS21, the thickness of the second lens on the optical axis is TP2, the ratio between the two is ARS21/TP2, and the contour of the maximum effective radius of the side of the second lens image The length of the curve is represented by ARS22, and the ratio between it and TP2 is ARS22/TP2. The proportional relationship between the length of the profile of the maximum effective radius of any surface of the remaining lenses in the optical imaging system and the thickness (TP) of the lens on the optical axis to which the surface belongs, and so on. The optical image capturing module of the present invention satisfies: $0.9 \leq ARS/EHD \leq 2.0$.

The optical image capturing module has a maximum image height HOI on the image plane vertical to the optical axis. A transverse aberration at 0.7 HOI in the positive direction of the tangential ray fan aberration after the longest operation wavelength passing through the edge of the entrance pupil is denoted by PLTA; a transverse aberration at 0.7 HOI in the positive direction of the tangential ray fan aberration after the shortest operation wavelength passing through the edge of the entrance pupil is denoted by PSTA; a transverse aberration at 0.7 HOI in the negative direction of the tangential ray fan aberration after the longest operation wavelength passing through the edge of the entrance pupil is denoted by NLTA; a transverse aberration at 0.7 HOI in the negative direction of the tangential ray fan aberration after the shortest operation wavelength passing through the edge of the entrance pupil is denoted by NSTA; a transverse aberration at 0.7 HOI of the sagittal ray fan aberration after the longest operation wavelength passing through the edge of the entrance pupil is denoted by SLTA; a transverse aberration at 0.7 HOI of the sagittal ray fan aberration after the shortest operation wavelength passing through the edge of the entrance pupil is denoted by SSTA. The optical image capturing module of the present invention satisfies:

PLTA≤100 µm; PSTA≤100 µm; NLTA≤100 µm; NSTA≤100 µm; SLTA≤100 µm; SSTA≤100 µm; |TDT|<250%; $0.1 \leq InTL/HOS \leq 0.95$; and $0.2 \leq Ins/HOS \leq 1.1$.

For visible light spectrum, the values of MTF in the spatial frequency of 110 cycles/mm at the optical axis, 0.3 field of view, and 0.7 field of view on an image plane are respectively denoted by MTFQ0, MTFQ3, and MTFQ7. The optical image capturing module of the present invention satisfies:

MTFQ0≥0.2; MTFQ3≥0.01; and MTFQ7≥0.01.

In an embodiment, the lens group includes four lenses having refractive power, which are constituted by a first lens, a second lens, a third lens, and a fourth lens in order along an optical axis from an object side to an image side; the lens group satisfies: 0.1≤InTL/HOS≤0.95; where HOS is a distance in parallel with the optical axis between an object-side surface of the first lens and the image plane; InTL is a distance in parallel with the optical axis from the object-side surface of the first lens to an image-side surface of the fourth lens.

In an embodiment, the lens group includes five lenses having refractive power, which are constituted by a first lens, a second lens, a third lens, a fourth lens, and a fifth lens in order along an optical axis from an object side to an image side; the lens group satisfies: 0.1≤InTL/HOS≤0.95; where HOS is a distance in parallel with the optical axis between an object-side surface of the first lens and the image plane; InTL is a distance in parallel with the optical axis from the object-side surface of the first lens to an image-side surface of the fifth lens.

In an embodiment, the lens group includes six lenses having refractive power, which are constituted by a first lens, a second lens, a third lens, a fourth lens, a fifth lens, and a six lens in order along an optical axis from an object side to an image side; the lens group satisfies: 0.1≤InTL/HOS≤0.95; where HOS is a distance in parallel with the optical axis between an object-side surface of the first lens and the image plane; InTL is a distance in parallel with the optical axis from the object-side surface of the first lens to an image-side surface of the sixth lens.

In an embodiment, the lens group includes seven lenses having refractive power, which are constituted by a first lens, a second lens, a third lens, a fourth lens, a fifth lens, a sixth lens, and a seventh lens in order along an optical axis from an object side to an image side; the lens group satisfies: 0.1≤InTL/HOS≤0.95; where HOS is a distance in parallel with the optical axis between an object-side surface of the first lens and the image plane; InTL is a distance in parallel with the optical axis from the object-side surface of the first lens to an image-side surface of the seventh lens.

In an embodiment, the optical image capturing module further includes an aperture, wherein the optical image capturing module further satisfies: 0.2≤InS/HOS≤1.1; where InS is a distance on the optical axis between the aperture and the image plane; HOS is a distance in parallel with the optical axis between an object-side surface of one of the at least two lenses of the lens group furthest from the image plane and the image plane.

In an embodiment, the lens base further includes a lens barrel and a lens holder; the lens holder is fixed on the circuit substrate and has a lower through hole penetrating through two ends of the lens holder, so that the image sensing component is located in the lower through hole; the lens barrel is disposed in the lens holder and is located in the lower through hole, and has an upper through hole penetrating through two ends of the lens barrel, so that the upper through hole communicates with the lower through hole to form the receiving hole; the lens base is firmly disposed on the sensor holder; the upper through hole of the lens barrel directly faces the sensing surface of the image sensing component; PhiD is a maximum value of a minimum length on a periphery of the lens holder perpendicular to an optical axis of the lens group.

In an embodiment, the optical image capturing module further satisfies: 0 mm<TH1+TH2≤1.5 mm; where TH1 is a maximum thickness of the lens holder; TH2 is a minimum thickness of the lens barrel.

In an embodiment, the optical image capturing module further satisfies: 0<(TH1+TH2)/HOI≤0.95; where TH1 is a maximum thickness of the lens holder; TH2 is a minimum thickness of the lens barrel; HOI is a maximum height for image formation perpendicular to the optical axis on the image plane.

In an embodiment, an outer peripheral wall of the lens barrel has an external thread thereon, and an inner wall of the lower through hole has an inner thread thereon, wherein the inner thread is screwed with the external thread, so that the lens barrel is disposed in the lens holder to be fixed in the lower through hole.

In an embodiment, a glue is coated between the lens barrel and the lens holder, and the lens barrel and the lens holder are fixed to each other via the glue, so that the lens barrel is disposed in the lens holder and is fixed in the lower through hole.

In an embodiment, the lens base is integrally formed as a monolithic unit.

In an embodiment, the optical image capturing module further includes an infrared rays filter which is disposed in the lens base or on the sensor holder to be located above the image sensing component.

In an embodiment, the optical image capturing module further includes an infrared rays filter; the lens base includes a filter holder; the filter holder has a through hole penetrating through two ends of the filter holder; the infrared rays filter is disposed in the filter holder and is located in the through hole of the filter holder; the filter holder is disposed on the sensor holder, so that the infrared rays filter is located above the image sensing component.

In an embodiment, the lens base further includes a lens barrel and a lens holder; the lens barrel has an upper through hole penetrating through two ends of the lens barrel, and the lens holder has a lower through hole penetrating through two ends of the lens holder; the lens barrel is disposed in the lens holder and is located in the lower through hole, and the lens holder is fixed on the filter holder, so that the upper through hole, the lower through hole, and the through hole of the filter holder communicate with one another to form the receiving hole; the upper through hole of the lens barrel directly faces the sensing surface of the image sensing component; in addition, the lens group is disposed in the lens barrel to be located in the upper through hole; PhiD is a maximum value of a minimum length on a periphery of the lens holder perpendicular to an optical axis of the lens group.

In an embodiment, an outer peripheral wall of the lens barrel has an external thread thereon, and an inner wall of the lower through hole has an inner thread thereon, wherein the inner thread is screwed with the external thread, so that the lens barrel is disposed in the lens holder and is located in the lower through hole; in addition, a glue is coated between the lens holder and the filter holder, and the lens holder and the filter holder are fixed to each other via the glue, so that the lens holder is fixed on the filter holder.

In an embodiment, a glue is coated between the lens barrel and the lens holder, and the lens barrel and the lens holder are fixed to each other via the glue, so that the lens barrel is disposed in the lens holder and is located in the lower through hole; in addition, a glue is coated between the lens holder and the filter holder, and the lens holder and the filter holder are fixed to each other via the glue, so that the lens holder is fixed on the filter holder.

In an embodiment, each of the signal transmission elements is a gold wire, a projection, a pin, a flexible circuit board, a spring probe, or a group of their constituents.

In an embodiment, the optical image capturing module is applied to one of a group consisting of an electronic portable device, an electronic wearable device, an electronic monitoring device, an electronic information device, an electronic communication device, a machine vision device, and a vehicle electronic device.

For any surface of any lens, the profile curve length within a half of the entrance pupil diameter (HEP) affects the ability of the surface to correct aberration and differences between optical paths of light in different fields of view. With longer profile curve length, the ability to correct aberration is better. However, the difficulty of manufacturing increases as well. Therefore, the profile curve length within a half of the entrance pupil diameter (HEP) of any surface of any lens has to be controlled. The ratio between the profile curve length (ARE) within a half of the entrance pupil diameter (HEP) of one surface and the thickness (TP) of the lens, which the surface belonged to, on the optical axis (i.e., ARE/TP) has to be particularly controlled. For example, the profile curve length of a half of the entrance pupil diameter (HEP) of the object-side surface of the first lens is denoted by ARE11, the thickness of the first lens on the optical axis is TP1, and the ratio between these two parameters is ARE11/TP1; the profile curve length of a half of the entrance pupil diameter (HEP) of the image-side surface of the first lens is denoted by ARE12, and the ratio between ARE12 and TP1 is ARE12/TP1. The profile curve length of a half of the entrance pupil diameter (HEP) of the object-side surface of the second lens is denoted by ARE21, the thickness of the second lens on the optical axis is TP2, and the ratio between these two parameters is ARE21/TP2; the profile curve length of a half of the entrance pupil diameter (HEP) of the image-side surface of the second lens is denoted by ARE22, and the ratio between ARE22 and TP2 is ARE22/TP2. For any surface of other lenses in the optical image capturing system, the ratio between the profile curve length of a half of the entrance pupil diameter (HEP) thereof and the thickness of the lens which the surface belonged to is denoted in the same manner.

BRIEF DESCRIPTION OF THE SEVERAL VIEWS OF THE DRAWINGS

The present invention will be best understood by referring to the following detailed description of some illustrative embodiments in conjunction with the accompanying drawings, in which

FIG. 1I is a schematic diagram of a ninth structural embodiment of the present invention;

DETAILED DESCRIPTION OF THE INVENTION

An optical image capturing module of the present invention includes a structural design and an optical design, wherein structural embodiments will be described first.

Figure 1A:
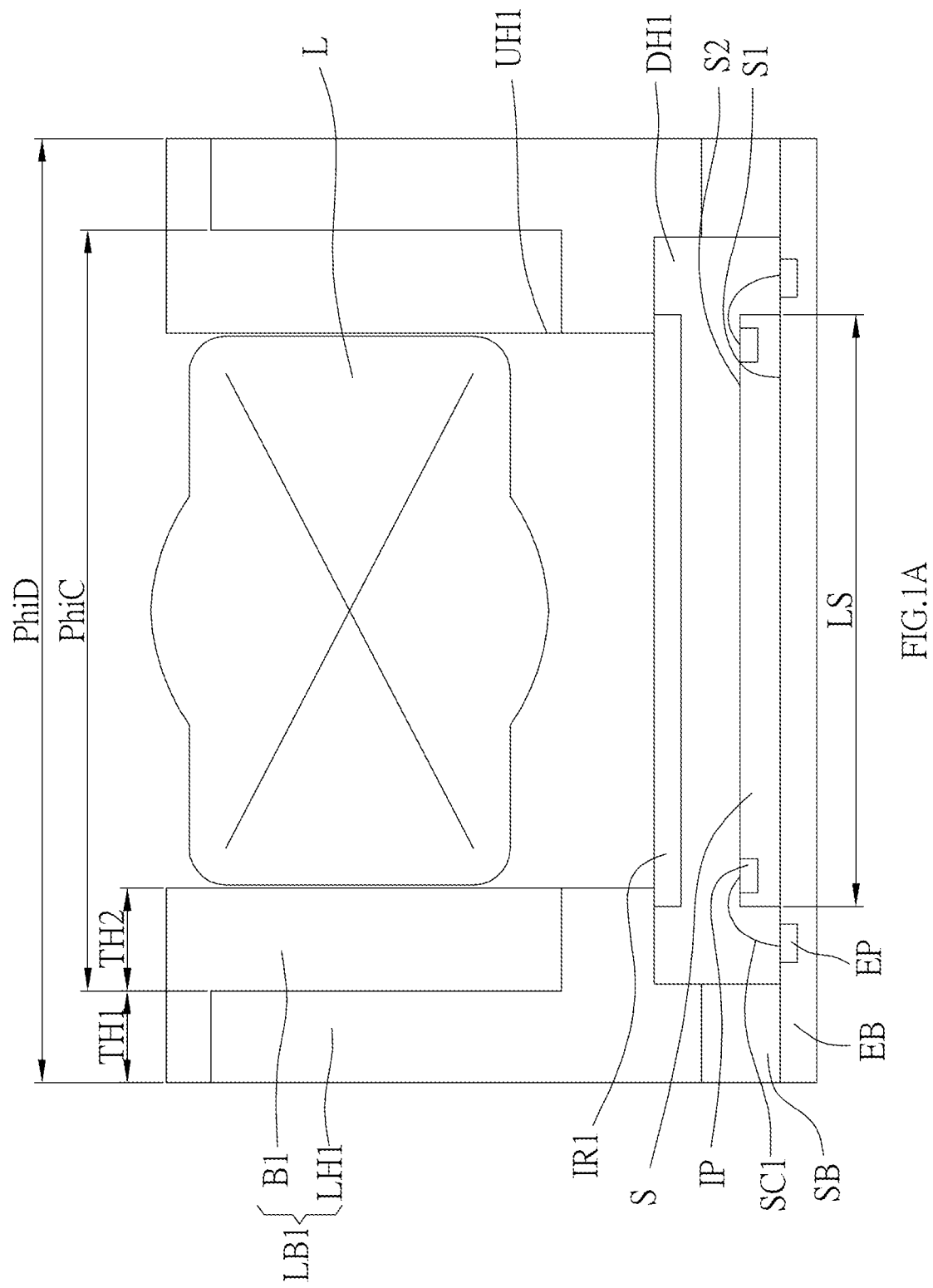
FIG. 1A is a schematic diagram of a first structural embodiment of the present invention.

As shown in FIG. 1A, an optical image capturing module according to a first structural embodiment of the present invention includes mainly includes a circuit assembly and a lens assembly. The circuit assembly includes an image sensing component S, a sensor holder SB, and a circuit substrate EB. A maximum value of a minimum length of an outer periphery of the image sensing component S which is perpendicular to a plane of an optical axis of the lens assembly is denoted by LS. In the current embodiment, the image sensing component S is fixed on the circuit substrate EB in a Chip On Board (COB) package. The sensor holder SB is disposed on the circuit substrate EB. More specifically, the circuit substrate EB has a plurality of circuit contacts EP thereon; the image sensing component S has a first surface S1 and a second surface S2, wherein the first surface S1 is connected to the circuit substrate EB, and the second surface S2 has a sensing surface and a plurality of image contacts IP. Each of the image contacts IP is electrically connected to one of the circuit contacts EP on the circuit substrate EB via a plurality of signal transmission elements SC1. In the current embodiment, each of the signal transmission elements SC1 is a gold wire. In this way, when an image optical signal is sensed by the sensing surface of the image sensing component S and is transformed into an electrical signal, the electrical signal could be sent to the circuit contacts EP via the image contacts IP and the signal transmission elements SC1, so that the circuit contacts EP could transmit the electrical signal to other external components for subsequent processing. In addition, the image sensing component S and the signal transmission elements SC1 are surrounded by the sensor holder SB.

The lens assembly includes a lens base LB1, a lens group L, and an IR-cut filter IR1. In the current embodiment, the lens base LB1 is made of plastic material and is opaque, and has a receiving hole penetrating through both ends of the lens base LB1, so that the lens base LB1 is hollow. In addition, the lens base LB1 is disposed on the sensor holder SB, so that the receiving hole directly faces the image sensing component S. The lens base LB1 includes a lens holder LH1 and a lens barrel B1. More specifically, the lens holder LH1 has a predetermined thickness TH1, and a maximum value of a minimum length on a periphery of the lens holder LH1 perpendicular to the optical axis of the lens group L is denoted by PhiD. In addition, the lens holder LH1 has a lower through hole DH1 penetrating through both ends of the lens holder LH1 to be hollow, and is fixed on the sensor holder SB, so that the image sensing component S is located in the lower through hole DH1. The lens barrel B1 has a predetermined thickness TH2, and a maximum value of a minimum length on a periphery of the lens barrel B1 perpendicular to the optical axis of the lens group L is denoted by PhiC. Moreover, the lens barrel B1 is disposed in the lens holder LH1 to be located in the lower through hole DH1, and has an upper through hole UH1 penetrating through both ends of the lens barrel B1, so that the upper through hole UH1 communicates with the lower through hole DH1 to form a receiving hole, wherein the upper through hole UH1 of the lens barrel B1 directly faces the sensing surface of the image sensing component S. In the current embodiment, a glue is coated between the lens barrel B1 and the lens holder LH1, and the lens holder LH1 and the lens barrel B1 are fixed to each other via the glue, so that the lens barrel B1 is disposed in the lens holder LH1 and is fixed in the lower through hole DH1.

The lens group L includes at least two lenses with refractive power, and optical embodiments will be described in detail later. The lens group L is disposed on the lens barrel B1 of the lens base LB1 and is located in the upper through hole UH1. In addition, an image plane of the lens group L is located on the sensing surface of the image sensing component S, wherein the optical axis of the lens group L overlaps with a central normal of the sensing surface, so that light could pass through the lens group L in the receiving hole and could be projected onto the sensing surface. Moreover, a maximum diameter of an image-side surface of a lens of the lens group L closest to the image plane is denoted by PhiB, and a maximum effective diameter of the image-side surface of the lens of the lens group L closest to the image plane (i.e., the image space) could be also called optical exit pupil, and is denoted by PhiA.

The IR-cut filter IR1 is capable of being disposed in the lens barrel B1, the lens holder LH1, or the sensor holder SB to be located above the image sensing component S. In the current embodiment, the IR-cut filter IR1 is fixed on the lens holder LH1 of the lens base LB1 and is located between the lens group L and the image sensing component S, thereby to filter out an excess infrared light in the image light passing through the lens group L, enhancing the image quality.

It is worth mentioning that, in order to overlap the optical axis of the lens group L with the central normal of the sensing surface of the image sensing component S, an outer side of the lens barrel B1 of the optical image capturing module of the current embodiment is not completely in contact with an inner periphery of the lens holder LH1, thereby to leave a slight gap, so that a curable glue could be coated between the lens holder LH1 and the lens barrel B1 in advance, and the optical axis of the lens group L and the central normal of the image sensing component S could be adjusted to be overlapped with each other, and then the curable glue is cured to fix the lens barrel B1 to the lens holder LH1, that is, an active alignment assembly is carried out. The precision optical image capturing modules or special applications (such as the assembly of multiple lenses) require the active alignment technology, and the optical image capturing module of the present invention could meet such requirement.

In order to keep small in size and provide high imaging quality, the optical image capturing module of the current embodiment satisfies:

0 mm<PhiA≤17.4 mm; 0 mm<PhiC≤17.7 mm; 0 mm<PhiD≤18 mm; 0 mm<TH1≤5 mm; 0 mm<TH2≤5 mm; 0<PhiA/PhiD≤0.99; 0 mm<TH1+TH2≤1.5 mm; and 0<2*(TH1+TH2)/PhiA≤0.95.

Preferably, the optical image capturing module of the current embodiment satisfies:

0 mm<PhiA≤13.5 mm; 0 mm<PhiC≤14 mm; 0 mm<PhiD≤15 mm; 0 mm<TH1≤0.5 mm; 0 mm<TH2≤0.5 mm; 0<PhiA/PhiD≤0.97; 0 mm<TH1+TH2≤1 mm; and 0<2*(TH1+TH2)/PhiA≤0.5.

As shown in FIG. 1B to FIG. 1I, optical image capturing modules according to a second structural embodiment to a ninth structural embodiment are illustrated, each of which is slightly different from that of the first structural embodiment, but the effect of miniaturization and high optical quality could be achieved as well.

Figure 1B:
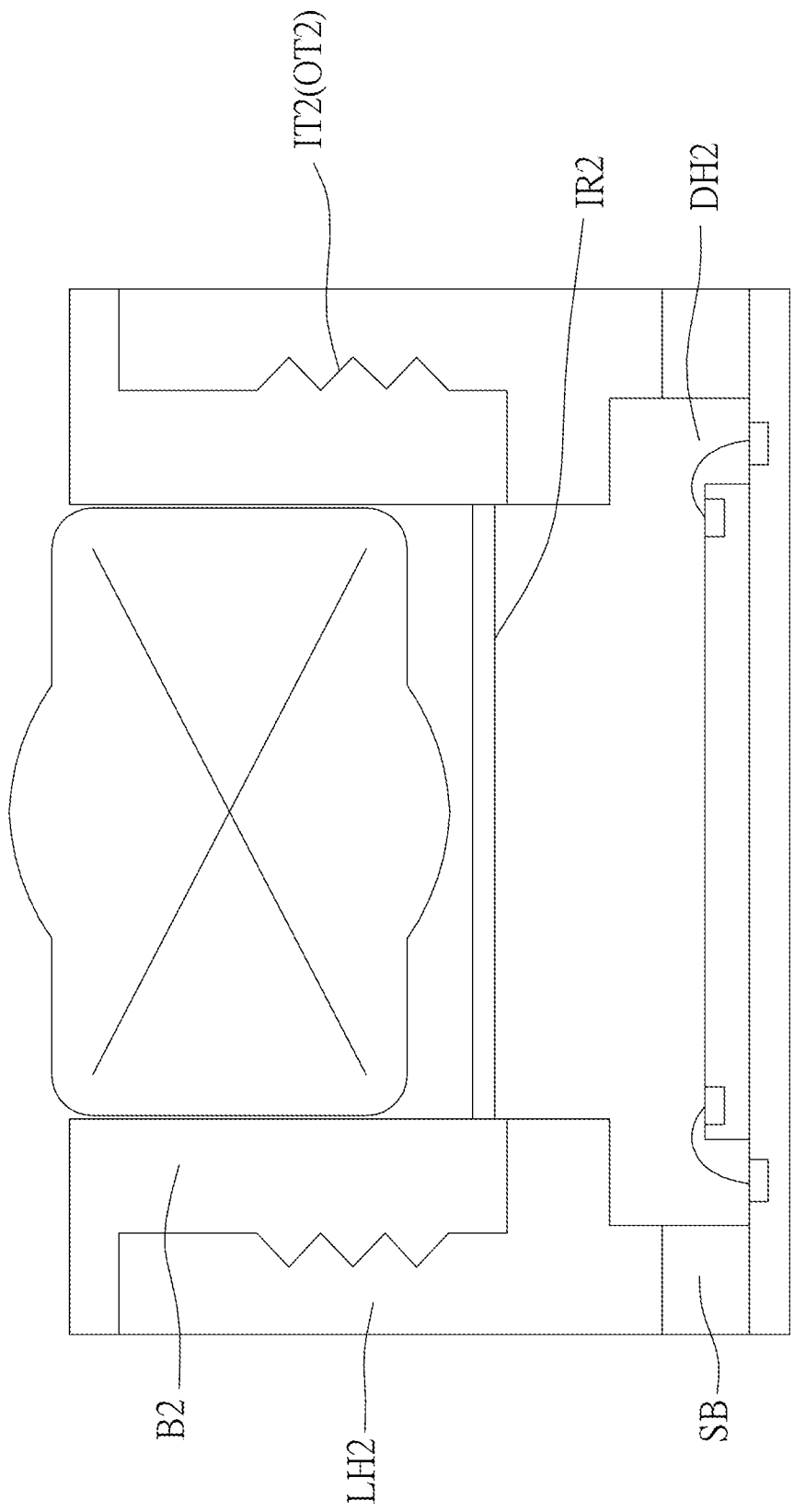
FIG. 1B is a schematic diagram of a second structural embodiment of the present invention.

The optical image capturing modules according to the second structural embodiment is illustrated in FIG. 1B, which has almost the same structure with that of the first structural embodiment, except that an outer peripheral wall of a lens barrel B2 has an external thread OT2 thereon, and an inner wall of a lower through hole DH2 of a lens holder LH2 has an inner thread IT2 thereon, wherein the inner thread IT2 is adapted to be screwed with the external thread OT2, thereby to fix the lens barrel B2 in the lens holder LH2.

In addition, an IR-cut filter IR2 is fixed in the lens barrel B2 to filter out an excess infrared light. Moreover, the optical image capturing modules according to the second structural embodiment satisfies the conditions of the first structural embodiment, which could keep small in size and provide high imaging quality as well.

Figure 1C:
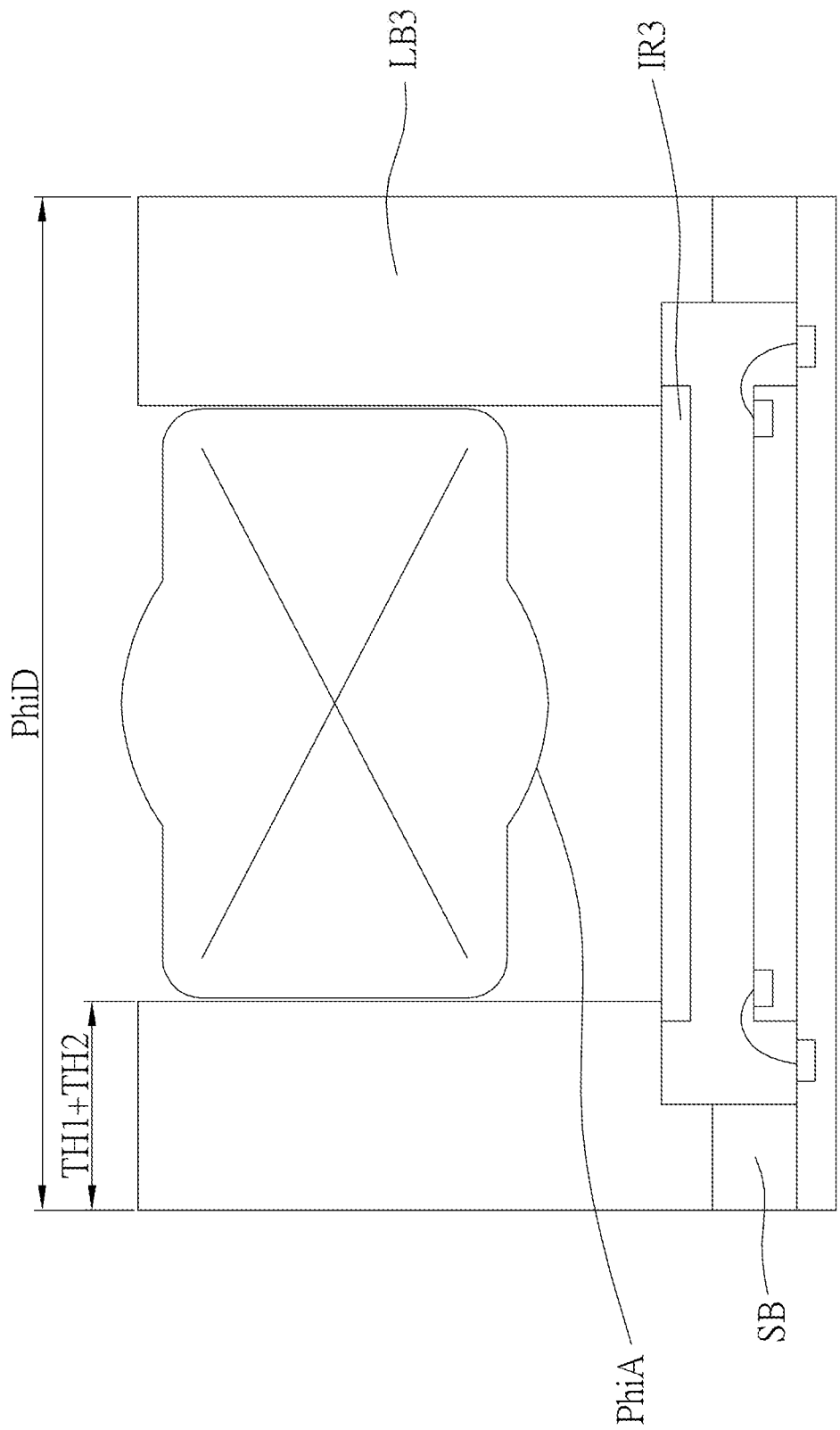
FIG. 1C is a schematic diagram of a third structural embodiment of the present invention.

The optical image capturing modules according to the third structural embodiment is illustrated in FIG. 1C, which has almost the same structure with that of the first structural embodiment, except that a lens base LB3 is integrally formed as a monolithic unit, instead of being separated to a lens barrel and a lens holder, which reduces the time required for producing components and for assembling. In addition, a maximum value of a minimum length on a periphery of the lens base LB3 perpendicular to an optical axis of the lens group L is denoted by PhiD. Moreover, an IR-cut filter IR3 is capable of being disposed in the lens base LB3 or on the sensor holder SB to be located above the image sensing component S. In the current embodiment, the IR-cut filter IR3 is disposed in the lens base LB3.

Moreover, the optical image capturing modules according to the third structural embodiment satisfies 0 mm<PhiA≤17.4 mm, and a preferable range is 0 mm<PhiA≤13.5 mm; 0 mm<PhiD≤18 mm, and a preferable range is 0 mm<PhiD≤15 mm; 0<PhiA/PhiD≤0.99, and a preferable range is 0<PhiA/PhiD≤0.97; 0 mm<TH1+TH2≤1.5 mm, and a preferable range is 0 mm<TH1+TH2≤1 mm; 0<2*(TH1+TH2)/PhiA≤0.95, and a preferable range is 0<2*(TH1+TH2)/PhiA≤0.5. In other words, the optical image capturing modules according to the third structural embodiment satisfies partially of the conditions of the first structural embodiment, which could keep small in size and provide high imaging quality as well.

Figure 1D:
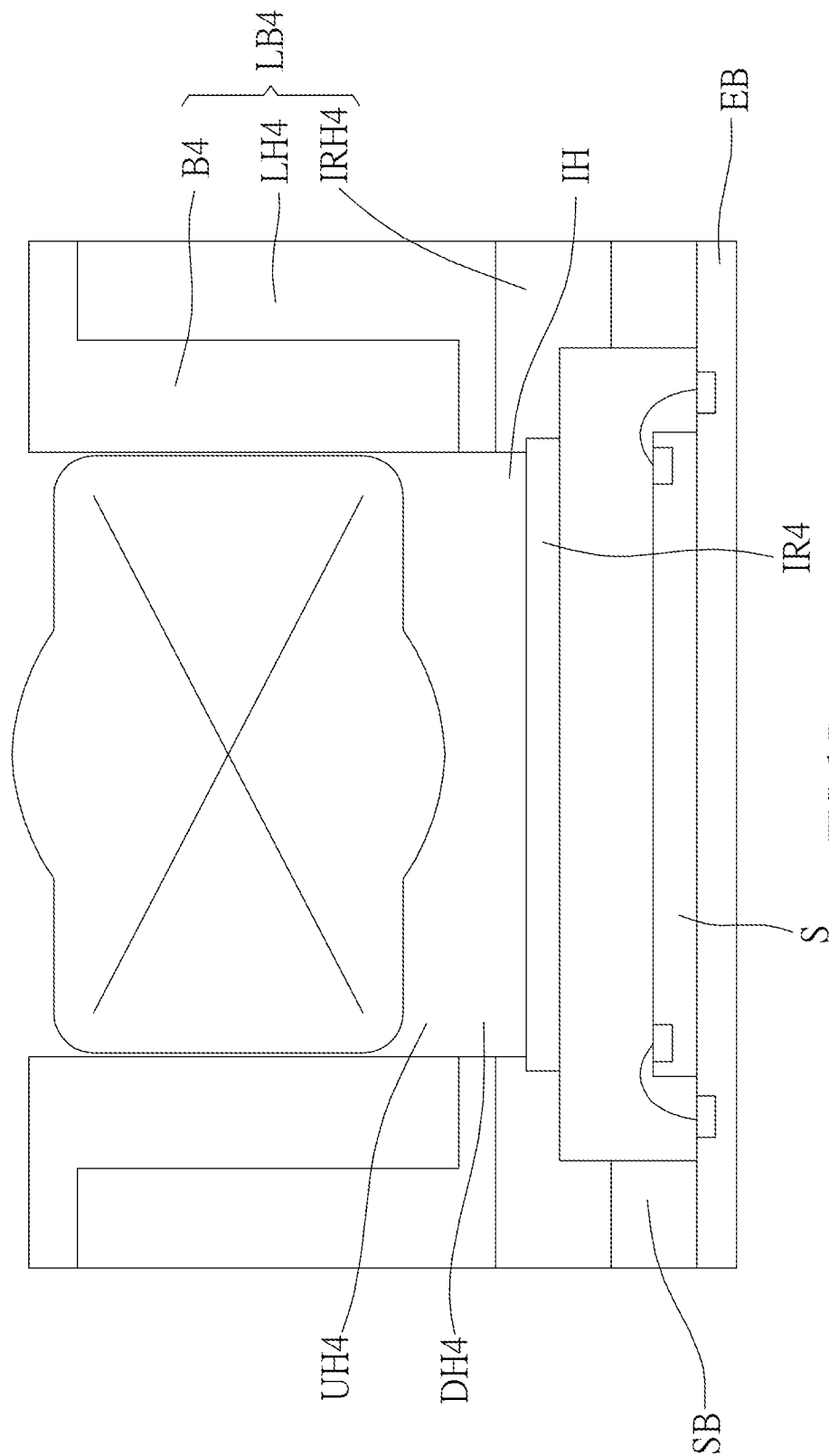
FIG. 1D is a schematic diagram of a fourth structural embodiment of the present invention.

The optical image capturing modules according to the fourth structural embodiment is illustrated in FIG. 1D, which has almost the same structure with that of the first structural embodiment, except that a lens base LB4 includes a filter holder IRH4, a lens holder LH4, and a lens barrel B4. The filter holder IRH4 has a through hole IH penetrating through both ends of the filter holder IRH4, and is disposed on the sensor holder SB. An IR-cut filter IR4 is disposed in the filter holder IRH4 and is located in the through hole IH of the filter holder IRH4, so that the IR-cut filter IR4 is located above the image sensing component S. The lens holder LH4 is fixed on the filter holder IRH4, and the lens barrel B4 is disposed in the lens holder LH4 to be located in a lower through hole DH4, so that an upper through hole UH4 of the lens barrel B4, a lower through hole DH4 of the lens holder LH4, and the through hole IH of the filter holder IRH4 communicate with one another to form a receiving hole. The upper through hole UH4 of the lens barrel B4 directly faces a sensing surface of the image sensing component S. In the current embodiment, a glue is coated between the lens barrel B4 and the lens holder LH4, and the lens holder LH4 and the lens barrel B4 are fixed to each other via the glue, so that the lens barrel B4 is disposed in the lens holder LH4 and is located in the lower through hole DH4. A glue is coated between the lens holder LH4 and the filter holder IRH4, and the lens holder LH4 and the filter holder IRH4 are fixed to each other via the glue, so that the lens holder LH4 is fixed on the filter holder IRH4. In addition, the optical image capturing modules according to the fourth structural embodiment satisfies the conditions of the first structural embodiment, and could be fixed by a glue to carry out the active alignment assembly, which could keep small in size and provide high imaging quality as well.

Figure 1E:
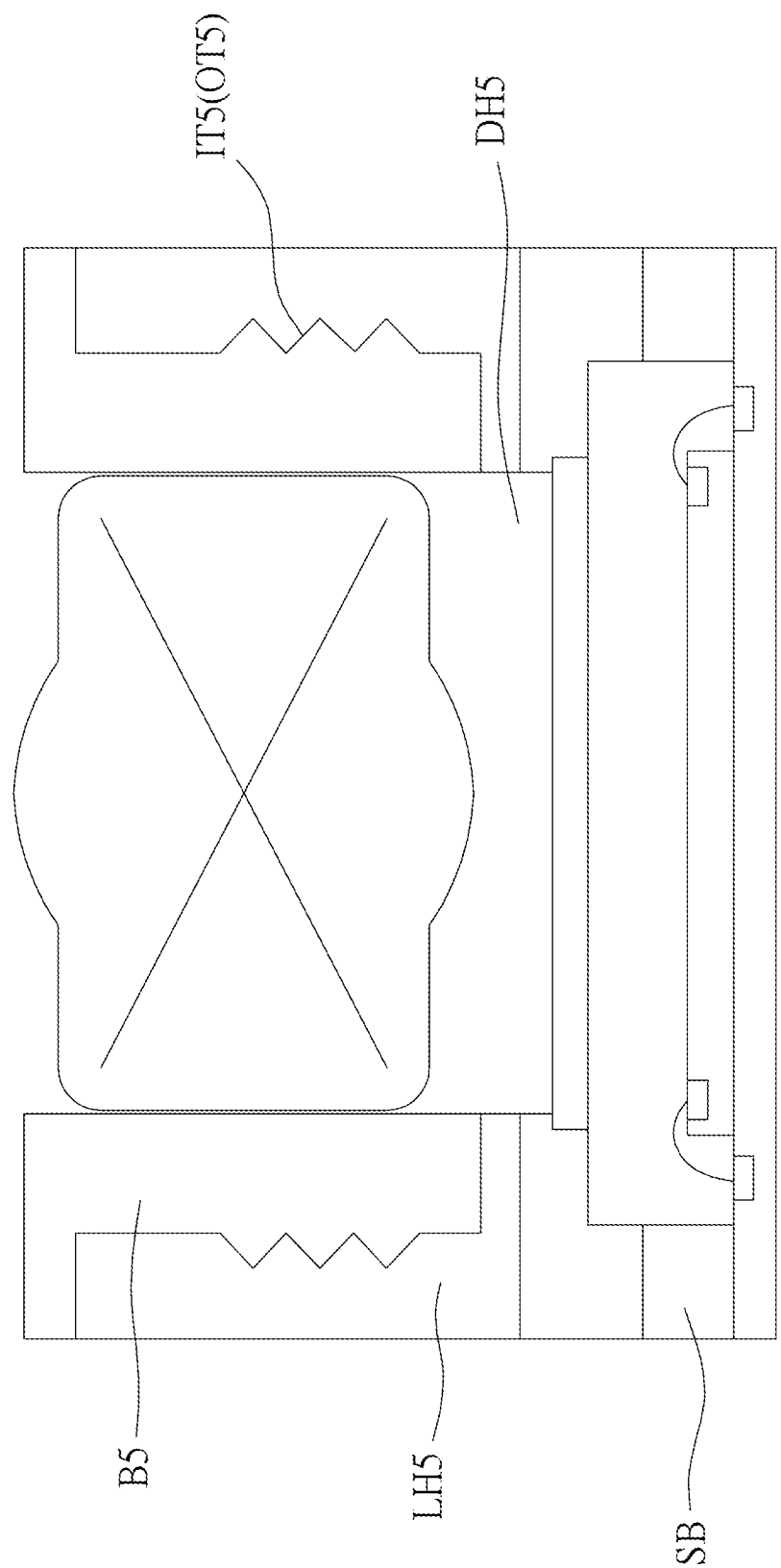
FIG. 1E is a schematic diagram of a fifth structural embodiment of the present invention.

The optical image capturing modules according to the fifth structural embodiment is illustrated in FIG. 1E, which has almost the same structure with that of the fourth structural embodiment, except that an outer peripheral wall of a lens barrel B5 has an external thread OT5 thereon, and an inner wall of a lower through hole DH5 of a lens holder LH5 has an inner thread IT5 thereon, wherein the inner thread IT5 is adapted to be screwed with the external thread OT5, thereby the lens barrel B5 is dispose in the lens holder LH5 and is fixed in the lower through hole DH5. In addition, the optical image capturing modules according to the fifth structural embodiment satisfies the conditions of the first structural embodiment, which could keep small in size and provide high imaging quality as well.

Figure 1F:
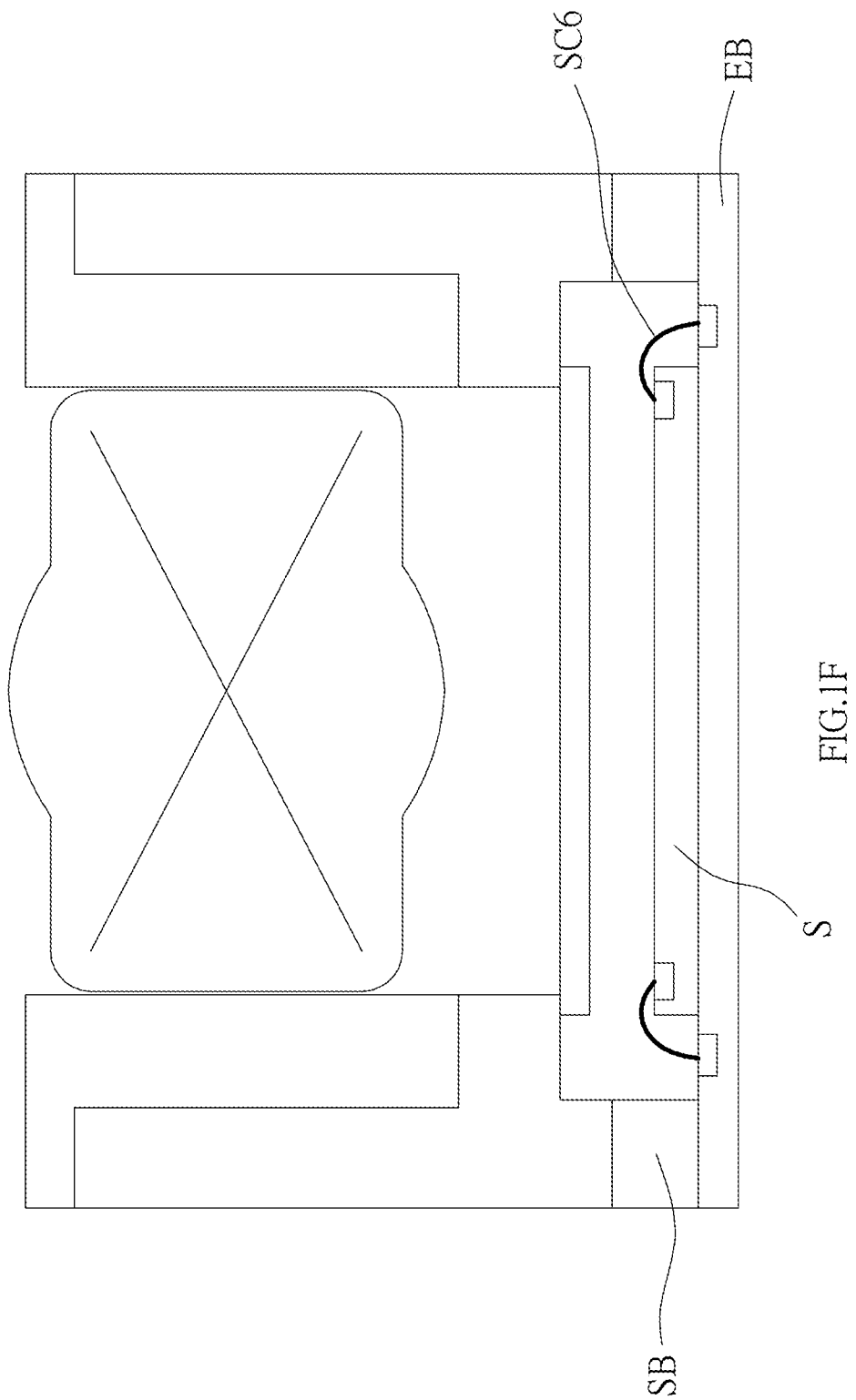
FIG. 1F is a schematic diagram of a sixth structural embodiment of the present invention.
Figure 1G:
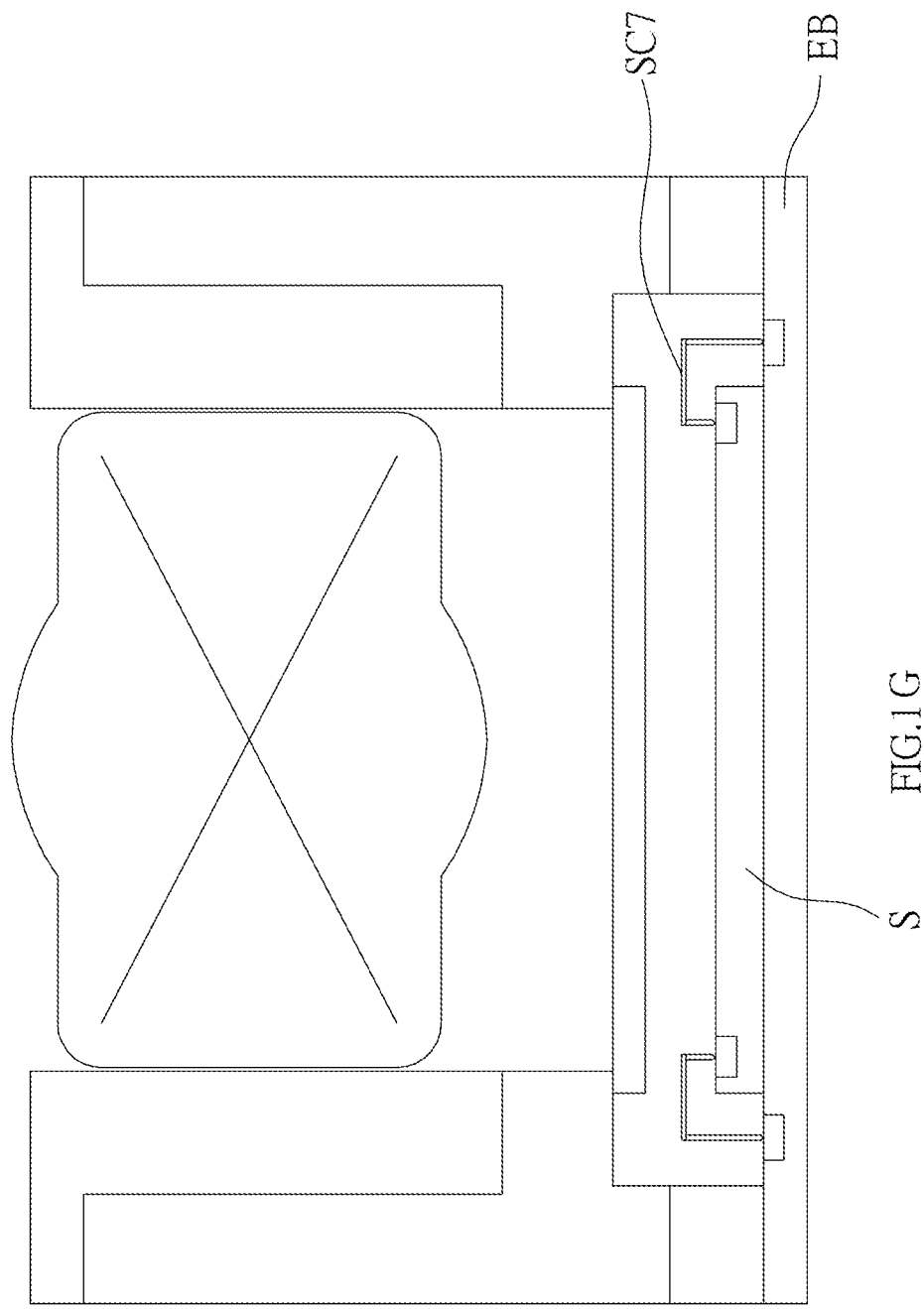
FIG. 1G is a schematic diagram of a seventh structural embodiment of the present invention.

The optical image capturing modules according to the sixth structural embodiment is illustrated in FIG. 1F, which has almost the same structure with that of the first structural embodiment, except that an electrical signal transmission between the image sensing component S and the circuit substrate EB is achieved via a plurality of signal transmission elements SC6, wherein each of the signal transmission elements SC6 is a flexible circuit board. The optical image capturing modules according to the seventh structural embodiment is illustrated in FIG. 1G, which has almost the same structure with that of the first structural embodiment, except that an electrical signal transmission between the image sensing component S and the circuit substrate EB is achieved via a plurality of signal transmission elements SC7, wherein each of the signal transmission elements SC7 is a spring probe set. However, the signal transmission element is not limited by the aforementioned design. In practice, the signal transmission element could be a projection, a pin, which are made of a conductor, or a group of their constituents, thereby to transmit the electrical signal. In addition, the optical image capturing modules according to the sixth and seventh structural embodiments satisfy the conditions of the first structural embodiment, which could keep small in size and provide high imaging quality as well.

Figure 1H:
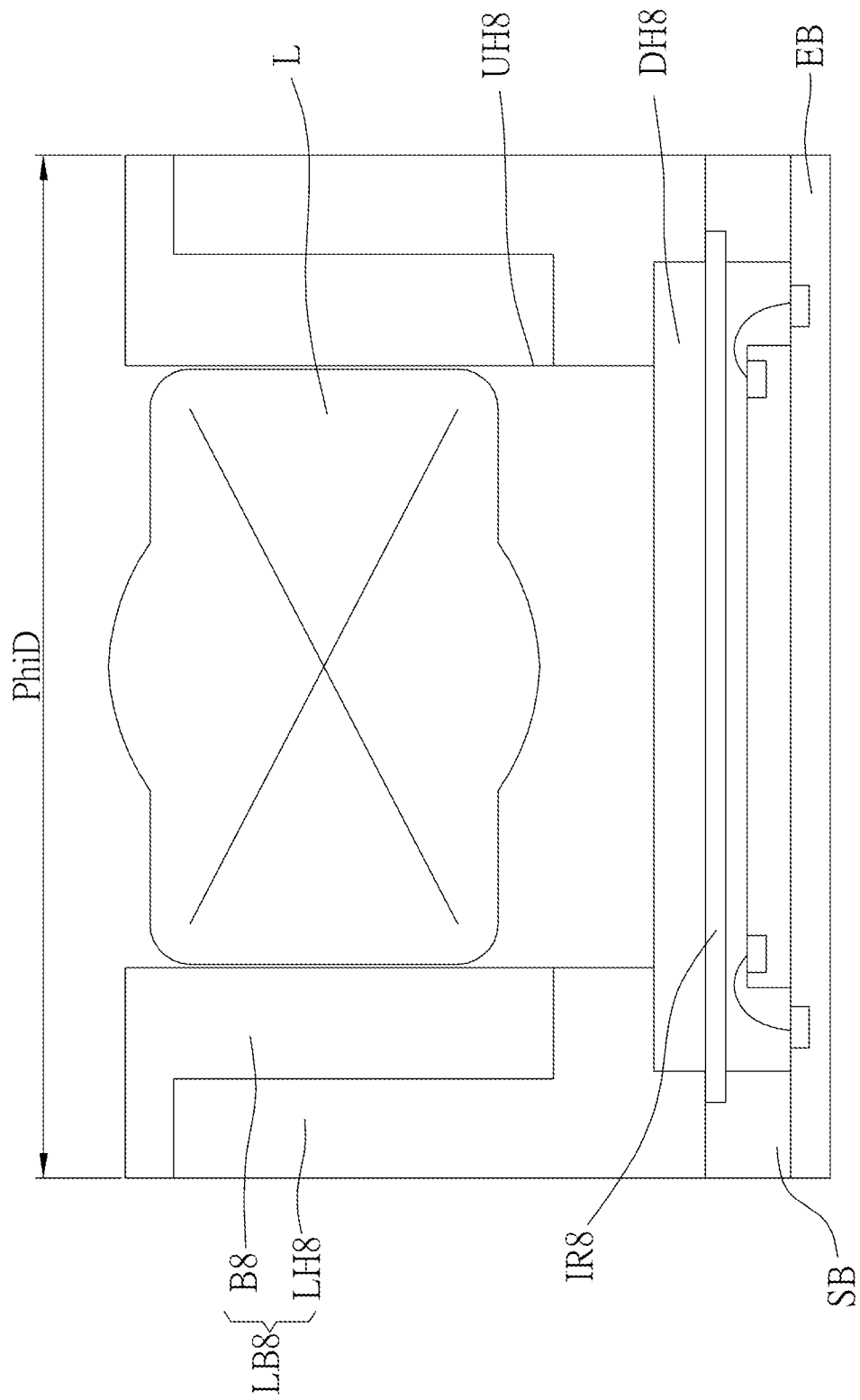
FIG. 1H is a schematic diagram of a eighth structural embodiment of the present invention.

The optical image capturing modules according to the eighth structural embodiment is illustrated in FIG. 1H, which has almost the same structure with that of the first structural embodiment, except that an IR-cut filter IR8 is disposed on the sensor holder SB to be located above the image sensing component S. In addition, the optical image capturing modules according to the eighth structural embodiment satisfies the conditions of the first structural embodiment, which could keep small in size and provide high imaging quality as well.

The optical image capturing modules according to the eighth structural embodiment is illustrated in FIG. 1I, which has almost the same structure with that of the first and eighth structural embodiments, except that a lens base LB9 is integrally formed as a monolithic unit. In addition, the optical image capturing modules according to the ninth structural embodiment satisfies the conditions of the first structural embodiment, which could keep small in size and provide high imaging quality as well.

Furthermore, the optical embodiments will be described in detail as follow. The optical image capturing module could work in three wavelengths, including 486.1 nm, 587.5 nm, and 656.2 nm, wherein 587.5 nm is the main reference wavelength and is the reference wavelength for obtaining the technical characters. The optical image capturing module could also work in five wavelengths, including 470 nm, 510 nm, 555 nm, 610 nm, and 650 nm wherein 555 nm is the main reference wavelength, and is the reference wavelength for obtaining the technical characters.

The optical image capturing module of the present invention satisfies 0.5≤ΣPPR/|ΣNPR|≤15, and a preferable range is 1≤ΣPPR/|ΣNPR|≤3.0, where PPR is a ratio of the focal length f of the optical image capturing module to a focal length fp of each of lenses with positive refractive power; NPR is a ratio of the focal length f of the optical image capturing module to a focal length fn of each of lenses with negative refractive power; ΣPPR is a sum of the PPRs of each positive lens; and ΣNPR is a sum of the NPRs of each negative lens. It is helpful for control of an entire refractive power and an entire length of the optical image capturing module.

The optical image capturing module further include an image sensor provided on the image plane. The optical image capturing module of the present invention satisfies HOS/HOI≤50 and 0.5≤HOS/f≤150, and a preferable range is 1≤HOS/HOI≤40 and 1≤HOS/f≤140, where HOI is a half of a diagonal of an effective sensing area of the image sensor, i.e., the maximum image height, and HOS is a height of the optical image capturing module, i.e. a distance on the optical axis between the object-side surface of the first lens and the image plane. It is helpful for reduction of the size of the optical image capturing module for used in compact cameras.

The optical image capturing module of the present invention further is provided with an aperture to increase image quality.

In the optical image capturing module of the present invention, the aperture could be a front aperture or a middle aperture, wherein the front aperture is provided between the object and the first lens, and the middle is provided between the first lens and the image plane. The front aperture provides a long distance between an exit pupil of the optical image capturing module and the image plane, which allows more elements to be installed. The middle could enlarge a view angle of view of the optical image capturing module and increase the efficiency of the image sensor. The optical image capturing module satisfies 0.1≤InS/HOS≤1.1, where InS is a distance between the aperture and the image surface. It is helpful for size reduction and wide angle.

The optical image capturing module of the present invention satisfies 0.1≤ΣTP/InTL≤0.9, where InTL is a distance between the object-side surface of the first lens and the image-side surface of the sixth lens, and ΣTP is a sum of central thicknesses of the lenses on the optical axis. It is helpful for the contrast of image and yield rate of manufacture and provides a suitable back focal length for installation of other elements. In addition, the optical image capturing module of the present invention satisfies 0.1≤InTL/HOS≤0.95, which is helpful for reduction of the size of the optical image capturing module for used in compact cameras.

The optical image capturing system has a maximum image height HOI on the image plane vertical to the optical axis. A transverse aberration at 0.7 HOI in the positive direction of the tangential ray fan aberration after the longest operation wavelength of visible light passing through the edge of the entrance pupil is denoted by PLTA; a transverse aberration at 0.7 HOI in the positive direction of the tangential ray fan aberration after the shortest operation wavelength of visible light passing through the edge of the entrance pupil is denoted by PSTA; a transverse aberration at 0.7 HOI in the negative direction of the tangential ray fan aberration after the longest operation wavelength of visible light passing through the edge of the entrance pupil is denoted by NLTA; a transverse aberration at 0.7 HOI in the negative direction of the tangential ray fan aberration after the shortest operation wavelength of visible light passing through the edge of the entrance pupil is denoted by NSTA; a transverse aberration at 0.7 HOI of the sagittal ray fan aberration after the longest operation wavelength of visible light passing through the edge of the entrance pupil is denoted by SLTA; a transverse aberration at 0.7 HOI of the sagittal ray fan aberration after the shortest operation wavelength of visible light passing through the edge of the entrance pupil is denoted by SSTA. In addition, the optical image capturing module has a better image performance when the optical image capturing module of the present invention satisfies PLTA≤100 μm; PSTA≤100 μm; NLTA≤100 μm; NSTA≤100 μm; SLTA≤100 μm; and SSTA≤100 μm.

The optical image capturing module of the present invention satisfies 0.001≤|R1/R2|≤25, and a preferable range is 0.01≤|R1/R2|<12, where R1 is a radius of curvature of the object-side surface of the first lens, and R2 is a radius of curvature of the image-side surface of the first lens. It provides the first lens with a suitable positive refractive power to reduce the increase rate of the spherical aberration.

The optical image capturing module of the present invention satisfies −7<(R11−R12)/(R11+R12)<50, where R11 is a radius of curvature of the object-side surface of the sixth lens, and R12 is a radius of curvature of the image-side surface of the sixth lens. It may modify the astigmatic field curvature.

The optical image capturing module of the present invention satisfies IN12/f≤60, where IN12 is a distance on the optical axis between the first lens and the second lens. It may correct chromatic aberration and improve the performance.

The optical image capturing module of the present invention satisfies IN56/f≤3.0, where IN56 is a distance on the optical axis between the fifth lens and the sixth lens. It may correct chromatic aberration and improve the performance.

The optical image capturing module of the present invention satisfies 0.1≤(TP1+IN12)/TP2≤10, where TP1 is a central thickness of the first lens on the optical axis, and TP2 is a central thickness of the second lens on the optical axis. It may control the sensitivity of manufacture of the optical image capturing module and improve the performance.

The optical image capturing module of the present invention satisfies 0.1≤(TP6+IN56)/TP5≤15, where TP5 is a central thickness of the fifth lens on the optical axis, TP6 is a central thickness of the sixth lens on the optical axis, and IN56 is a distance between the fifth lens and the sixth lens. It may control the sensitivity of manufacture of the optical image capturing module and improve the performance.

The optical image capturing module of the present invention satisfies 0.1≤TP4/(IN34+TP4+IN45)<1 where TP2 is a central thickness of the second lens on the optical axis, TP3 is a central thickness of the third lens on the optical axis, TP4 is a central thickness of the fourth lens on the optical axis, IN34 is a distance on the optical axis between the third lens and the fourth lens, IN45 is a distance on the optical axis between the fourth lens and the fifth lens, and InTL is a distance between the object-side surface of the first lens and the image-side surface of the seventh lens. It may fine tune and correct the aberration of the incident rays layer by layer, and reduce the height of the optical image capturing module.

The optical image capturing module satisfies 0 mm≤HVT61≤3 mm; 0 mm<HVT62≤6 mm; 0≤HVT61/HVT62; 0 mm≤|SGC6|≤0.5 mm; 0 mm≤|SGC62|≤2 mm; and 0<|SGC62|/(|SGC62|+TP6)≤0.9, where HVT61 a distance perpendicular to the optical axis between the critical point C61 on the object-side surface of the sixth lens and the optical axis; HVT62 a distance perpendicular to the optical axis between the critical point C62 on the image-side surface of the sixth lens and the optical axis; SGC61 is a distance on the optical axis between a point on the object-side surface of the sixth lens where the optical axis passes through and a point where the critical point C61 projects on the optical axis; SGC62 is a distance on the optical axis between a point on the image-side surface of the sixth lens where the optical axis passes through and a point where the critical point C62 projects on the optical axis. It is helpful to correct the off-axis view field aberration.

The optical image capturing module satisfies 0.2≤HVT62/HOI≤0.9, and preferably satisfies 0.3≤HVT62/HOI≤0.8. It may help to correct the peripheral aberration.

The optical image capturing module satisfies 0≤HVT62/HOS≤0.5, and preferably satisfies 0.2≤HVT62/HOS≤0.45. It may help to correct the peripheral aberration.

The optical image capturing module of the present invention satisfies 0<SGI611/(SGI611+TP6)≤0.9; 0<SGI621/(SGI621+TP6)≤0.9, and it is preferable to satisfy 0.1≤SGI611/(SGI611+TP6)≤0.6; 0.1≤SGI621/(SGI621+TP7)≤0.6, where SGI611 is a displacement on the optical axis from a point on the object-side surface of the sixth lens, through which the optical axis passes, to a point where the inflection point on the object-side surface, which is the closest to the optical axis, projects on the optical axis, and SGI621 is a displacement on the optical axis from a point on the image-side surface of the sixth lens, through which the optical axis passes, to a point where the inflection point on the image-side surface, which is the closest to the optical axis, projects on the optical axis.

The optical image capturing module of the present invention satisfies 0<SGI612/(SGI612+TP6)≤0.9; 0<SGI622/(SGI622+TP6)≤0.9, and it is preferable to satisfy 0.1≤SGI612/(SGI612+TP6)≤0.6; 0.1≤SGI622/(SGI622+TP6)≤0.6, where SGI612 is a displacement on the optical axis from a point on the object-side surface of the sixth lens, through which the optical axis passes, to a point where the inflection point on the object-side surface, which is the second closest to the optical axis, projects on the optical axis, and SGI622 is a displacement on the optical axis from a point on the image-side surface of the sixth lens, through which the optical axis passes, to a point where the inflection point on the object-side surface, which is the second closest to the optical axis, projects on the optical axis.

The optical image capturing module of the present invention satisfies 0.001 mm≤|HIF611|≤5 mm; 0.001 mm≤|HIF621|≤5 mm, and it is preferable to satisfy 0.1 mm≤|HIF611|≤3.5 mm; 1.5 mm≤|HIF621|≤3.5 mm, where HIF611 is a distance perpendicular to the optical axis between the inflection point on the object-side surface of the sixth lens, which is the closest to the optical axis, and the optical axis; HIF621 is a distance perpendicular to the optical axis between the inflection point on the image-side surface of the sixth lens, which is the closest to the optical axis, and the optical axis.

The optical image capturing module of the present invention satisfies 0.001 mm≤|HIF612|≤5 mm; 0.001 mm≤|HIF622|≤5 mm, and it is preferable to satisfy 0.1 mm≤|HIF622|≤3.5 mm; 0.1 mm≤|HIF612|≤3.5 mm, where HIF612 is a distance perpendicular to the optical axis between the inflection point on the object-side surface of the sixth lens, which is the second closest to the optical axis, and the optical axis; HIF622 is a distance perpendicular to the optical axis between the inflection point on the image-side surface of the sixth lens, which is the second closest to the optical axis, and the optical axis.

The optical image capturing module of the present invention satisfies 0.001 mm≤|HIF613|≤5 mm; 0.001 mm≤|HIF623|≤5 mm, and it is preferable to satisfy 0.1 mm≤|HIF623|≤3.5 mm; 0.1 mm≤|HIF613|≤3.5 mm, where HIF613 is a distance perpendicular to the optical axis between the inflection point on the object-side surface of the sixth lens, which is the third closest to the optical axis, and the optical axis; HIF623 is a distance perpendicular to the optical axis between the inflection point on the image-side surface of the sixth lens, which is the third closest to the optical axis, and the optical axis.

The optical image capturing module of the present invention satisfies 0.001 mm≤|HIF614|≤5 mm; 0.001 mm≤|HIF624|≤5 mm, and it is preferable to satisfy 0.1 mm≤|HIF624|≤3.5 mm; 0.1 mm≤|HIF614|≤3.5 mm, where HIF614 is a distance perpendicular to the optical axis between the inflection point on the object-side surface of the sixth lens, which is the fourth closest to the optical axis, and the optical axis; HIF624 is a distance perpendicular to the optical axis between the inflection point on the image-side surface of the sixth lens, which is the fourth closest to the optical axis, and the optical axis.

The optical image capturing module of the present invention satisfies 0<(TH1+TH2)/HOI≤0.95; 0<(TH1+TH2)/HOS≤0.95; 0<2*(TH1+TH2)/PhiA≤0.95; and it is preferable to satisfy 0<(TH1+TH2)/HOI≤0.5; 0<(TH1+TH2)/HOS≤0.5; 0<2*(TH1+TH2)/PhiA≤0.5.

In an embodiment, the lenses of high Abbe number and the lenses of low Abbe number are arranged in an interlaced arrangement that could be helpful for correction of aberration of the optical image capturing module.

An equation of aspheric surface is $$z = ch^2/[1+[1(k+1)c^2h^2]^{0.5}] + A4h^4 + A6h^6 + A8h^8 + A10h^{10} + A12h^{12} + A14h^{14} + A16h^{16} + A18h^{18} + A20h^{20} + \quad (1)$$

where z is a depression of the aspheric surface; k is conic constant; c is reciprocal of the radius of curvature; and A4, A6, A8, A10, A12, A14, A16, A18, and A20 are high-order aspheric coefficients.

In the optical image capturing module, the lenses could be made of plastic or glass. The plastic lenses may reduce the weight and lower the cost of the optical image capturing module, and the glass lenses may control the thermal effect and enlarge the space for arrangement of the refractive power of the optical image capturing module. In addition, the opposite surfaces (object-side surface and image-side surface) of the first to the seventh lenses could be aspheric that could obtain more control parameters to reduce aberration. The number of aspheric glass lenses could be less than the conventional spherical glass lenses, which is helpful for reduction of the height of the optical image capturing module.

When the lens has a convex surface, which means that the surface is convex around a position, through which the optical axis passes, and when the lens has a concave surface, which means that the surface is concave around a position, through which the optical axis passes.

The optical image capturing module of the present invention could be applied in a dynamic focusing optical image capturing module. It is superior in the correction of aberration and high imaging quality so that it could be allied in lots of fields.

The optical image capturing module of the present invention could further include a driving module to meet different demands, wherein the driving module could be coupled with the lenses to move the lenses. The driving module could be a voice coil motor (VCM), which is used to move the lens for focusing, or could be an optical image stabilization (OIS) component, which is used to lower the possibility of having the problem of image blurring which is caused by subtle movements of the lens while shooting.

To meet different requirements, at least one lens among the first lens to the seventh lens of the optical image capturing module of the present invention could be a light filter, which filters out light of wavelength shorter than 500 nm. Such effect could be achieved by coating on at least one surface of the lens, or by using materials capable of filtering out short waves to make the lens.

To meet different requirements, the image plane of the optical image capturing module in the present invention could be either flat or curved. If the image plane is curved (e.g., a sphere with a radius of curvature), the incidence angle required for focusing light on the image plane could be decreased, which is not only helpful to shorten the length of the optical image capturing module (TTL), but also helpful to increase the relative illuminance.

We provide several optical embodiments in conjunction with the accompanying drawings for the best understanding. In practice, the optical embodiments of the present invention could be applied to other structural embodiments.

First Optical Embodiment

Figure 2A:
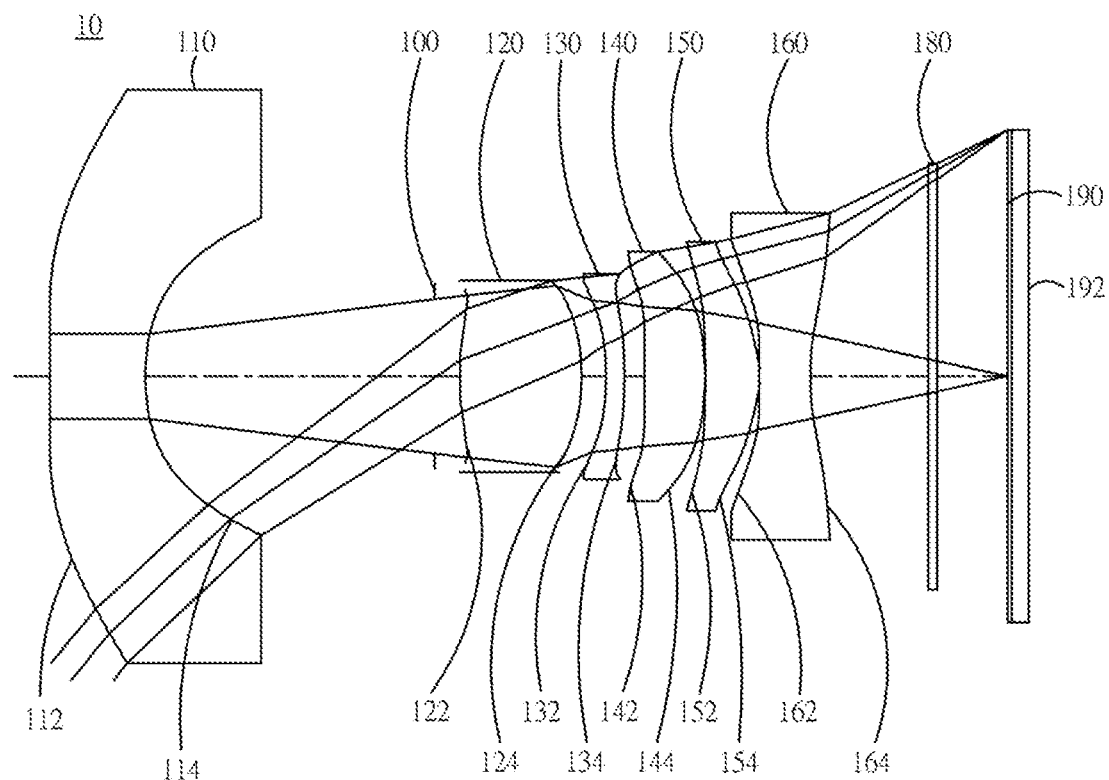
FIG. 2A is a schematic diagram of a first optical embodiment of the present invention.
Figure 2B:
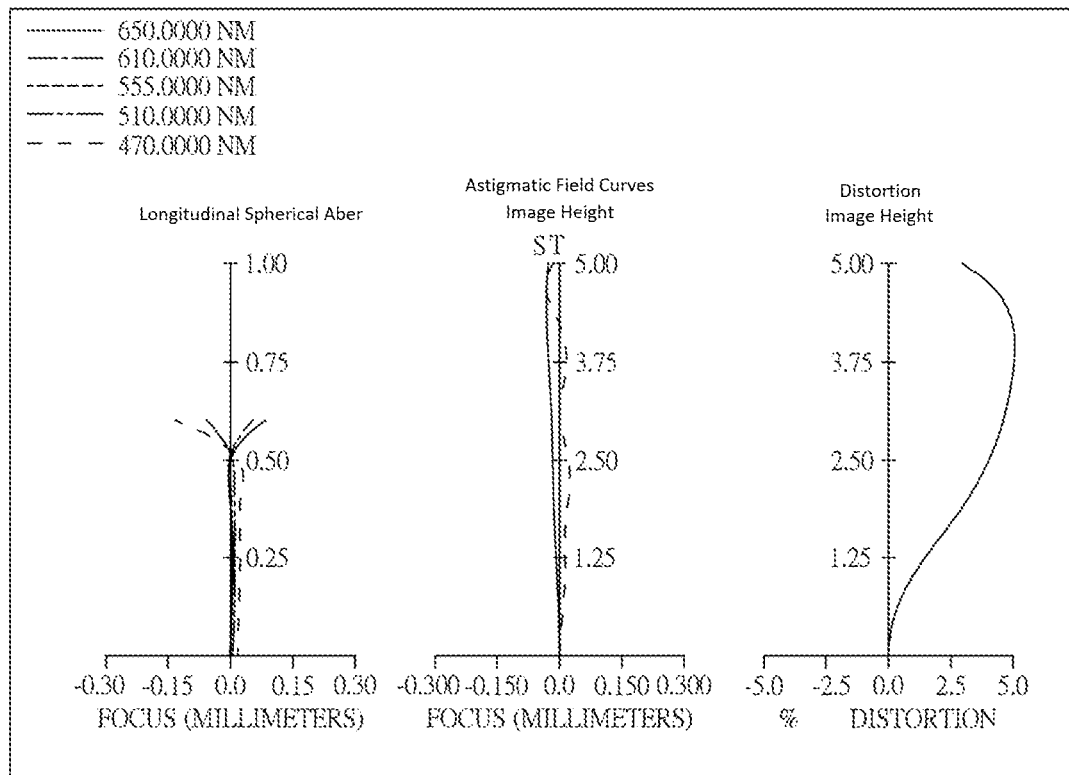
FIG. 2B shows curve diagrams of longitudinal spherical aberration, astigmatic field, and optical distortion of the optical image capturing module in the order from left to right of the first optical embodiment of the present application.

As shown in FIG. 2A and FIG. 2B, an optical image capturing module 10 of the first optical embodiment of the present invention includes, along an optical axis from an object side to an image side, a first lens 110, an aperture 100, a second lens 120, a third lens 130, a fourth lens 140, a fifth lens 150, a sixth lens 160, an IR-cut filter 180, an image plane 190, and an image sensor 192.

The first lens 110 has negative refractive power and is made of plastic. An object-side surface 112 thereof, which faces the object side, is a concave aspheric surface, and an image-side surface 114 thereof, which faces the image side, is a concave aspheric surface. The object-side surface 112 has two inflection points. A profile curve length of the maximum effective half diameter of the object-side surface 112 of the first lens 110 is denoted by ARS11, and a profile curve length of the maximum effective half diameter of the image-side surface 114 of the first lens 110 is denoted by ARS12. A profile curve length of a half of the entrance pupil diameter (HEP) of the object-side surface 112 of the first lens 110 is denoted by ARE11, and a profile curve length of a half of the entrance pupil diameter (HEP) of the image-side surface 114 of the first lens 110 is denoted by ARE12. A thickness of the first lens 110 on the optical axis is denoted by TP1.

The first lens satisfies SGI111=−0.0031 mm; |SGI111|/(|SGI111|+TP1)=0.0016, where a displacement on the optical axis from a point on the object-side surface 112 of the first lens 110, through which the optical axis passes, to a point where the inflection point on the object-side surface 112, which is the closest to the optical axis, projects on the optical axis, is denoted by SGI111, and a displacement on the optical axis from a point on the image-side surface 114 of the first lens 110, through which the optical axis passes, to a point where the inflection point on the image-side surface 114, which is the closest to the optical axis, projects on the optical axis is denoted by SGI121.

The first lens 110 satisfies SGI112=1.3178 mm; |SGI112|/(|SGI112|+TP1)=0.4052, where a displacement on the optical axis from a point on the object-side surface 112 of the first lens 110, through which the optical axis passes, to a point where the inflection point on the object-side surface 112, which is the second closest to the optical axis, projects on the optical axis, is denoted by SGI112, and a displacement on the optical axis from a point on the image-side surface 114 of the first lens 110, through which the optical axis passes, to a point where the inflection point on the image-side surface 114, which is the second closest to the optical axis, projects on the optical axis is denoted by SGI122.

The first lens 110 satisfies HIF111=0.5557 mm; HIF111/HOI=0.1111, where a displacement perpendicular to the optical axis from a point on the object-side surface 112 of the first lens 110, through which the optical axis passes, to the inflection point, which is the closest to the optical axis is denoted by HIF111, and a displacement perpendicular to the optical axis from a point on the image-side surface 114 of the first lens 110, through which the optical axis passes, to the inflection point, which is the closest to the optical axis is denoted by HIF121.

The first lens 110 satisfies HIF112=5.3732 mm; HIF112/HOI=1.0746, where a displacement perpendicular to the optical axis from a point on the object-side surface 112 of the first lens 110, through which the optical axis passes, to the inflection point, which is the second closest to the optical axis is denoted by HIF112, and a displacement perpendicular to the optical axis from a point on the image-side surface 114 of the first lens 110, through which the optical axis passes, to the inflection point, which is the second closest to the optical axis is denoted by HIF122.

The second lens 120 has positive refractive power and is made of plastic. An object-side surface 122 thereof, which faces the object side, is a convex aspheric surface, and an image-side surface 124 thereof, which faces the image side, is a convex aspheric surface. The object-side surface 122 has an inflection point. A profile curve length of the maximum effective half diameter of the object-side surface 122 of the second lens 120 is denoted by ARS21, and a profile curve length of the maximum effective half diameter of the image-side surface 124 of the second lens 120 is denoted by ARS22. A profile curve length of a half of the entrance pupil diameter (HEP) of the object-side surface 122 of the second lens 120 is denoted by ARE21, and a profile curve length of a half of the entrance pupil diameter (HEP) of the image-side surface 124 of the second lens 120 is denoted by ARE22. A thickness of the second lens 120 on the optical axis is denoted by TP2.

The second lens 120 satisfies SGI211=0.1069 mm; |SGI211|/(|SGI211|+TP2)=0.0412; SGI221=0 mm; |SGI221|/(|SGI221|+TP2)=0, where a displacement on the optical axis from a point on the object-side surface 122 of the second lens 120, through which the optical axis passes, to a point where the inflection point on the object-side surface 122, which is the closest to the optical axis, projects on the optical axis, is denoted by SGI211, and a displacement on the optical axis from a point on the image-side surface 124 of the second lens 120, through which the optical axis passes, to a point where the inflection point on the image-side surface 124, which is the closest to the optical axis, projects on the optical axis is denoted by SGI221.

The second lens 120 satisfies HIF211=1.1264 mm; HIF211/HOI=0.2253; HIF221=0 mm; HIF221/HOI=0, where a displacement perpendicular to the optical axis from a point on the object-side surface 122 of the second lens 120, through which the optical axis passes, to the inflection point, which is the closest to the optical axis is denoted by HIF211, and a displacement perpendicular to the optical axis from a point on the image-side surface 124 of the second lens 120, through which the optical axis passes, to the inflection point, which is the closest to the optical axis is denoted by HIF221.

The third lens 130 has negative refractive power and is made of plastic. An object-side surface 132, which faces the object side, is a concave aspheric surface, and an image-side surface 134, which faces the image side, is a convex aspheric surface. The object-side surface 132 has an inflection point, and the image-side surface 134 has an inflection point. The object-side surface 122 has an inflection point. A profile curve length of the maximum effective half diameter of the object-side surface 132 of the third lens 130 is denoted by ARS31, and a profile curve length of the maximum effective half diameter of the image-side surface 134 of the third lens 130 is denoted by ARS32. A profile curve length of a half of the entrance pupil diameter (HEP) of the object-side surface 132 of the third lens 130 is denoted by ARE31, and a profile curve length of a half of the entrance pupil diameter (HEP) of the image-side surface 134 of the third lens 130 is denoted by ARE32. A thickness of the third lens 130 on the optical axis is denoted by TP3.

The third lens 130 satisfies SGI311=−0.3041 mm; |SGI311|/(|SGI311|+TP3)=0.4445; SGI321=−0.1172 mm; |SGI321|/(|SGI321|+TP3)=0.2357, where SGI311 is a displacement on the optical axis from a point on the object-side surface 132 of the third lens 130, through which the optical axis passes, to a point where the inflection point on the object-side surface 132, which is the closest to the optical axis, projects on the optical axis, and SGI321 is a displacement on the optical axis from a point on the image-side surface 134 of the third lens 130, through which the optical axis passes, to a point where the inflection point on the image-side surface 134, which is the closest to the optical axis, projects on the optical axis.

The third lens 130 satisfies HIF311=1.5907 mm; HIF311/HOI=0.3181; HIF321=1.3380 mm; HIF321/HOI=0.2676, where HIF311 is a distance perpendicular to the optical axis between the inflection point on the object-side surface 132 of the third lens 130, which is the closest to the optical axis, and the optical axis; HIF321 is a distance perpendicular to the optical axis between the inflection point on the image-side surface 134 of the third lens 130, which is the closest to the optical axis, and the optical axis.

The fourth lens 140 has positive refractive power and is made of plastic. An object-side surface 142, which faces the object side, is a convex aspheric surface, and an image-side surface 144, which faces the image side, is a concave aspheric surface. The object-side surface 142 has two inflection points, and the image-side surface 144 has an inflection point. A profile curve length of the maximum effective half diameter of the object-side surface 142 of the fourth lens 140 is denoted by ARS41, and a profile curve length of the maximum effective half diameter of the image-side surface 144 of the fourth lens 140 is denoted by ARS42. A profile curve length of a half of the entrance pupil diameter (HEP) of the object-side surface 142 of the fourth lens 140 is denoted by ARE41, and a profile curve length of a half of the entrance pupil diameter (HEP) of the image-side surface 144 of the fourth lens 140 is denoted by ARE42. A thickness of the fourth lens 140 on the optical axis is TP4.

The fourth lens 140 satisfies SGI411=0.0070 mm; |SGI411|/(|SGI411|+TP4)=0.0056; SGI421=0.0006 mm; |SGI421|/(|SGI421|+TP4)=0.0005, where SGI411 is a displacement on the optical axis from a point on the object-side surface 142 of the fourth lens 140, through which the optical axis passes, to a point where the inflection point on the object-side surface 142, which is the closest to the optical axis, projects on the optical axis, and SGI421 is a displacement on the optical axis from a point on the image-side surface 144 of the fourth lens 140, through which the optical axis passes, to a point where the inflection point on the image-side surface 144, which is the closest to the optical axis, projects on the optical axis.

The fourth lens 140 satisfies SGI412=−0.2078 mm; |SGI412|/(|SGI412|+TP4)=0.1439, where SGI412 is a displacement on the optical axis from a point on the object-side surface 142 of the fourth lens 140, through which the optical axis passes, to a point where the inflection point on the object-side surface 142, which is the second closest to the optical axis, projects on the optical axis, and SGI422 is a displacement on the optical axis from a point on the image-side surface 144 of the fourth lens 140, through which the optical axis passes, to a point where the inflection point on the image-side surface 144, which is the second closest to the optical axis, projects on the optical axis.

The fourth lens 140 further satisfies HIF411=0.4706 mm; HIF411/HOI=0.0941; HIF421=0.1721 mm; HIF421/HOI=0.0344, where HIF411 is a distance perpendicular to the optical axis between the inflection point on the object-side surface 142 of the fourth lens 140, which is the closest to the optical axis, and the optical axis; HIF421 is a distance perpendicular to the optical axis between the inflection point on the image-side surface 144 of the fourth lens 140, which is the closest to the optical axis, and the optical axis.

The fourth lens 140 satisfies HIF412=2.0421 mm; HIF412/HOI=0.4084, where HIF412 is a distance perpendicular to the optical axis between the inflection point on the object-side surface 142 of the fourth lens 140, which is the second closest to the optical axis, and the optical axis; HIF422 is a distance perpendicular to the optical axis between the inflection point on the image-side surface 144 of the fourth lens 140, which is the second closest to the optical axis, and the optical axis.

The fifth lens 150 has positive refractive power and is made of plastic. An object-side surface 152, which faces the object side, is a convex aspheric surface, and an image-side surface 154, which faces the image side, is a convex aspheric surface. The object-side surface 152 has two inflection points, and the image-side surface 154 has an inflection point. A profile curve length of the maximum effective half diameter of the object-side surface 152 of the fifth lens 150 is denoted by ARS51, and a profile curve length of the maximum effective half diameter of the image-side surface 154 of the fifth lens 150 is denoted by ARS52. A profile curve length of a half of the entrance pupil diameter (HEP) of the object-side surface 152 of the fifth lens 150 is denoted by ARE51, and a profile curve length of a half of the entrance pupil diameter (HEP) of the image-side surface 154 of the fifth lens 150 is denoted by ARE52. A thickness of the fifth lens 150 on the optical axis is denoted by TP5.

The fifth lens 150 satisfies SGI511=0.00364 mm; SGI521=−0.63365 mm; |SGI511|/(|SGI511|+TP5)=0.00338; |SGI521|/(|SGI521|+TP5)=0.37154, where SGI511 is a displacement on the optical axis from a point on the object-side surface 152 of the fifth lens 150, through which the optical axis passes, to a point where the inflection point on the object-side surface 152, which is the closest to the optical axis, projects on the optical axis, and SGI521 is a displacement on the optical axis from a point on the image-side surface 154 of the fifth lens 150, through which the optical axis passes, to a point where the inflection point on the image-side surface 154, which is the closest to the optical axis, projects on the optical axis.

The fifth lens 150 satisfies SGI512=−0.32032 mm; |SGI512|/(|SGI512|+TP5)=0.23009, where SGI512 is a displacement on the optical axis from a point on the object-side surface 152 of the fifth lens 150, through which the optical axis passes, to a point where the inflection point on the object-side surface 152, which is the second closest to the optical axis, projects on the optical axis, and SGI522 is a displacement on the optical axis from a point on the image-side surface 154 of the fifth lens 150, through which the optical axis passes, to a point where the inflection point on the image-side surface 154, which is the second closest to the optical axis, projects on the optical axis.

The fifth lens 150 satisfies SGI513=0 mm; SGI523=0 mm; |SGI513|/(|SGI513|+TP5)=0; |SGI523|/(|SGI523|+TP5)=0, where SGI513 is a displacement on the optical axis from a point on the object-side surface 152 of the fifth lens 150, through which the optical axis passes, to a point where the inflection point on the object-side surface 152, which is the third closest to the optical axis, projects on the optical axis, and SGI523 is a displacement on the optical axis from a point on the image-side surface 154 of the fifth lens 150, through which the optical axis passes, to a point where the inflection point on the image-side surface 154, which is the third closest to the optical axis, projects on the optical axis.

The fifth lens 150 satisfies SGI514=0 mm; SGI524=0 mm; |SGI514|/(|SGI514|+TP5)=0; |SGI524|/(|SGI524|+TP5)=0, where SGI514 is a displacement on the optical axis from a point on the object-side surface 152 of the fifth lens 150, through which the optical axis passes, to a point where the inflection point on the object-side surface 152, which is the fourth closest to the optical axis, projects on the optical axis, and SGI524 is a displacement on the optical axis from a point on the image-side surface 154 of the fifth lens 150, through which the optical axis passes, to a point where the inflection point on the image-side surface 154, which is the fourth closest to the optical axis, projects on the optical axis.

The fifth lens 150 further satisfies HIF511=0.28212 mm; HIF521=2.13850 mm; HIF511/HOI=0.05642; HIF521/HOI=0.42770, where HIF511 is a distance perpendicular to the optical axis between the inflection point on the object-side surface 152 of the fifth lens 150, which is the closest to the optical axis, and the optical axis; HIF521 is a distance perpendicular to the optical axis between the inflection point on the image-side surface 154 of the fifth lens 150, which is the closest to the optical axis, and the optical axis.

The fifth lens 150 further satisfies HIF512=2.51384 mm; HIF512/HOI=0.50277, where HIF512 is a distance perpendicular to the optical axis between the inflection point on the object-side surface 152 of the fifth lens 150, which is the second closest to the optical axis, and the optical axis; HIF522 is a distance perpendicular to the optical axis between the inflection point on the image-side surface 154 of the fifth lens 150, which is the second closest to the optical axis, and the optical axis.

The fifth lens 150 further satisfies HIF513=0 mm; HIF513/HOI=0; HIF523=0 mm; HIF523/HOI=0, where HIF513 is a distance perpendicular to the optical axis between the inflection point on the object-side surface 152 of the fifth lens 150, which is the third closest to the optical axis, and the optical axis; HIF523 is a distance perpendicular to the optical axis between the inflection point on the image-side surface 154 of the fifth lens 150, which is the third closest to the optical axis, and the optical axis.

The fifth lens 150 further satisfies HIF514=0 mm; HIF514/HOI=0; HIF524=0 mm; HIF524/HOI=0, where HIF514 is a distance perpendicular to the optical axis between the inflection point on the object-side surface 152 of the fifth lens 150, which is the fourth closest to the optical axis, and the optical axis; HIF524 is a distance perpendicular to the optical axis between the inflection point on the image-side surface 154 of the fifth lens 150, which is the fourth closest to the optical axis, and the optical axis.

The sixth lens 160 has negative refractive power and is made of plastic. An object-side surface 162, which faces the object side, is a concave surface, and an image-side surface 164, which faces the image side, is a concave surface. The object-side surface 162 has two inflection points, and the image-side surface 164 has an inflection point. Whereby, the incident angle of each view field entering the sixth lens 160 could be effectively adjusted to improve aberration. A profile curve length of the maximum effective half diameter of the object-side surface 162 of the sixth lens 160 is denoted by ARS61, and a profile curve length of the maximum effective half diameter of the image-side surface 164 of the sixth lens 160 is denoted by ARS62. A profile curve length of a half of the entrance pupil diameter (HEP) of the object-side surface 162 of the sixth lens 160 is denoted by ARE61, and a profile curve length of a half of the entrance pupil diameter (HEP) of the image-side surface 164 of the sixth lens 160 is denoted by ARE62. A thickness of the sixth lens 160 on the optical axis is denoted by TP6.

The sixth lens 160 satisfies SGI611=−0.38558 mm; SGI621=0.12386 mm; |SGI611|/(|SGI611|+TP6)=0.27212; |SGI621|/(|SGI621|+TP6)=0.10722, where SGI611 is a displacement on the optical axis from a point on the object-side surface 162 of the sixth lens 160, through which the optical axis passes, to a point where the inflection point on the object-side surface 162, which is the closest to the optical axis, projects on the optical axis, and SGI621 is a displacement on the optical axis from a point on the image-side surface 164 of the sixth lens 160, through which the optical axis passes, to a point where the inflection point on the image-side surface 164, which is the closest to the optical axis, projects on the optical axis.

The sixth lens 160 satisfies SGI612=−0.47400 mm; |SGI612|/(|SGI612|+TP6)=0.31488; SGI622=0 mm; |SGI622|/(|SGI622|+TP6)=0, where SGI612 is a displacement on the optical axis from a point on the object-side surface 162 of the sixth lens 160, through which the optical axis passes, to a point where the inflection point on the object-side surface 162, which is the second closest to the optical axis, projects on the optical axis, and SGI622 is a displacement on the optical axis from a point on the image-side surface 164 of the sixth lens 160, through which the optical axis passes, to a point where the inflection point on the image-side surface 164, which is the second closest to the optical axis, projects on the optical axis.

The sixth lens 160 further satisfies HIF611=2.24283 mm; HIF621=1.07376 mm; HIF611/HOI=0.44857; HIF621/HOI=0.21475, where HIF611 is a distance perpendicular to the optical axis between the inflection point on the object-side surface 162 of the sixth lens 160, which is the closest to the optical axis, and the optical axis; HIF621 is a distance perpendicular to the optical axis between the inflection point on the image-side surface 164 of the sixth lens 160, which is the closest to the optical axis, and the optical axis.

The sixth lens 160 further satisfies HIF612=2.48895 mm; HIF612/HOI=0.49779, where HIF612 is a distance perpendicular to the optical axis between the inflection point on the object-side surface 162 of the sixth lens 160, which is the second closest to the optical axis, and the optical axis; HIF622 is a distance perpendicular to the optical axis between the inflection point on the image-side surface 164 of the sixth lens 160, which is the second closest to the optical axis, and the optical axis.

The sixth lens 160 further satisfies HIF613=0 mm; HIF613/HOI=0; HIF623=0 mm; HIF623/HOI=0, where HIF613 is a distance perpendicular to the optical axis between the inflection point on the object-side surface 162 of the sixth lens 160, which is the third closest to the optical axis, and the optical axis; HIF623 is a distance perpendicular to the optical axis between the inflection point on the image-side surface 164 of the sixth lens 160, which is the third closest to the optical axis, and the optical axis.

The sixth lens 160 further satisfies HIF614=0 mm; HIF614/HOI=0; HIF624=0 mm; HIF624/HOI=0, where HIF614 is a distance perpendicular to the optical axis between the inflection point on the object-side surface 162 of the sixth lens 160, which is the fourth closest to the optical axis, and the optical axis; HIF624 is a distance perpendicular to the optical axis between the inflection point on the image-side surface 164 of the sixth lens 160, which is the fourth closest to the optical axis, and the optical axis.

The IR-cut filter 180 is made of glass and is disposed between the sixth lens 160 and the image plane 190. The IR-cut filter 180 gives no contribution to the focal length of the optical image capturing module.

The optical image capturing module 10 of the first optical embodiment has the following parameters, which are f=4.075 mm; f/HEP=1.4; HAF=50.001 degrees; and tan (HAF)=1.1918, where f is a focal length of the lens group; HAF is a half of the maximum field angle; and HEP is an entrance pupil diameter.

The parameters of the lenses of the first optical embodiment are f1=−7.828 mm; |f/f1|=0.52060; f6=−4.886; and |f1|>f6, where f1 is a focal length of the first lens 110; and f6 is a focal length of the sixth lens 160.

The first optical embodiment further satisfies |f2|+|f3|+|f4|+|f5|=95.50815; |f1|+|f6|=12.71352 and |f2|+|f3|+|f4|+|f5|>|f1|+|f6|, where f2 is a focal length of the second lens 120, f3 is a focal length of the third lens 130, f4 is a focal length of the fourth lens 140, f5 is a focal length of the fifth lens 150, and f6 is a focal length of the sixth lens 160.

The optical image capturing module 10 of the first optical embodiment further satisfies ΣPPR=f/f2+f/f4+f/f5=1.63290; ΣNPR=|f/f1|+|f/f3|+|f/f6|=1.51305; ΣPPR/|ΣNPR|=1.07921; |f/f2|=0.69101; |f/f3|=0.15834; |f/f4|=0.06883; |f/f5|=0.87305; and |f/f6|=0.83412, where PPR is a ratio of a focal length f of the optical image capturing module to a focal length fp of each of the lenses with positive refractive power; and NPR is a ratio of a focal length f of the optical image capturing module to a focal length fn of each of lenses with negative refractive power.

The optical image capturing module 10 of the first optical embodiment further satisfies InTL+BFL=HOS; HOS=19.54120 mm; HOI=5.0 mm; HOS/HOI=3.90824; HOS/f=4.7952; InS=11.685 mm; InTL/HOS=0.9171; and InS/HOS=0.59794, where InTL is a distance between the object-side surface 112 of the first lens 110 and the image-side surface 164 of the sixth lens 160; HOS is a height of the image capturing system, i.e. a distance between the object-side surface 112 of the first lens 110 and the image plane 190; InS is a distance between the aperture 100 and the image plane 190; HOI is a half of a diagonal of an effective sensing area of the image sensor 192, i.e., the maximum image height; and BFL is a distance between the image-side surface 164 of the sixth lens 160 and the image plane 190.

The optical image capturing module 10 of the first optical embodiment further satisfies ΣTP=8.13899 mm; and ΣTP/InTL=0.52477, where ΣTP is a sum of the thicknesses of the lenses 110-160 with refractive power. It is helpful for the contrast of image and yield rate of manufacture and provides a suitable back focal length for installation of other elements.

The optical image capturing module 10 of the first optical embodiment further satisfies |R1/R2|=129.9952, where R1 is a radius of curvature of the object-side surface 112 of the first lens 110, and R2 is a radius of curvature of the image-side surface 114 of the first lens 110. It provides the first lens 110 with a suitable positive refractive power to reduce the increase rate of the spherical aberration.

The optical image capturing module 10 of the first optical embodiment further satisfies (R11−R12)/(R11+R12)=1.27780, where R11 is a radius of curvature of the object-side surface 162 of the sixth lens 160, and R12 is a radius of curvature of the image-side surface 164 of the sixth lens 160. It may modify the astigmatic field curvature.

The optical image capturing module 10 of the first optical embodiment further satisfies ΣPP=f2+f4+f5=69.770 mm; and f5/(f2+f4+f5)=0.067, where ΣPP is a sum of the focal lengths fp of each lens with positive refractive power. It is helpful to share the positive refractive power of a single lens to other positive lenses to avoid the significant aberration caused by the incident rays.

The optical image capturing module 10 of the first optical embodiment further satisfies ΣNP=f1+f3+f6=−38.451 mm; and f6/(f1+f3+f6)=0.127, where ΣNP is a sum of the focal lengths fn of each lens with negative refractive power. It is helpful to share the negative refractive power of the sixth lens 160 to the other negative lens, which avoid the significant aberration caused by the incident rays.

The optical image capturing module 10 of the first optical embodiment further satisfies IN12=6.418 mm; IN12/f=1.57491, where IN12 is a distance on the optical axis between the first lens 110 and the second lens 120. It may correct chromatic aberration and improve the performance.

The optical image capturing module 10 of the first optical embodiment further satisfies IN56=0.025 mm; IN56/f=0.00613, where IN56 is a distance on the optical axis between the fifth lens 150 and the sixth lens 160. It may correct chromatic aberration and improve the performance.

The optical image capturing module 10 of the first optical embodiment further satisfies TP1=1.934 mm; TP2=2.486 mm; and (TP1+IN12)/TP2=3.36005, where TP1 is a central thickness of the first lens 110 on the optical axis, and TP2 is a central thickness of the second lens 120 on the optical axis. It may control the sensitivity of manufacture of the optical image capturing module and improve the performance.

The optical image capturing module 10 of the first optical embodiment further satisfies TP5=1.072 mm; TP6=1.031 mm; and (TP6+IN56)/TP5=0.98555, where TP5 is a central thickness of the fifth lens 150 on the optical axis, TP6 is a central thickness of the sixth lens 160 on the optical axis, and IN56 is a distance on the optical axis between the fifth lens 150 and the sixth lens 160. It may control the sensitivity of manufacture of the optical image capturing module and lower the total height of the optical image capturing module.

The optical image capturing module 10 of the first optical embodiment further satisfies IN34=0.401 mm; IN45=0.025 mm; and TP4/(IN34+TP4+IN45)=0.74376, where TP4 is a central thickness of the fourth lens 140 on the optical axis; IN34 is a distance on the optical axis between the third lens 130 and the fourth lens 140; IN45 is a distance on the optical axis between the fourth lens 140 and the fifth lens 150. It may help to slightly correct the aberration caused by the incident rays and lower the total height of the optical image capturing module.

The optical image capturing module 10 of the first optical embodiment further satisfies InRS51=−0.34789 mm; InRS52=−0.88185 mm; |InRS51|/TP5=0.32458; and |InRS52|/TP5=0.82276, where InRS51 is a displacement from a point on the object-side surface 152 of the fifth lens 150 passed through by the optical axis to a point on the optical axis where a projection of the maximum effective semi diameter of the object-side surface 152 of the fifth lens 150 ends; InRS52 is a displacement from a point on the image-side surface 154 of the fifth lens 150 passed through by the optical axis to a point on the optical axis where a projection of the maximum effective semi diameter of the image-side surface 154 of the fifth lens 150 ends; and TP5 is a central thickness of the fifth lens 150 on the optical axis. It is helpful for manufacturing and shaping of the lenses and is helpful to reduce the size.

The optical image capturing module 10 of the first optical embodiment further satisfies HVT51=0.515349 mm; and HVT52=0 mm, where HVT51 is a distance perpendicular to the optical axis between the critical point on the object-side surface 152 of the fifth lens 150 and the optical axis; and HVT52 is a distance perpendicular to the optical axis between the critical point on the image-side surface 154 of the fifth lens 150 and the optical axis.

The optical image capturing module 10 of the first optical embodiment further satisfies InRS61=−0.58390 mm; InRS62=0.41976 mm; |InRS61|/TP6=0.56616; and |InRS62|/TP6=0.40700, where InRS61 is a displacement from a point on the object-side surface 162 of the sixth lens 160 passed through by the optical axis to a point on the optical axis where a projection of the maximum effective semi diameter of the object-side surface 162 of the sixth lens 160 ends; InRS62 is a displacement from a point on the image-side surface 164 of the sixth lens 160 passed through by the optical axis to a point on the optical axis where a projection of the maximum effective semi diameter of the image-side surface 164 of the sixth lens 160 ends; and TP6 is a central thickness of the sixth lens 160 on the optical axis. It is helpful for manufacturing and shaping of the lenses and is helpful to reduce the size.

The optical image capturing module 10 of the first optical embodiment satisfies HVT61=0 mm; and HVT62=0 mm, where HVT61 is a distance perpendicular to the optical axis between the critical point on the object-side surface 162 of the sixth lens 160 and the optical axis; and HVT62 is a distance perpendicular to the optical axis between the critical point on the image-side surface 164 of the sixth lens 160 and the optical axis.

The optical image capturing module 10 of the first optical embodiment satisfies HVT51/HOI=0.1031. It is helpful for correction of the aberration of the peripheral view field of the optical image capturing module.

The optical image capturing module 10 of the first optical embodiment satisfies HVT51/HOS=0.02634. It is helpful for correction of the aberration of the peripheral view field of the optical image capturing module.

The second lens 120, the third lens 130, and the sixth lens 160 have negative refractive power. The optical image capturing module 10 of the first optical embodiment further satisfies NA6/NA2≤1, where NA2 is an Abbe number of the second lens 120; NA3 is an Abbe number of the third lens 130; and NA6 is an Abbe number of the sixth lens 160. It may correct the aberration of the optical image capturing module.

The optical image capturing module 10 of the first optical embodiment further satisfies |TDT|=2.124%; |ODT|=5.076%, where TDT is TV distortion; and ODT is optical distortion.

The optical image capturing module 10 of the first optical embodiment further satisfies LS=12 mm; PhiA=2*(EHD62)=6.726 mm; PhiC=PhiA+2*TH2=7.026 mm; PhiD=PhiC+2*(TH1+TH2)=7.426 mm; TH1=0.2 mm; TH2=0.15 mm; PhiA/PhiD=0.9057; TH1+TH2=0.35 mm; (TH1+TH2)/HOI=0.035; (TH1+TH2)/HOS=0.0179; 2(TH1+TH2)/PhiA=0.1041; (TH1+TH2)/LS=0.0292, where EHD62 is a maximum effective half diameter of the image-side surface 164 of the sixth lens 160.

The parameters of the lenses of the first optical embodiment are listed in Table 1 and Table 2.

TABLE 1 f = 4.075 mm; f/HEP = 1.4; HAF = 50.000 deg

| Surface | | Radius of curvature (mm) | Thickness (mm) | Material | Refractive index | Abbe number | Focal length (mm) |
|---|---|---|---|---|---|---|---|
| 0 | Object | plane | plane | | | | |
| 1 | 1$^{st}$ lens | −40.99625704 | 1.934 | plastic | 1.515 | 56.55 | −7.828 |
| 2 | | 4.555209289 | 5.923 | | | | |
| 3 | Aperture | plane | 0.495 | | | | |
| 4 | 2$^{nd}$ lens | 5.333427366 | 2.486 | plastic | 1.544 | 55.96 | 5.897 |
| 5 | | −6.781659971 | 0.502 | | | | |
| 6 | 3$^{rd}$ lens | −5.697794287 | 0.380 | plastic | 1.642 | 22.46 | −25.738 |
| 7 | | −8.883957518 | 0.401 | | | | |
| 8 | 4$^{th}$ lens | 13.19225664 | 1.236 | plastic | 1.544 | 55.96 | 59.205 |
| 9 | | 21.55681832 | 0.025 | | | | |
| 10 | 5$^{th}$ lens | 8.987806345 | 1.072 | plastic | 1.515 | 56.55 | 4.668 |
| 11 | | −3.158875374 | 0.025 | | | | |
| 12 | 6$^{th}$ lens | −29.46491425 | 1.031 | plastic | 1.642 | 22.46 | −4.886 |
| 13 | | 3.593484273 | 2.412 | | | | |
| 14 | Infrared rays filter | plane | 0.200 | | 1.517 | 64.13 | |

TABLE 1-continued f = 4.075 mm; f/HEP = 1.4; HAF = 50.000 deg

| Surface | Radius of curvature (mm) | Thickness (mm) | Material | Refractive index | Abbe number | Focal length (mm) |
|---|---|---|---|---|---|---|
| 15 | | plane | 1.420 | | | |
| 16 | Image plane | plane | | | | |

Reference wavelength (d-line): 555 mm; the position of blocking light: the effective half diameter of the clear aperture of the first surface is 5.800 mm; the effective diameter of the clear aperture of the third surface is 1.570 mm; the effective diameter of the clear aperture of the fifth surface is 1.950 mm.

TABLE 2

Coefficients of the aspheric surfaces

| | Surface | | | | | | |
|---|---|---|---|---|---|---|---|
| | 1 | 2 | 3 | 4 | 5 | 6 | 8 |
| k | 4.310876E+01 | −4.707622E+00 | 2.616025E+00 | 2.445397E+00 | 5.645686E−00 | −2.117147E+01 | −5.287220E+00 |
| A4 | 7.054243E−03 | 1.714312E−02 | −8.377541E−03 | −1.789549E−02 | −3.379055E−03 | −1.370959E−02 | −2.937377E−02 |
| A6 | −5.233264E−04 | −1.502232E−04 | −1.838068E−03 | −3.657520E−03 | −1.225453E−03 | 6.250200E−03 | 2.743532E−03 |
| A8 | 3.077890E−05 | −1.359611E−04 | 1.233332E−03 | −1.131622E−03 | −5.979572E−03 | −5.854426E−03 | −2.457574E−03 |
| A10 | −1.260650E−06 | 2.680747E−05 | −2.390895E−03 | 1.390351E−03 | 4.556449E−03 | 4.049451E−03 | 1.874319E−03 |
| A12 | 3.319093E−08 | −2.017491E−06 | 1.998555E−03 | −4.152857E−04 | −1.177175E−03 | −1.314592E−03 | −6.013661E−04 |
| A14 | −5.051600E−10 | 6.604615E−08 | −9.734019E−04 | 5.487286E−05 | 1.370522E−04 | 2.143097E−04 | 8.792480E−05 |
| A16 | 3.380000E−12 | −1.301630E−09 | 2.478373E−04 | −2.919339E−06 | −5.974015E−06 | −1.399894E−05 | −4.770527E−06 |

| | Surface | | | | |
|---|---|---|---|---|---|
| | 9 | 10 | 11 | 12 | 13 |
| k | 6.200000E+01 | −2.114008E+01 | −7.699904E+00 | −6.155476E+01 | −3.120467E−01 |
| A4 | −1.359965E−01 | −1.263831E−01 | −1.927804E−02 | −2.492467E−02 | −3.521844E−02 |
| A6 | 6.628518E−02 | 6.965399E−02 | 2.478376E−03 | −1.835360E−03 | 5.629654E−03 |
| A8 | −2.129167E−02 | −2.116027E−02 | 1.438785E−03 | 3.201343E−03 | −5.466925E−04 |
| A10 | 4.396344E−03 | 3.819371E−03 | −7.013749E−04 | −8.990757E−04 | 2.231154E−05 |
| A12 | −5.542899E−04 | −4.040283E−04 | 1.253214E−04 | 1.245343E−04 | 5.548990E−07 |
| A14 | 3.768879E−05 | 2.280473E−05 | −9.943196E−06 | −8.788363E−06 | −9.396920E−08 |
| A16 | −1.052467E−06 | −5.165452E−07 | 2.898397E−07 | 2.494302E−07 | 2.728360E−09 |

The figures related to the profile curve lengths obtained based on Table 1 and Table 2 are listed in the following table:

First optical embodiment (Reference wavelength (d-line): 555 mm)

| ARE | 1/2(HEP) | ARE value | ARE − 1/2(HEP) | 2(ARE/HEP) % | TP | ARE/TP (%) |
|---|---|---|---|---|---|---|
| 11 | 1.455 | 1.455 | −0.00033 | 99.98% | 1.934 | 75.23% |
| 12 | 1.455 | 1.495 | 0.03957 | 102.72% | 1.934 | 77.29% |
| 21 | 1.455 | 1.465 | 0.00940 | 100.65% | 2.486 | 58.93% |
| 22 | 1.455 | 1.495 | 0.03950 | 102.71% | 2.486 | 60.14% |
| 31 | 1.455 | 1.486 | 0.03045 | 102.09% | 0.380 | 391.02% |
| 32 | 1.455 | 1.464 | 0.00830 | 100.57% | 0.380 | 385.19% |
| 41 | 1.455 | 1.458 | 0.00237 | 100.16% | 1.236 | 117.95% |
| 42 | 1.455 | 1.484 | 0.02825 | 101.94% | 1.236 | 120.04% |
| 51 | 1.455 | 1.462 | 0.00672 | 100.46% | 1.072 | 136.42% |
| 52 | 1.455 | 1.499 | 0.04335 | 102.98% | 1.072 | 139.83% |
| 61 | 1.455 | 1.465 | 0.00964 | 100.66% | 1.031 | 142.06% |
| 62 | 1.455 | 1.469 | 0.01374 | 100.94% | 1.031 | 142.45% |

| ARS | EHD | ARS value | ARS − EHD | (ARS/EHD) % | TP | ARS/TP (%) |
|---|---|---|---|---|---|---|
| 11 | 5.800 | 6.141 | 0.341 | 105.88% | 1.934 | 317.51% |
| 12 | 3.299 | 4.423 | 1.125 | 134.10% | 1.934 | 228.70% |
| 21 | 1.664 | 1.674 | 0.010 | 100.61% | 2.486 | 67.35% |
| 22 | 1.950 | 2.119 | 0.169 | 108.65% | 2.486 | 85.23% |
| 31 | 1.980 | 2.048 | 0.069 | 103.47% | 0.380 | 539.05% |
| 32 | 2.084 | 2.101 | 0.017 | 100.83% | 0.380 | 552.87% |
| 41 | 2.247 | 2.287 | 0.040 | 101.80% | 1.236 | 185.05% |
| 42 | 2.530 | 2.813 | 0.284 | 111.22% | 1.236 | 227.63% |
| 51 | 2.655 | 2.690 | 0.035 | 101.32% | 1.072 | 250.99% |
| 52 | 2.764 | 2.930 | 0.166 | 106.00% | 1.072 | 273.40% |
| 61 | 2.816 | 2.905 | 0.089 | 103.16% | 1.031 | 281.64% |
| 62 | 3.363 | 3.391 | 0.029 | 100.86% | 1.031 | 328.83% |

The detail parameters of the first optical embodiment are listed in Table 1, in which the unit of the radius of curvature, thickness, and focal length are millimeter, and surface 0-16 indicates the surfaces of all elements in the system in sequence from the object side to the image side. Table 2 is the list of coefficients of the aspheric surfaces, in which k indicates the taper coefficient in the aspheric curve equation, and A1-A20 indicate the coefficients of aspheric surfaces from the first order to the twentieth order of each aspheric surface. The following optical embodiments have the similar diagrams and tables, which are the same as those of the first optical embodiment, so we do not describe it again. The definitions of the mechanism component parameters of the following optical embodiments are the same as those of the first optical embodiment.

Second Optical Embodiment

Figure 3A:
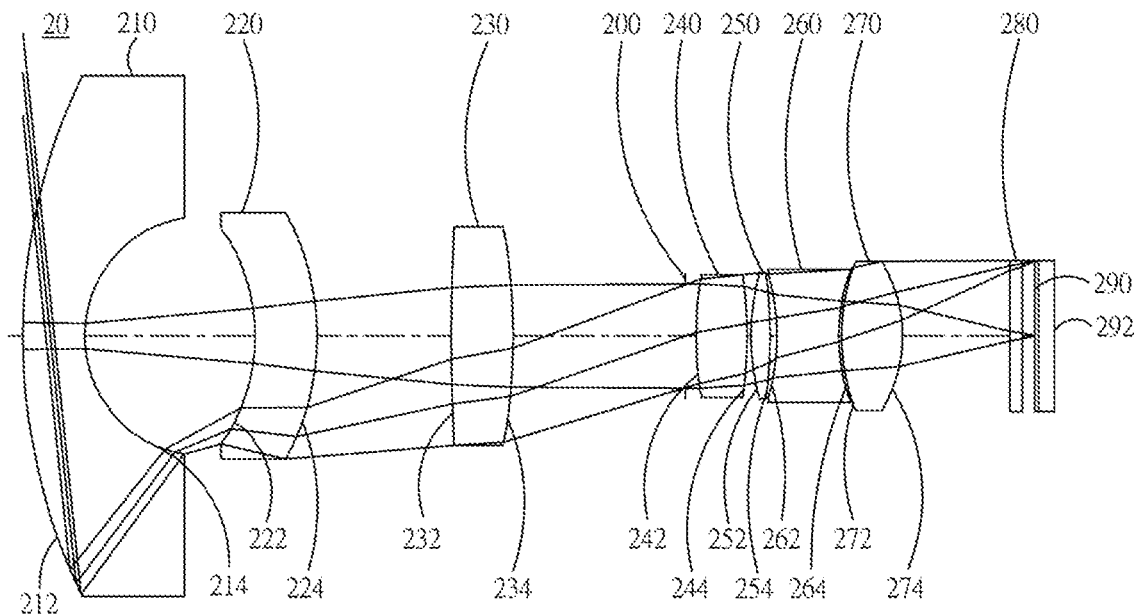
FIG. 3A is a schematic diagram of a second optical embodiment of the present invention.
Figure 3B:
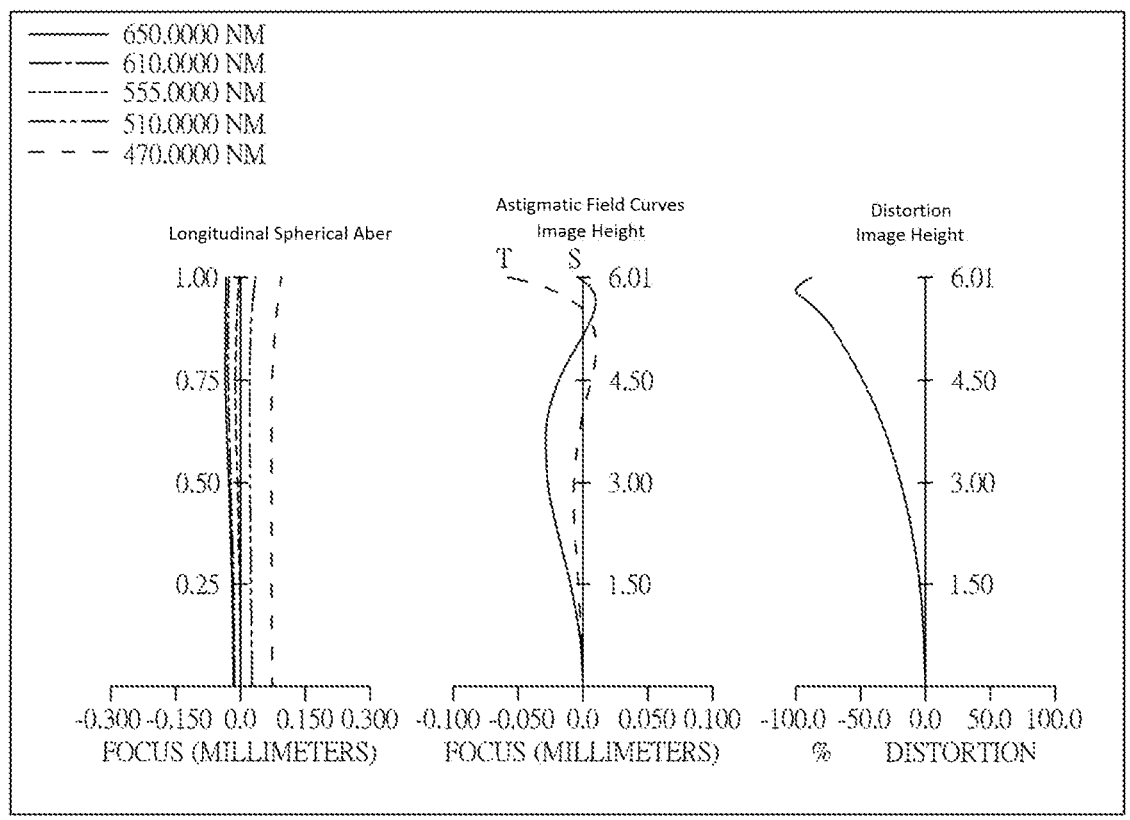
FIG. 3B shows curve diagrams of longitudinal spherical aberration, astigmatic field, and optical distortion of the optical image capturing module in the order from left to right of the second optical embodiment of the present application.

As shown in FIG. 3A and FIG. 3B, an optical image capturing module 20 of the second optical embodiment of the present invention includes, along an optical axis from an object side to an image side, a first lens 210, a second lens 220, a third lens 230, an aperture 200, a fourth lens 240, a fifth lens 250, a sixth lens 260, a seventh lens 270, an IR-cut filter 280, an image plane 290, and an image sensor 292.

The first lens 210 has negative refractive power and is made of glass. An object-side surface 212 thereof, which faces the object side, is a convex spherical surface, and an image-side surface 214 thereof, which faces the image side, is a concave spherical surface.

The second lens 220 has negative refractive power and is made of glass. An object-side surface 222 thereof, which faces the object side, is a concave spherical surface, and an image-side surface 224 thereof, which faces the image side, is a convex spherical surface.

The third lens 230 has positive refractive power and is made of glass. An object-side surface 232, which faces the object side, is a convex spherical surface, and an image-side surface 234, which faces the image side, is a convex spherical surface.

The fourth lens 240 has positive refractive power and is made of glass. An object-side surface 242, which faces the object side, is a convex spherical surface, and an image-side surface 244, which faces the image side, is a convex spherical surface.

The fifth lens 250 has positive refractive power and is made of glass. An object-side surface 252, which faces the object side, is a convex spherical surface, and an image-side surface 254, which faces the image side, is a convex spherical surface.

The sixth lens 260 has negative refractive power and is made of glass. An object-side surface 262, which faces the object side, is a concave spherical surface, and an image-side surface 264, which faces the image side, is a concave spherical surface. Whereby, the incident angle of each view field entering the sixth lens 260 could be effectively adjusted to improve aberration.

The seventh lens 270 has negative refractive power and is made of glass. An object-side surface 272, which faces the object side, is a convex surface, and an image-side surface 274, which faces the image side, is a convex surface. It may help to shorten the back focal length to keep small in size, and may reduce an incident angle of the light of an off-axis field of view and correct the aberration of the off-axis field of view.

The IR-cut filter 280 is made of glass and is disposed between the seventh lens 270 and the image plane 290. The IR-cut filter 280 gives no contribution to the focal length of the optical image capturing module.

The parameters of the lenses of the second optical embodiment are listed in Table 3 and Table 4.

TABLE 3 f = 4.7601 mm; f/HEP = 2.2; HAF = 95.98 deg

| Surface | | Radius of curvature (mm) | Thickness (mm) | Material | Refractive index | Abbe number | Focal length (mm) |
|---|---|---|---|---|---|---|---|
| 0 | Object | 1E+18 | 1E+18 | | | | |
| 1 | $1^{st}$ lens | 47.71478323 | 4.977 | glass | 2.001 | 29.13 | −12.647 |
| 2 | | 9.527614761 | 13.737 | | | | |
| 3 | $2^{nd}$ lens | −14.88061107 | 5.000 | glass | 2.001 | 29.13 | −99.541 |
| 4 | | −20.42046946 | 10.837 | | | | |
| 5 | $3^{rd}$ lens | 182.4762997 | 5.000 | glass | 1.847 | 23.78 | 44.046 |
| 6 | | −46.71963608 | 13.902 | | | | |
| 7 | Aperture | 1E+18 | 0.850 | | | | |
| 8 | $4^{th}$ lens | 28.60018103 | 4.095 | glass | 1.834 | 37.35 | 19.369 |
| 9 | | −35.08507586 | 0.323 | | | | |
| 10 | $5^{th}$ lens | 18.25991342 | 1.539 | glass | 1.609 | 46.44 | 20.223 |
| 11 | | −36.99028878 | 0.546 | | | | |
| 12 | $6^{th}$ lens | −18.24574524 | 5.000 | glass | 2.002 | 19.32 | −7.668 |
| 13 | | 15.33897192 | 0.215 | | | | |
| 14 | $7^{th}$ lens | 16.13218937 | 4.933 | glass | 1.517 | 64.20 | 13.620 |
| 15 | | −11.24007 | 8.664 | | | | |
| 16 | Infrared rays filter | 1E+18 | 1.000 | BK_7 | 1.517 | 64.2 | |
| 17 | | 1E+18 | 1.007 | | | | |
| 18 | Image plane | 1E+18 | −0.007 | | | | |

Reference wavelength (d-line): 555 nm

TABLE 4

Coefficients of the aspheric surfaces

| | Surface | | | | | | |
|---|---|---|---|---|---|---|---|
| | 1 | 2 | 3 | 4 | 5 | 6 | 8 |
| k | 0.000000E+00 | 0.000000E+00 | 0.000000E+00 | 0.000000E+00 | 0.000000E+00 | 0.000000E+00 | 0.000000E+00 |
| A4 | 0.000000E+00 | 0.000000E+00 | 0.000000E+00 | 0.000000E+00 | 0.000000E+00 | 0.000000E+00 | 0.000000E+00 |
| A6 | 0.000000E+00 | 0.000000E+00 | 0.000000E+00 | 0.000000E+00 | 0.000000E+00 | 0.000000E+00 | 0.000000E+00 |
| A8 | 0.000000E+00 | 0.000000E+00 | 0.000000E+00 | 0.000000E+00 | 0.000000E+00 | 0.000000E+00 | 0.000000E+00 |
| A10 | 0.000000E+00 | 0.000000E+00 | 0.000000E+00 | 0.000000E+00 | 0.000000E+00 | 0.000000E+00 | 0.000000E+00 |
| A12 | 0.000000E+00 | 0.000000E+00 | 0.000000E+00 | 0.000000E+00 | 0.000000E+00 | 0.000000E+00 | 0.000000E+00 |

TABLE 4-continued

Coefficients of the aspheric surfaces

| | Surface | | | | | | |
|---|---|---|---|---|---|---|---|
| | 9 | 10 | 11 | 12 | 13 | 14 | 15 |
| k | 0.000000E+00 | 0.000000E+00 | 0.000000E+00 | 0.000000E+00 | 0.000000E+00 | 0.000000E+00 | 0.000000E+00 |
| A4 | 0.000000E+00 | 0.000000E+00 | 0.000000E+00 | 0.000000E+00 | 0.000000E+00 | 0.000000E+00 | 0.000000E+00 |
| A6 | 0.000000E+00 | 0.000000E+00 | 0.000000E+00 | 0.000000E+00 | 0.000000E+00 | 0.000000E+00 | 0.000000E+00 |
| A8 | 0.000000E+00 | 0.000000E+00 | 0.000000E+00 | 0.000000E+00 | 0.000000E+00 | 0.000000E+00 | 0.000000E+00 |
| A10 | 0.000000E+00 | 0.000000E+00 | 0.000000E+00 | 0.000000E+00 | 0.000000E+00 | 0.000000E+00 | 0.000000E+00 |
| A12 | 0.000000E+00 | 0.000000E+00 | 0.000000E+00 | 0.000000E+00 | 0.000000E+00 | 0.000000E+00 | 0.000000E+00 |

An equation of the aspheric surfaces of the second optical embodiment is the same as that of the first optical embodiment, and the definitions are the same as well.

The exact parameters of the second optical embodiment based on Table 3 and Table 4 are listed in the following table:

| Second optical embodiment (Reference wavelength: 555 nm) | | | | | |
|---|---|---|---|---|---|
| |f/f1| | |f/f2| | |f/f3| | |f/f4| | |f/f5| | |f/f6| |
| 0.3764 | 0.0478 | 0.1081 | 0.2458 | 0.2354 | 0.6208 |
| |f/f7| | Σ PPR | Σ NPR | Σ PPR/|Σ NPR| | IN12/f | IN67/f |
| 0.3495 | 1.3510 | 0.6327 | 2.1352 | 2.8858 | 0.0451 |
| |f1/f2| | |f2/f3| | (TP1 + IN12)/TP2 | | (TP7 + IN67)/TP6 | |
| 0.1271 | 2.2599 | 3.7428 | | 1.0296 | |
| HOS | InTL | HOS/HOI | InS/HOS | ODT % | TDT % |
| 81.6178 | 70.9539 | 13.6030 | 0.3451 | −113.2790 | 84.4806 |
| HVT11 | HVT12 | HVT21 | HVT22 | HVT31 | HVT32 |
| 0.0000 | 0.0000 | 0.0000 | 0.0000 | 0.0000 | 0.0000 |
| HVT61 | HVT62 | HVT71 | HVT72 | HVT72/HOI | HVT72/HOS |
| 0.0000 | 0.0000 | 0.0000 | 0.0000 | 0.0000 | 0.0000 |
| PhiA | PhiC | PhiD | TH1 | TH2 | HOI |
| 11.962 mm | 12.362 mm | 12.862 mm | 0.25 mm | 0.2 mm | 6 mm |
| PhiA/PhiD | TH1 + TH2 | (TH1 + TH2)/HOI | (TH1 + TH2)/HOS | 2(TH1 + TH2)/PhiA | InTL/HOS |
| 0.9676 | 0.45 mm | 0.075 | 0.0055 | 0.0752 | 0.8693 |
| PSTA | PLTA | NSTA | NLTA | SSTA | SLTA |
| 0.060 mm | −0.005 mm | 0.016 mm | 0.006 mm | 0.020 mm | −0.008 mm |

The figures related to the profile curve lengths obtained based on Table 3 and Table 4 are listed in the following table:

| Second optical embodiment (Reference wavelength: 555 nm) | | | | | | |
|---|---|---|---|---|---|---|
| ARE | 1/2(HEP) | ARE value | ARE − 1/2(HEP) | 2(ARE/HEP) % | TP | ARE/TP (%) |
| 11 | 1.082 | 1.081 | −0.00075 | 99.93% | 4.977 | 21.72% |
| 12 | 1.082 | 1.083 | 0.00149 | 100.14% | 4.977 | 21.77% |
| 21 | 1.082 | 1.082 | 0.00011 | 100.01% | 5.000 | 21.64% |
| 22 | 1.082 | 1.082 | −0.00034 | 99.97% | 5.000 | 21.63% |
| 31 | 1.082 | 1.081 | −0.00084 | 99.92% | 5.000 | 21.62% |
| 32 | 1.082 | 1.081 | −0.00075 | 99.93% | 5.000 | 21.62% |
| 41 | 1.082 | 1.081 | −0.00059 | 99.95% | 4.095 | 26.41% |
| 42 | 1.082 | 1.081 | −0.00067 | 99.94% | 4.095 | 26.40% |
| 51 | 1.082 | 1.082 | −0.00021 | 99.98% | 1.539 | 70.28% |
| 52 | 1.082 | 1.081 | −0.00069 | 99.94% | 1.539 | 70.25% |
| 61 | 1.082 | 1.082 | −0.00021 | 99.98% | 5.000 | 21.63% |
| 62 | 1.082 | 1.082 | 0.00005 | 100.00% | 5.000 | 21.64% |
| 71 | 1.082 | 1.082 | −0.00003 | 100.00% | 4.933 | 21.93% |
| 72 | 1.082 | 1.083 | 0.00083 | 100.08% | 4.933 | 21.95% |
| ARS | EHD | ARS value | ARS − EHD | (ARS/EHD) % | TP | ARS/TP (%) |
| 11 | 20.767 | 21.486 | 0.719 | 103.46% | 4.977 | 431.68% |
| 12 | 9.412 | 13.474 | 4.062 | 143.16% | 4.977 | 270.71% |
| 21 | 8.636 | 9.212 | 0.577 | 106.68% | 5.000 | 184.25% |
| 22 | 9.838 | 10.264 | 0.426 | 104.33% | 5.000 | 205.27% |
| 31 | 8.770 | 8.772 | 0.003 | 100.03% | 5.000 | 175.45% |
| 32 | 8.511 | 8.558 | 0.047 | 100.55% | 5.000 | 171.16% |
| 41 | 4.600 | 4.619 | 0.019 | 100.42% | 4.095 | 112.80% |
| 42 | 4.965 | 4.981 | 0.016 | 100.32% | 4.095 | 121.64% |
| 51 | 5.075 | 5.143 | 0.067 | 101.33% | 1.539 | 334.15% |
| 52 | 5.047 | 5.062 | 0.015 | 100.30% | 1.539 | 328.89% |
| 61 | 5.011 | 5.075 | 0.064 | 101.28% | 5.000 | 101.50% |
| 62 | 5.373 | 5.489 | 0.116 | 102.16% | 5.000 | 109.79% |
| 71 | 5.513 | 5.625 | 0.112 | 102.04% | 4.933 | 114.03% |
| 72 | 5.981 | 6.307 | 0.326 | 105.44% | 4.933 | 127.84% |

The results of the equations of the second optical embodiment based on Table 3 and Table 4 are listed in the following table:

| Values related to the inflection points of the second optical embodiment (Reference wavelength: 555 nm) | | | | | | | |
|---|---|---|---|---|---|---|---|
| HIF111 | 0 | HIF111/HOI | 0 | SGI111 | 0 | |SGI111|/ (|SGI111| + TP1) | 0 |

Third Optical Embodiment

Figure 4A:
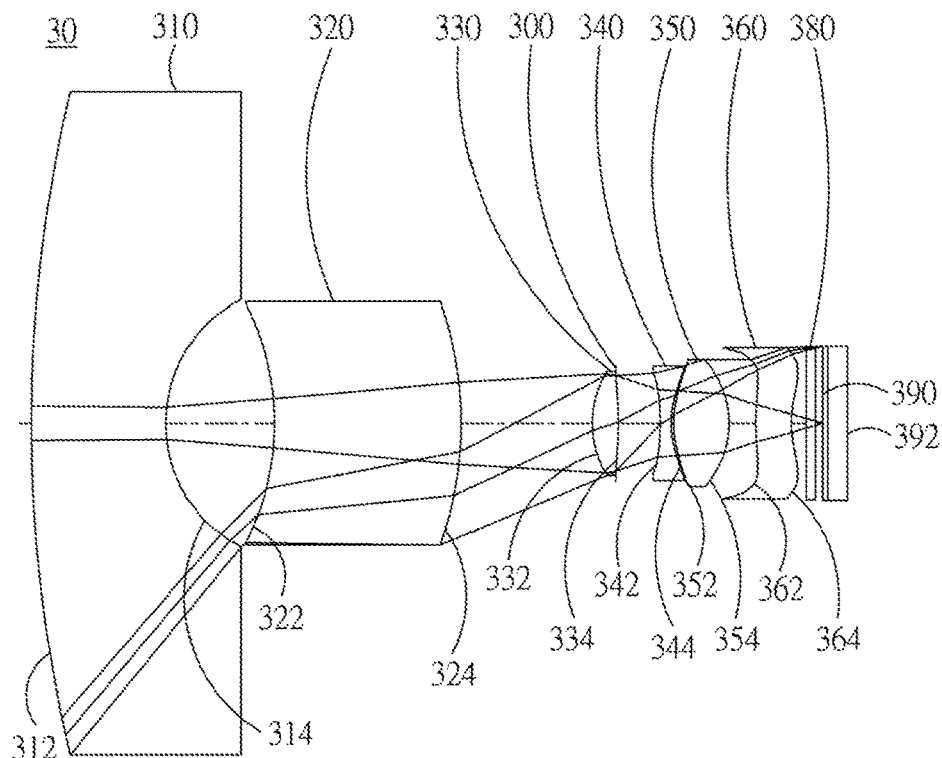
FIG. 4A is a schematic diagram of a third optical embodiment of the present invention.
Figure 4B:
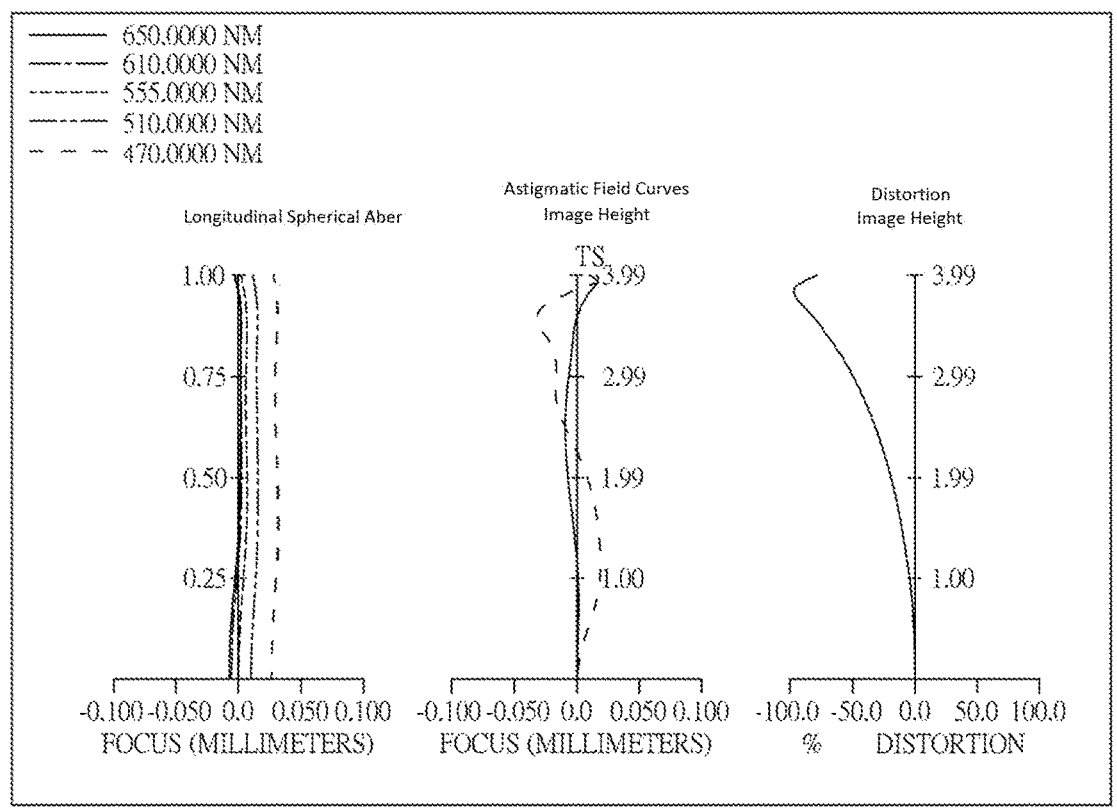
FIG. 4B shows curve diagrams of longitudinal spherical aberration, astigmatic field, and optical distortion of the optical image capturing module in the order from left to right of the third optical embodiment of the present application.

As shown in FIG. 4A and FIG. 4B, an optical image capturing module of the third optical embodiment of the present invention includes, along an optical axis from an object side to an image side, a first lens 310, a second lens 320, a third lens 330, an aperture 300, a fourth lens 340, a fifth lens 350, a sixth lens 360, a seventh lens 370, an IR-cut filter 380, an image plane 390, and an image sensor 392.

The first lens 310 has negative refractive power and is made of glass. An object-side surface 312 thereof, which faces the object side, is a convex spherical surface, and an image-side surface 314 thereof, which faces the image side, is a concave spherical surface.

The second lens 320 has negative refractive power and is made of glass. An object-side surface 322 thereof, which faces the object side, is a concave spherical surface, and an image-side surface 324 thereof, which faces the image side, is a convex spherical surface.

The third lens 330 has positive refractive power and is made of plastic. An object-side surface 332 thereof, which faces the object side, is a convex aspheric surface, and an image-side surface 334 thereof, which faces the image side, is a convex aspheric surface. The image-side surface 334 has an inflection point.

The fourth lens 340 has negative refractive power and is made of plastic. An object-side surface 342, which faces the object side, is a concave aspheric surface, and an image-side surface 344, which faces the image side, is a concave aspheric surface. The image-side surface 344 has an inflection point.

The fifth lens 350 has positive refractive power and is made of plastic. An object-side surface 352, which faces the object side, is a convex aspheric surface, and an image-side surface 354, which faces the image side, is a convex aspheric surface.

The sixth lens 360 has negative refractive power and is made of plastic. An object-side surface 362, which faces the object side, is a convex aspheric surface, and an image-side surface 364, which faces the image side, is a concave aspheric surface. The object-side surface 362 has an inflection point, and the image-side surface 364 has an inflection point. It may help to shorten the back focal length to keep small in size. Whereby, the incident angle of each view field entering the sixth lens 360 could be effectively adjusted to improve aberration.

The IR-cut filter 380 is made of glass and is disposed between the sixth lens 360 and the image plane 390. The IR-cut filter 390 gives no contribution to the focal length of the optical image capturing module.

The parameters of the lenses of the third optical embodiment are listed in Table 5 and Table 6.

TABLE 5 f = 2.808 mm; f/HEP = 1.6; HAF = 100 deg

| Surface | | Radius of curvature (mm) | Thickness (mm) | Material | Refractive index | Abbe number | Focal length (mm) |
|---|---|---|---|---|---|---|---|
| 0 | Object | 1E+18 | 1E+18 | | | | |
| 1 | 1st lens | 71.398124 | 7.214 | glass | 1.702 | 41.15 | −11.765 |
| 2 | | 7.117272355 | 5.788 | | | | |
| 3 | 2nd lens | −13.29213699 | 10.000 | glass | 2.003 | 19.32 | −4537.460 |
| 4 | | −18.37509887 | 7.005 | | | | |
| 5 | 3rd lens | 5.039114804 | 1.398 | plastic | 1.514 | 56.80 | 7.553 |
| 6 | | −15.53136631 | −0.140 | | | | |
| 7 | Aperture | 1E+18 | 2.378 | | | | |
| 8 | 4th lens | −18.68613609 | 0.577 | plastic | 1.661 | 20.40 | −4.978 |
| 9 | | 4.086545927 | 0.141 | | | | |
| 10 | 5th lens | 4.927609282 | 2.974 | plastic | 1.565 | 58.00 | 4.709 |
| 11 | | −4.551946605 | 1.389 | | | | |
| 12 | 6th lens | 9.184876531 | 1.916 | plastic | 1.514 | 56.80 | −23.405 |
| 13 | | 4.845500046 | 0.800 | | | | |
| 14 | Infrared rays filter | 1E+18 | 0.500 | BK_7 | 1.517 | 64.13 | |
| 15 | | 1E+18 | 0.371 | | | | |
| 16 | Image plane | 1E+18 | 0.005 | | | | |

Reference wavelength (d-line): 555 nm; the position of blocking light: none.

TABLE 6

Coefficients of the aspheric surfaces

| Surface | 1 | 2 | 3 | 4 | 5 | 6 | 8 |
|---|---|---|---|---|---|---|---|
| k | 0.000000E+00 | 0.000000E+00 | 0.000000E+00 | 0.000000E+00 | 1.318519E−01 | 3.120384E+00 | −1.494442E+01 |
| A4 | 0.000000E+00 | 0.000000E+00 | 0.000000E+00 | 0.000000E+00 | 6.405246E−05 | 2.103942E−03 | −1.598286E−03 |
| A6 | 0.000000E+00 | 0.000000E+00 | 0.000000E+00 | 0.000000E+00 | 2.278341E−05 | −1.050629E−04 | −9.177115E−04 |
| A8 | 0.000000E+00 | 0.000000E+00 | 0.000000E+00 | 0.000000E+00 | −3.672908E−06 | 6.168906E−06 | 1.011405E−04 |
| A10 | 0.000000E+00 | 0.000000E+00 | 0.000000E+00 | 0.000000E+00 | 3.748457E−07 | −1.224682E−07 | −4.919835E−06 |

| Surface | 9 | 10 | 11 | 12 | 13 |
|---|---|---|---|---|---|
| k | 2.744228E−02 | −7.864013E+00 | −2.263702E+00 | −4.206923E+01 | −7.030803E+00 |
| A4 | −7.291825E−03 | 1.405243E−04 | −3.919567E−03 | −1.679499E−03 | −2.640099E−03 |
| A6 | 9.730714E−05 | 1.837602E−04 | 2.683449E−04 | −3.518520E−04 | −4.507651E−05 |
| A8 | 1.101816E−06 | −2.173368E−05 | −1.229452E−05 | 5.047353E−05 | −2.600391E−05 |
| A10 | −6.849076E−07 | 7.328496E−07 | 4.222621E−07 | −3.851055E−06 | 1.161811E−06 |

An equation of the aspheric surfaces of the third optical embodiment is the same as that of the first optical embodiment, and the definitions are the same as well.

The exact parameters of the third optical embodiment based on Table 5 and Table 6 are listed in the following table:

| Third optical embodiment (Reference wavelength: 555 nm) | | | | | |
|---|---|---|---|---|---|
| |f/f1| | |f/f2| | |f/f3| | |f/f4| | |f/f5| | |f/f6| |
| 0.23865 | 0.00062 | 0.37172 | 0.56396 | 0.59621 | 0.11996 |
| Σ PPR | Σ NPR | Σ PPR/|Σ NPR| | IN12/f | IN56/f | TP4/(IN34 + TP4 + IN45) |
| 1.77054 | 0.12058 | 14.68400 | 2.06169 | 0.49464 | 0.19512 |
| |f1/f2| | |f2/f3| | (TP1 + IN12)/TP2 | | (TP6 + IN56)/TP5 | |
| 0.00259 | 600.74778 | 1.30023 | | 1.11131 | |
| HOS | InTL | HOS/HOI | InS/HOS | ODT % | TDT % |
| 42.31580 | 40.63970 | 10.57895 | 0.26115 | −122.32700 | 93.33510 |
| HVT51 | HVT52 | HVT61 | HVT62 | HVT62/HOI | HVT62/HOS |
| 0 | 0 | 2.22299 | 2.60561 | 0.65140 | 0.06158 |
| TP2/TP3 | TP3/TP4 | InRS61 | InRS62 | |InRS61|/TP6 | |InRS62|/TP6 |
| 7.15374 | 2.42321 | −0.20807 | −0.24978 | 0.10861 | 0.13038 |
| PhiA | PhiC | PhiD | TH1 | TH2 | HOI |
| 6.150 mm | 6.41 mm | 6.71 mm | 0.15 mm | 0.13 mm | 4 mm |
| PhiA/PhiD | TH1 + TH2 | (TH1 + TH2)/HOI | (TH1 + TH2)/HOS | 2(TH1 + TH2)/PhiA | InTL/HOS |
| 0.9165 | 0.28 mm | 0.07 | 0.0066 | 0.0911 | 0.9604 |
| PSTA | PLTA | NSTA | NLTA | SSTA | SLTA |
| 0.014 mm | 0.002 mm | −0.003 mm | −0.002 mm | 0.011 mm | −0.001 mm |

The figures related to the profile curve lengths obtained based on Table 5 and Table 6 are listed in the following table:

| Third optical embodiment (Reference wavelength: 555 nm) | | | | | | |
|---|---|---|---|---|---|---|
| ARE | ½(HEP) | ARE value | ARE-½(HEP) | 2(ARE/HEP) % | TP | ARE/TP (%) |
| 11 | 0.877 | 0.877 | −0.00036 | 99.96% | 7.214 | 12.16% |
| 12 | 0.877 | 0.879 | 0.00186 | 100.21% | 7.214 | 12.19% |
| 21 | 0.877 | 0.878 | 0.00026 | 100.03% | 10.000 | 8.78% |
| 22 | 0.877 | 0.877 | −0.00004 | 100.00% | 10.000 | 8.77% |
| 31 | 0.877 | 0.882 | 0.00413 | 100.47% | 1.398 | 63.06% |
| 32 | 0.877 | 0.877 | 0.00004 | 100.00% | 1.398 | 62.77% |
| 41 | 0.877 | 0.877 | −0.00001 | 100.00% | 0.577 | 152.09% |
| 42 | 0.877 | 0.883 | 0.00579 | 100.66% | 0.577 | 153.10% |
| 51 | 0.877 | 0.881 | 0.00373 | 100.43% | 2.974 | 29.63% |
| 52 | 0.877 | 0.883 | 0.00521 | 100.59% | 2.974 | 29.68% |
| 61 | 0.877 | 0.878 | 0.00064 | 100.07% | 1.916 | 45.83% |
| 62 | 0.877 | 0.881 | 0.00368 | 100.42% | 1.916 | 45.99% |
| ARS | EHD | ARS value | ARS-EHD | (ARS/EHD)% | TP | ARS/TP (%) |
| 11 | 17.443 | 17.620 | 0.178 | 101.02% | 7.214 | 244.25% |
| 12 | 6.428 | 8.019 | 1.592 | 124.76% | 7.214 | 111.16% |
| 21 | 6.318 | 6.584 | 0.266 | 104.20% | 10.000 | 65.84% |
| 22 | 6.340 | 6.472 | 0.132 | 102.08% | 10.000 | 64.72% |
| 31 | 2.699 | 2.857 | 0.158 | 105.84% | 1.398 | 204.38% |
| 32 | 2.476 | 2.481 | 0.005 | 100.18% | 1.398 | 177.46% |
| 41 | 2.601 | 2.652 | 0.051 | 101.96% | 0.577 | 459.78% |
| 42 | 3.006 | 3.119 | 0.113 | 103.75% | 0.577 | 540.61% |
| 51 | 3.075 | 3.171 | 0.096 | 103.13% | 2.974 | 106.65% |
| 52 | 3.317 | 3.624 | 0.307 | 109.24% | 2.974 | 121.88% |
| 61 | 3.331 | 3.427 | 0.095 | 102.86% | 1.916 | 178.88% |
| 62 | 3.944 | 4.160 | 0.215 | 105.46% | 1.916 | 217.14% |

The results of the equations of the third optical embodiment based on Table 5 and Table 6 are listed in the following table:

| Values related to the inflection points of the third optical embodiment (Reference wavelength: 555 nm) | | | | | | |
|---|---|---|---|---|---|---|
| HIF321 | 2.0367 | HIF321/HOI | 0.5092 | SGI321 | −0.1056 |SGI321|/(|SGI321| + TP3) | 0.0702 |
| HIF421 | 2.4635 | HIF421/HOI | 0.6159 | SGI421 | 0.5780 |SGI421|/(|SGI421| + TP4) | 0.5005 |
| HIF611 | 1.2364 | HIF611/HOI | 0.3091 | SGI611 | 0.0668 |SGI611|/(|SGI611| + TP6) | 0.0337 |
| HIF621 | 1.5488 | HIF621/HOI | 0.3872 | SGI621 | 0.2014 |SGI621|/(|SGI621| + TP6) | 0.0951 |

Fourth Optical Embodiment

Figure 5A:
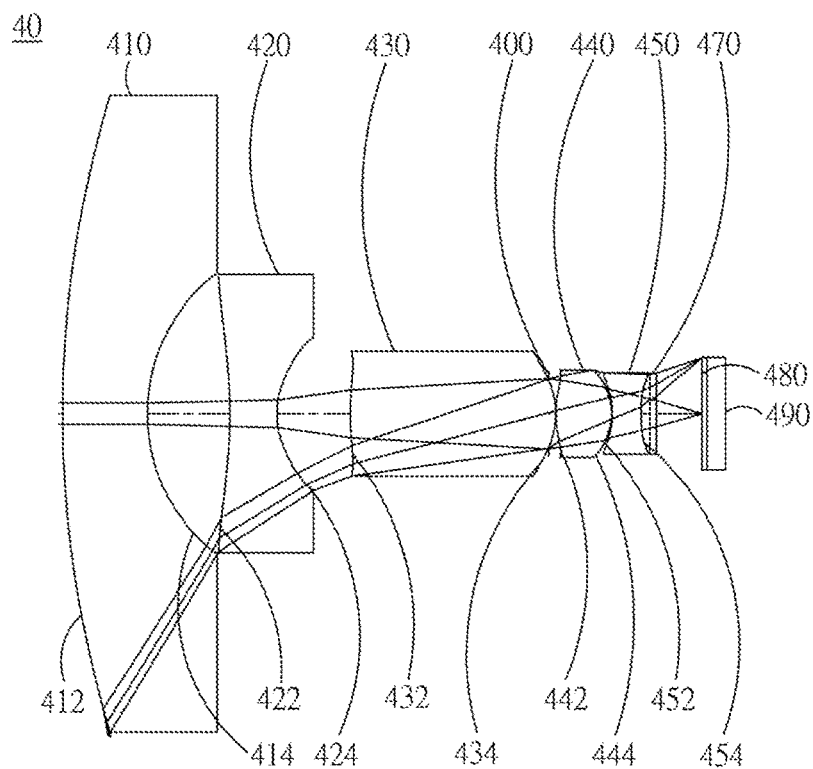
FIG. 5A is a schematic diagram of a fourth optical embodiment of the present invention.
Figure 5B:
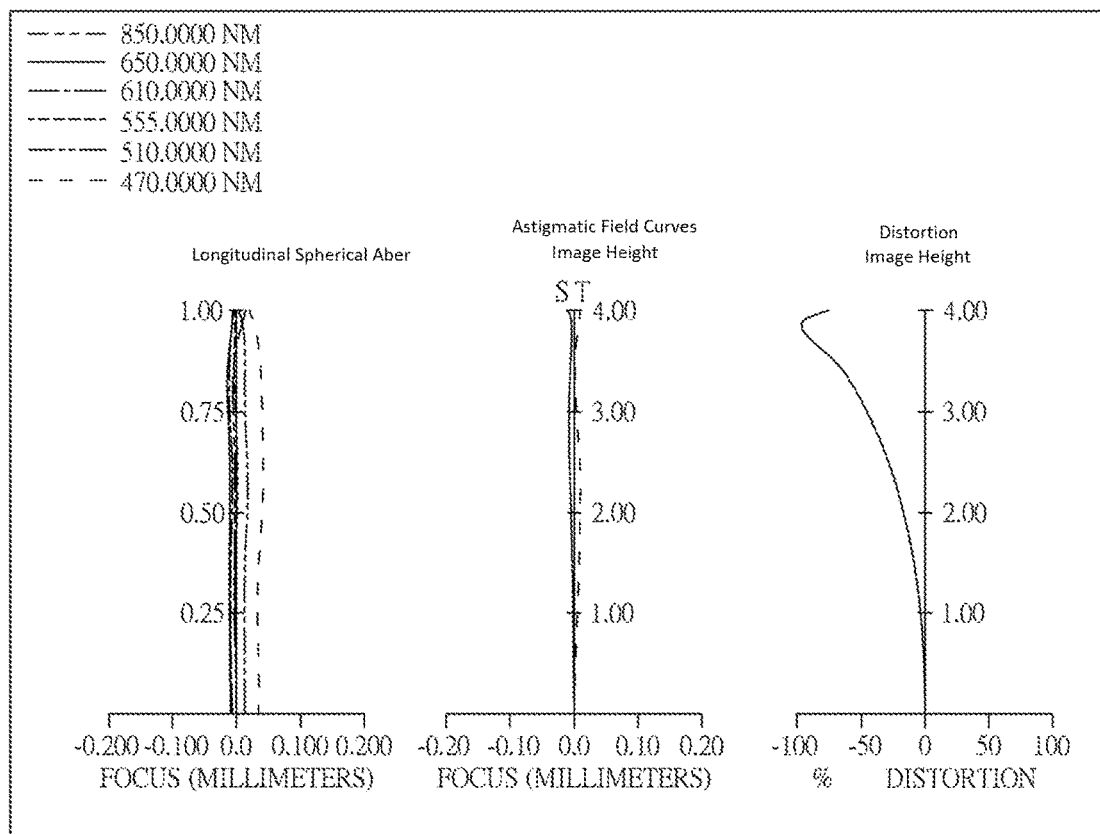
FIG. 5B shows curve diagrams of longitudinal spherical aberration, astigmatic field, and optical distortion of the optical image capturing module in the order from left to right of the fourth optical embodiment of the present application.

As shown in FIG. 5A and FIG. 5B, an optical image capturing module 40 of the fourth optical embodiment of the present invention includes, along an optical axis from an object side to an image side, a first lens 410, a second lens 420, an aperture 400, a third lens 430, a fourth lens 440, a fifth lens 450, an IR-cut filter 480, an image plane 490, and an image sensor 492.

The first lens 410 has negative refractive power and is made of glass. An object-side surface 412 thereof, which faces the object side, is a convex spherical surface, and an image-side surface 414 thereof, which faces the image side, is a concave spherical surface.

The second lens 420 has negative refractive power and is made of plastic. An object-side surface 422 thereof, which faces the object side, is a concave aspheric surface, and an image-side surface 424 thereof, which faces the image side, is a concave aspheric surface. The object-side surface 422 has an inflection point.

The third lens 430 has positive refractive power and is made of plastic. An object-side surface 432 thereof, which faces the object side, is a convex aspheric surface, and an image-side surface 434 thereof, which faces the image side, is a convex aspheric surface. The object-side surface 432 has an inflection point.

The fourth lens 440 has positive refractive power and is made of plastic. An object-side surface 442, which faces the object side, is a convex aspheric surface, and an image-side surface 444, which faces the image side, is a convex aspheric surface. The object-side surface 442 has an inflection point.

The fifth lens 450 has negative refractive power and is made of plastic. An object-side surface 452, which faces the object side, is a concave aspheric surface, and an image-side surface 454, which faces the image side, is a concave aspheric surface. The object-side surface 452 has two inflection points. It may help to shorten the back focal length to keep small in size.

The IR-cut filter 480 is made of glass and is disposed between the fifth lens 450 and the image plane 490. The IR-cut filter 480 gives no contribution to the focal length of the optical image capturing module.

The parameters of the lenses of the fourth optical embodiment are listed in Table 7 and Table 8.

TABLE 7 f = 2.7883 mm; f/HEP = 1.8; HAF = 101 deg

| Surface | | Radius of curvature (mm) | Thickness (mm) | Material | Refractive index | Abbe number | Focal length (mm) |
|---|---|---|---|---|---|---|---|
| 0 | Object | 1E+18 | 1E+18 | | | | |
| 1 | 1$^{st}$ lens | 76.84219 | 6.117399 | glass | 1.497 | 81.61 | −31.322 |
| 2 | | 12.62555 | 5.924382 | | | | |
| 3 | 2$^{nd}$ lens | −37.0327 | 3.429817 | plastic | 1.565 | 54.5 | −8.70843 |
| 4 | | 5.88556 | 5.305191 | | | | |
| 5 | 3$^{rd}$ lens | 17.99395 | 14.79391 | | | | |
| 6 | | −5.76903 | −0.4855 | plastic | 1.565 | 58 | 9.94787 |
| 7 | Aperture | 1E+18 | 0.535498 | | | | |
| 8 | 4$^{th}$ lens | 8.19404 | 4.011739 | plastic | 1.565 | 58 | 5.24898 |
| 9 | | −3.84363 | 0.050366 | | | | |
| 10 | 5$^{th}$ lens | −4.34991 | 2.088275 | plastic | 1.661 | 20.4 | −4.97515 |
| 11 | | 16.6609 | 0.6 | | | | |
| 12 | Infrared rays filter | 1E+18 | 0.5 | BK_7 | 1.517 | 64.13 | |
| 13 | | 1E+18 | 3.254927 | | | | |
| 14 | Image plane | 1E+18 | −0.00013 | | | | |

Reference wavelength (d-line): 555 nm.

TABLE 8

Coefficients of the aspheric surfaces

| Surface | 1 | 2 | 3 | 4 | 5 | 6 | 8 |
|---|---|---|---|---|---|---|---|
| k | 0.000000E+00 | 0.000000E+00 | 0.131249 | −0.069541 | −0.324555 | 0.009216 | −0.292346 |
| A4 | 0.000000E+00 | 0.000000E+00 | 3.99823E−05 | −8.55712E−04 | −9.07093E−04 | 8.80963E−04 | −1.02138E−03 |
| A6 | 0.000000E+00 | 0.000000E+00 | 9.03636E−08 | −1.96175E−06 | −1.02465E−05 | 3.14497E−05 | −1.18559E−04 |
| A8 | 0.000000E+00 | 0.000000E+00 | 1.91025E−09 | −1.39344E−08 | −8.18157E−08 | −3.15863E−06 | 1.34404E−05 |
| A10 | 0.000000E+00 | 0.000000E+00 | −1.18567E−11 | −4.17090E−09 | −2.42621E−09 | 1.44613E−07 | −2.80681E−06 |
| A12 | 0.000000E+00 | 0.000000E+00 | 0.000000E+00 | 0.000000E+00 | 0.000000E+00 | 0.000000E+00 | 0.000000E+00 |

| Surface | 9 | 10 | 11 |
|---|---|---|---|
| k | −0.18604 | −6.17195 | 27.541383 |
| A4 | 4.33629E−03 | 1.58379E−03 | 7.56932E−03 |
| A6 | −2.91588E−04 | −1.81549E−04 | −7.83858E−04 |
| A8 | 9.11419E−06 | −1.18213E−05 | 4.79120E−05 |
| A10 | 1.28365E−07 | 1.92716E−06 | −1.73591E−06 |
| A12 | 0.000000E+00 | 0.000000E+00 | 0.000000E+00 |

An equation of the aspheric surfaces of the fourth optical embodiment is the same as that of the first optical embodiment, and the definitions are the same as well.

The exact parameters of the fourth optical embodiment based on Table 7 and Table 8 are listed in the following table:

| Fourth optical embodiment (Reference wavelength: 555 nm) | | | | | |
|---|---|---|---|---|---|
| |f/f1| | |f/f2| | |f/f3| | |f/f4| | |f/f5| | |f1/f2| |
| 0.08902 | 0.32019 | 0.28029 | 0.53121 | 0.56045 | 3.59674 |
| Σ PPR | Σ NPR | Σ PPR/\|Σ NPR\| | IN12/f | IN45/f | \|f2/f3\| |
| 1.4118 | 0.3693 | 3.8229 | 2.1247 | 0.0181 | 0.8754 |
| TP3/(IN23 + TP3 + IN34) | | (TP1 + IN12)/TP2 | | (TP5 + IN45)/TP4 | |
| 0.73422 | | 3.51091 | | 0.53309 | |
| HOS | InTL | HOS/HOI | InS/HOS | ODT % | TDT % |
| 46.12590 | 41.77110 | 11.53148 | 0.23936 | −125.266 | 99.1671 |
| HVT41 | HVT42 | HVT51 | HVT52 | HVT52/HOI | HVT52/HOS |
| 0.00000 | 0.00000 | 0.00000 | 0.00000 | 0.00000 | 0.00000 |
| TP2/TP3 | TP3/TP4 | InRS51 | InRS52 | \|InRS51\|/TP5 | \|InRS52\|/TP5 |
| 0.23184 | 3.68765 | −0.679265 | 0.5369 | 0.32528 | 0.25710 |
| PhiA | PhiC | PhiD | TH1 | TH2 | HOI |
| 5.598 mm | 5.858 mm | 6.118 mm | 0.13 mm | 0.13 mm | 4 mm |
| PhiA/PhiD | TH1 + TH2 | (TH1 + TH2)/HOI | (TH1 + TH2)/HOS | 2(TH1 + TH2)/PhiA | InTL/HOS |
| 0.9150 | 0.26 mm | 0.065 | 0.0056 | 0.0929 | 0.9056 |
| PSTA | PLTA | NSTA | NLTA | SSTA | SLTA |
| −0.011 mm | 0.005 mm | −0.010 mm | −0.003 mm | 0.005 mm | −0.00026 mm |

The figures related to the profile curve lengths obtained based on Table 7 and Table 8 are listed in the following table:

| Fourth optical embodiment (Reference wavelength: 555 nm) | | | | | | |
|---|---|---|---|---|---|---|
| ARE | ½(HEP) | ARE value | ARE-½(HEP) | 2(ARE/HEP) % | TP | ARE/TP (%) |
| 11 | 0.775 | 0.774 | −0.00052 | 99.93% | 6.117 | 12.65% |
| 12 | 0.775 | 0.774 | −0.00005 | 99.99% | 6.117 | 12.66% |
| 21 | 0.775 | 0.774 | −0.00048 | 99.94% | 3.430 | 22.57% |
| 22 | 0.775 | 0.776 | 0.00168 | 100.22% | 3.430 | 22.63% |
| 31 | 0.775 | 0.774 | −0.00031 | 99.96% | 14.794 | 5.23% |
| 32 | 0.775 | 0.776 | 0.00177 | 100.23% | 14.794 | 5.25% |
| 41 | 0.775 | 0.775 | 0.00059 | 100.08% | 4.012 | 19.32% |
| 42 | 0.775 | 0.779 | 0.00453 | 100.59% | 4.012 | 19.42% |
| 51 | 0.775 | 0.778 | 0.00311 | 100.40% | 2.088 | 37.24% |
| 52 | 0.775 | 0.774 | −0.00014 | 99.98% | 2.088 | 37.08% |
| ARS | EHD | ARS value | ARS-EHD | (ARS/EHD)% | TP | ARS/TP (%) |
| 11 | 23.038 | 23.397 | 0.359 | 101.56% | 6.117 | 382.46% |
| 12 | 10.140 | 11.772 | 1.632 | 116.10% | 6.117 | 192.44% |
| 21 | 10.138 | 10.178 | 0.039 | 100.39% | 3.430 | 296.74% |
| 22 | 5.537 | 6.337 | 0.800 | 114.44% | 3.430 | 184.76% |
| 31 | 4.490 | 4.502 | 0.012 | 100.27% | 14.794 | 30.43% |
| 32 | 2.544 | 2.620 | 0.076 | 102.97% | 14.794 | 17.71% |
| 41 | 2.735 | 2.759 | 0.024 | 100.89% | 4.012 | 68.77% |
| 42 | 3.123 | 3.449 | 0.326 | 110.43% | 4.012 | 85.97% |
| 51 | 2.934 | 3.023 | 0.089 | 103.04% | 2.088 | 144.74% |
| 52 | 2.799 | 2.883 | 0.084 | 103.00% | 2.088 | 138.08% |

The results of the equations of the fourth optical embodiment based on Table 7 and Table 8 are listed in the following table:

| Values related to the inflection points of the fourth optical embodiment (Reference wavelength: 555 nm) | | | | | | |
|---|---|---|---|---|---|---|
| HIF211 | 6.3902 | HIF211/HOI | 1.5976 | SGI211 | −0.4793 | \|SGI211\|/(\|SGI211\| + TP2) | 0.1226 |
| HIF311 | 2.1324 | HIF311/HOI | 0.5331 | SGI311 | 0.1069 | \|SGI311\|/(\|SGI311\| + TP3) | 0.0072 |
| HIF411 | 2.0278 | HIF411/HOI | 0.5070 | SGI411 | 0.2287 | \|SGI411\|/(\|SGI411\| + TP4) | 0.0539 |
| HIF511 | 2.6253 | HIF511/HOI | 0.6563 | SGI511 | −0.5681 | \|SGI511\|/(\|SGI511\| + TP5) | 0.2139 |
| HIF512 | 2.1521 | HIF512/HOI | 0.5380 | SGI512 | −0.8314 | \|SGI512\|/(\|SGI512\| + TP5) | 0.2848 |

Fifth Optical Embodiment

Figure 6A:
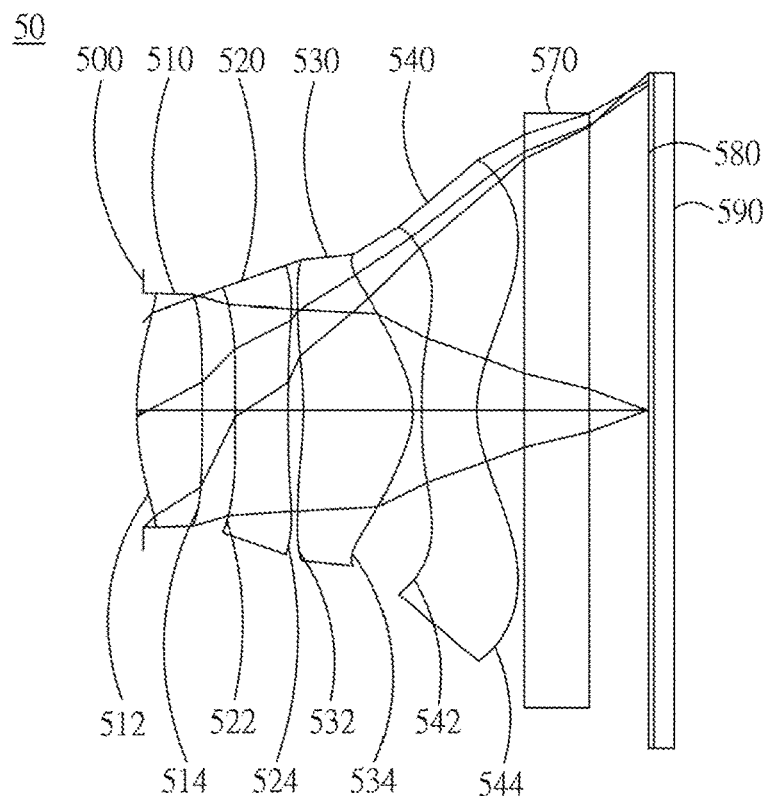
FIG. 6A is a schematic diagram of a fifth optical embodiment of the present invention.
Figure 6B:
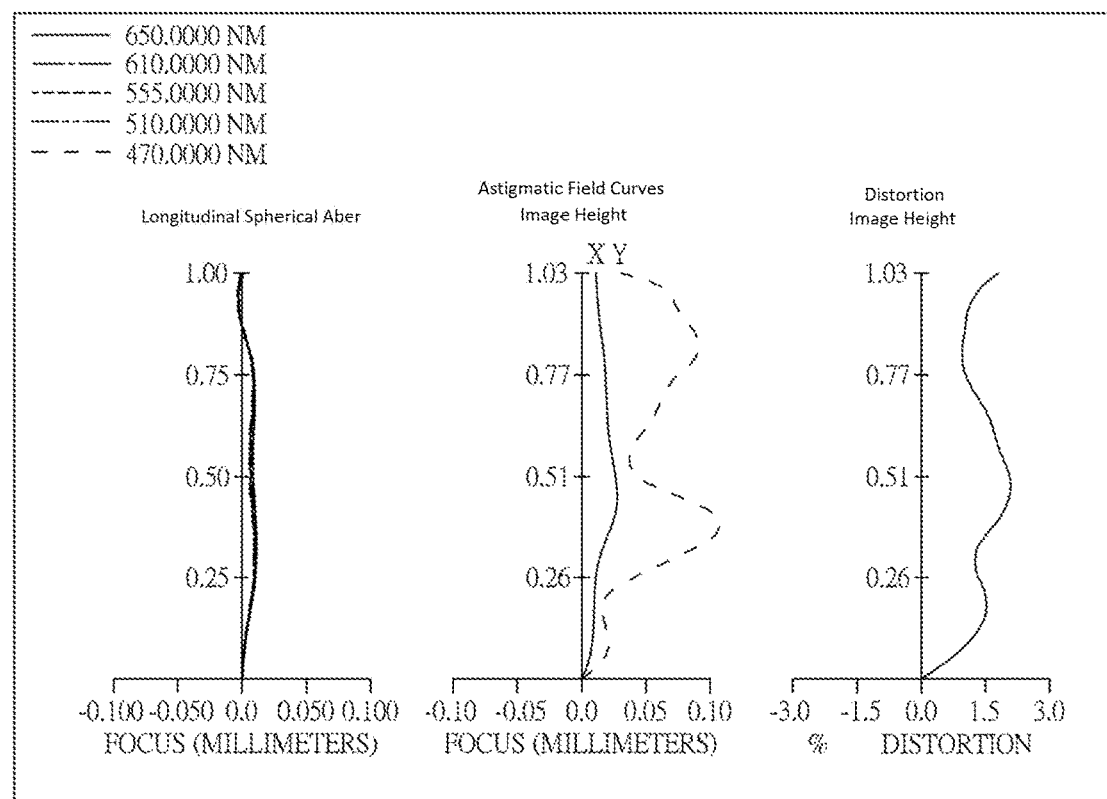
FIG. 6B shows curve diagrams of longitudinal spherical aberration, astigmatic field, and optical distortion of the optical image capturing module in the order from left to right of the fifth optical embodiment of the present application.

As shown in FIG. 6A and FIG. 6B, an optical image capturing module of the fifth optical embodiment of the present invention includes, along an optical axis from an object side to an image side, an aperture 500, a first lens 510, a second lens 520, a third lens 530, a fourth lens 540, an IR-cut filter 570, an image plane 580, and an image sensor 590.

The first lens 510 has positive refractive power and is made of plastic. An object-side surface 512, which faces the object side, is a convex aspheric surface, and an image-side surface 514, which faces the image side, is a convex aspheric surface. The object-side surface 512 has an inflection point.

The second lens 520 has negative refractive power and is made of plastic. An object-side surface 522 thereof, which faces the object side, is a convex aspheric surface, and an image-side surface 524 thereof, which faces the image side, is a concave aspheric surface. The object-side surface 522 has two inflection points, and the image-side surface 524 has an inflection point.

The third lens 530 has positive refractive power and is made of plastic. An object-side surface 532, which faces the object side, is a concave aspheric surface, and an image-side surface 534, which faces the image side, is a convex aspheric surface. The object-side surface 532 has three inflection points, and the image-side surface 534 has an inflection point.

The fourth lens 540 has negative refractive power and is made of plastic. An object-side surface 542, which faces the object side, is a concave aspheric surface, and an image-side surface 544, which faces the image side, is a concave aspheric surface. The object-side surface 542 has two inflection points, and the image-side surface 544 has an inflection point.

The IR-cut filter 570 is made of glass and is disposed between the fourth lens 540 and the image plane 580. The IR-cut filter 570 gives no contribution to the focal length of the optical image capturing module.

The parameters of the lenses of the fifth optical embodiment are listed in Table 9 and Table 10.

TABLE 9 f = 1.04102 mm; f/HEP = 1.4; HAF = 44.0346 deg

| Surface | | Radius of curvature (mm) | Thickness (mm) | Material | Refractive index | Abbe number | Focal length (mm) |
|---|---|---|---|---|---|---|---|
| 0 | Object | 1E+18 | 600 | | | | |
| 1 | Aperture | 1E+18 | −0.020 | | | | |
| 2 | 1$^{st}$ lens | 0.890166851 | 0.210 | plastic | 1.545 | 55.96 | 1.587 |
| 3 | | −29.11040115 | −0.010 | | | | |
| 4 | | 1E+18 | 0.116 | | | | |
| 5 | 2$^{nd}$ lens | 10.67765398 | 0.170 | plastic | 1.642 | 22.46 | −14.569 |
| 6 | | 4.977771922 | 0.049 | | | | |
| 7 | 3$^{rd}$ lens | −1.191436932 | 0.349 | plastic | 1.545 | 55.96 | 0.510 |
| 8 | | −0.248990674 | 0.030 | | | | |
| 9 | 4$^{th}$ lens | −38.08537212 | 0.176 | plastic | 1.642 | 22.46 | −0.569 |
| 10 | | 0.372574476 | 0.152 | | | | |
| 11 | | 1E+18 | 0.210 | BK_7 | 1.517 | 64.13 | 1E+18 |
| 12 | | 1E+18 | 0.185 | | | | 1E+18 |
| 13 | | 1E+18 | 0.005 | | | | 1E+18 |

Reference wavelength (d-line): 555 nm; the position of blocking light: he effective half diameter of the clear aperture of the fourth surface is 0.360 mm.

TABLE 10

Coefficients of the aspheric surfaces

| Surface | 2 | 3 | 5 | 6 | 7 | 8 |
|---|---|---|---|---|---|---|
| k | −1.106629E+00 | 2.994179E−07 | −7.788754E+01 | −3.440335E+01 | −8.522097E−01 | −4.735945E+00 |
| A4 | 8.291155E−01 | −6.401113E−01 | −4.958114E+00 | −1.875957E+00 | −4.878227E−01 | −2.490377E+00 |
| A6 | −2.398799E+01 | −1.265726E+01 | 1.299769E+02 | 8.568480E+01 | 1.291242E+02 | 1.524149E+02 |
| A8 | 1.825378E+02 | 8.457286E+01 | −2.736977E+03 | −1.279044E+03 | −1.979689E+03 | −4.841033E+03 |
| A10 | −6.211133E+02 | −2.157875E+02 | 2.908637E+04 | 8.661312E+03 | 1.456076E+04 | 8.053747E+04 |
| A12 | −4.719066E+02 | −6.203600E+02 | −1.499597E+05 | −2.875274E+04 | −5.975920E+04 | −7.936887E+05 |
| A14 | 0.000000E+00 | 0.000000E+00 | 2.992026E+05 | 3.764871E+04 | 1.351676E+05 | 4.811528E+06 |
| A16 | 0.000000E+00 | 0.000000E+00 | 0.000000E+00 | 0.000000E+00 | −1.329001E+05 | −1.762293E+07 |
| A18 | 0.000000E+00 | 0.000000E+00 | 0.000000E+00 | 0.000000E+00 | 0.000000E+00 | 3.579891E+07 |
| A20 | 0.000000E+00 | 0.000000E+00 | 0.000000E+00 | 0.000000E+00 | 0.000000E+00 | −3.094006E+07 |

| Surface | 9 | 10 |
|---|---|---|
| k | −2.277155E+01 | −8.039778E−01 |
| A4 | 1.672704E+01 | −7.613206E+00 |
| A6 | −3.260722E+02 | 3.374046E+01 |
| A8 | 3.373231E+03 | −1.368453E+02 |
| A10 | −2.177676E+04 | 4.049486E+02 |
| A12 | 8.951687E+04 | −9.711797E+02 |
| A14 | −2.363737E+05 | 1.942574E+03 |
| A16 | 3.983151E+05 | −2.876356E+03 |
| A18 | −4.090689E+05 | 2.562386E+03 |
| A20 | 2.056724E+05 | −9.943657E+02 |

An equation of the aspheric surfaces of the fifth optical embodiment is the same as that of the first optical embodiment, and the definitions are the same as well.

The exact parameters of the fifth optical embodiment based on Table 9 and Table 10 are listed in the following table:

| Fifth optical embodiment (Reference wavelength: 555 nm) | | | | | |
|---|---|---|---|---|---|
| InRS41 | InRS42 | HVT41 | HVT42 | ODT % | TDT % |
| −0.07431 | 0.00475 | 0.00000 | 0.53450 | 2.09403 | 0.84704 |
| \|f/f1\| | \|f/f2\| | \|f/f3\| | \|f/f4\| | \|f1/f2\| | \|f2/f3\| |
| 0.65616 | 0.07145 | 2.04129 | 1.83056 | 0.10890 | 28.56826 |
| Σ PPR | Σ NPR | Σ PPR/\|Σ NPR\| | Σ PP | Σ NP | f1/Σ PP |
| 2.11274 | 2.48672 | 0.84961 | −14.05932 | 1.01785 | 1.03627 |
| f4/Σ NP | IN12/f | IN23/f | IN34/f | TP3/f | TP4/f |
| 1.55872 | 0.10215 | 0.04697 | 0.02882 | 0.33567 | 0.16952 |
| InTL | HOS | HOS/HOI | InS/HOS | InTL/HOS | Σ TP/InTL |
| 1.09131 | 1.64329 | 1.59853 | 0.98783 | 0.66410 | 0.83025 |
| (TP1 + IN12)/TP2 | (TP4 + IN34)/TP3 | TP1/TP2 | TP3/TP4 | IN23/(TP2 + IN23 + TP3) | |
| 1.86168 | 0.59088 | 1.23615 | 1.98009 | 0.08604 | |
| \|InRS41\|/TP4 | \|InRS42\|/TP4 | HVT42/HOI | HVT42/HOS | InTL/HOS | |
| 0.4211 | 0.0269 | 0.5199 | 0.3253 | 0.6641 | |
| PhiA | PhiC | PhiD | TH1 | TH2 | HOI |
| 1.596 mm | 1.996 mm | 2.396 mm | 0.2 mm | 0.2 mm | 1.028 mm |
| PhiA/PhiD | TH1 + TH2 | (TH1 + TH2)/HOI | (TH1 + TH2)/HOS | 2(TH1 + TH2)/PhiA | |
| 0.7996 | 0.4 mm | 0.3891 | 0.2434 | 0.5013 | |
| PSTA | PLTA | NSTA | NLTA | SSTA | SLTA |
| −0.029 mm | −0.023 mm | −0.011 mm | −0.024 mm | 0.010 mm | 0.011 mm |

The results of the equations of the fifth optical embodiment based on Table 9 and Table 10 are listed in the following table:

| Values related to the inflection points of the fifth optical embodiment (Reference wavelength: 555 nm) | | | | | |
|---|---|---|---|---|---|
| HIF111 | 0.28454 | HIF111/HOI 0.27679 | SGI111 | 0.04361 | \|SGI111\|/(\|SGI111\| + TP1) 0.17184 |
| HIF211 | 0.04198 | HIF211/HOI 0.04083 | SGI211 | 0.00007 | \|SGI211\|/(\|SGI211\| + TP2) 0.00040 |
| HIF212 | 0.37903 | HIF212/HOI 0.36871 | SGI212 | −0.03682 | \|SGI212\|/(\|SGI212\| + TP2) 0.17801 |
| HIF221 | 0.25058 | HIF221/HOI 0.24376 | SGI221 | 0.00695 | \|SGI221\|/(\|SGI221\| + TP2) 0.03927 |
| HIF311 | 0.14881 | HIF311/HOI 0.14476 | SGI311 | −0.00854 | \|SGI311\|/(\|SGI311\| + TP3) 0.02386 |
| HIF312 | 0.31992 | HIF312/HOI 0.31120 | SGI312 | −0.01783 | \|SGI312\|/(\|SGI312\| + TP3) 0.04855 |
| HIF313 | 0.32956 | HIF313/HOI 0.32058 | SGI313 | −0.01801 | \|SGI313\|/(\|SGI313\| + TP3) 0.04902 |
| HIF321 | 0.36943 | HIF321/HOI 0.35937 | SGI321 | −0.14878 | \|SGI321\|/(\|SGI321\| + TP3) 0.29862 |
| HIF411 | 0.01147 | HIF411/HOI 0.01116 | SGI411 | −0.00000 | \|SGI411\|/(\|SGI411\| + TP4) 0.00001 |
| HIF412 | 0.22405 | HIF412/HOI 0.21795 | SGI412 | 0.01598 | \|SGI412\|/(\|SGI412\| + TP4) 0.08304 |
| HIF421 | 0.24105 | HIF421/HOI 0.23448 | SGI421 | 0.05924 | \|SGI421\|/(\|SGI421\| + TP4) 0.25131 |

The figures related to the profile curve lengths obtained based on Table 9 and Table 10 are listed in the following table:

| Fifth optical embodiment (Reference wavelength: 555 nm) | | | | | | |
|---|---|---|---|---|---|---|
| ARE | ½(HEP) | ARE value | ARE−½(HEP) | 2(ARE/HEP) % | TP | ARE/TP (%) |
| 11 | 0.368 | 0.374 | 0.00578 | 101.57% | 0.210 | 178.10% |
| 12 | 0.366 | 0.368 | 0.00240 | 100.66% | 0.210 | 175.11% |
| 21 | 0.372 | 0.375 | 0.00267 | 100.72% | 0.170 | 220.31% |
| 22 | 0.372 | 0.371 | −0.00060 | 99.84% | 0.170 | 218.39% |
| 31 | 0.372 | 0.372 | −0.00023 | 99.94% | 0.349 | 106.35% |
| 32 | 0.372 | 0.404 | 0.03219 | 108.66% | 0.349 | 115.63% |
| 41 | 0.372 | 0.373 | 0.00112 | 100.30% | 0.176 | 211.35% |
| 42 | 0.372 | 0.387 | 0.01533 | 104.12% | 0.176 | 219.40% |
| ARS | EHD | ARS value | ARS−EHD | (ARS/EHD)% | TP | ARS/TP (%) |
| 11 | 0.368 | 0.374 | 0.00578 | 101.57% | 0.210 | 178.10% |
| 12 | 0.366 | 0.368 | 0.00240 | 100.66% | 0.210 | 175.11% |
| 21 | 0.387 | 0.391 | 0.00383 | 100.99% | 0.170 | 229.73% |
| 22 | 0.458 | 0.460 | 0.00202 | 100.44% | 0.170 | 270.73% |
| 31 | 0.476 | 0.478 | 0.00161 | 100.34% | 0.349 | 136.76% |

-continued

| Fifth optical embodiment (Reference wavelength: 555 nm) | | | | | | |
|---|---|---|---|---|---|---|
| 32 | 0.494 | 0.538 | 0.04435 | 108.98% | 0.349 | 154.02% |
| 41 | 0.585 | 0.624 | 0.03890 | 106.65% | 0.176 | 353.34% |
| 42 | 0.798 | 0.866 | 0.06775 | 108.49% | 0.176 | 490.68% |

Sixth Optical Embodiment

Figure 7A:
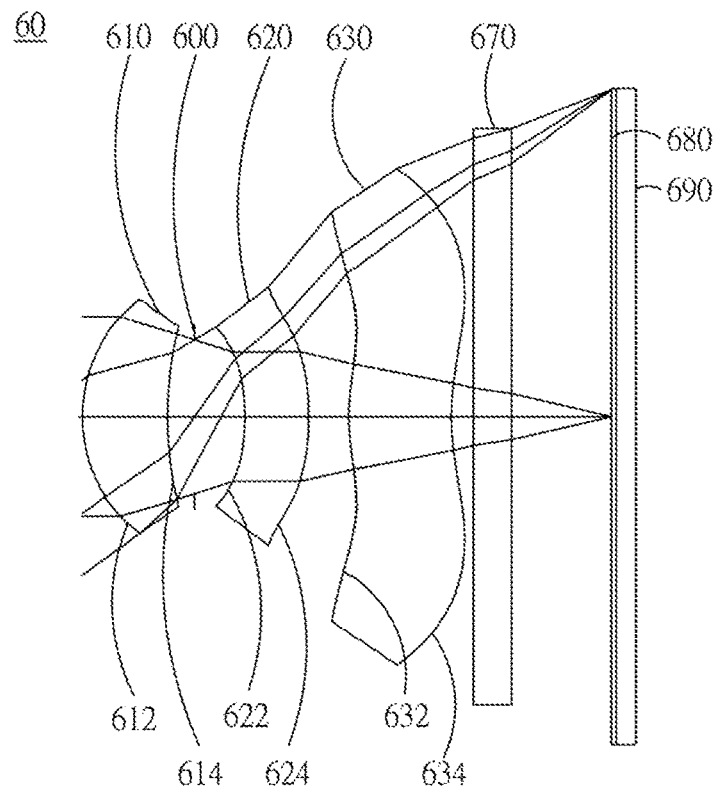
FIG. 7A is a schematic diagram of a sixth optical embodiment of the present invention.
Figure 7B:
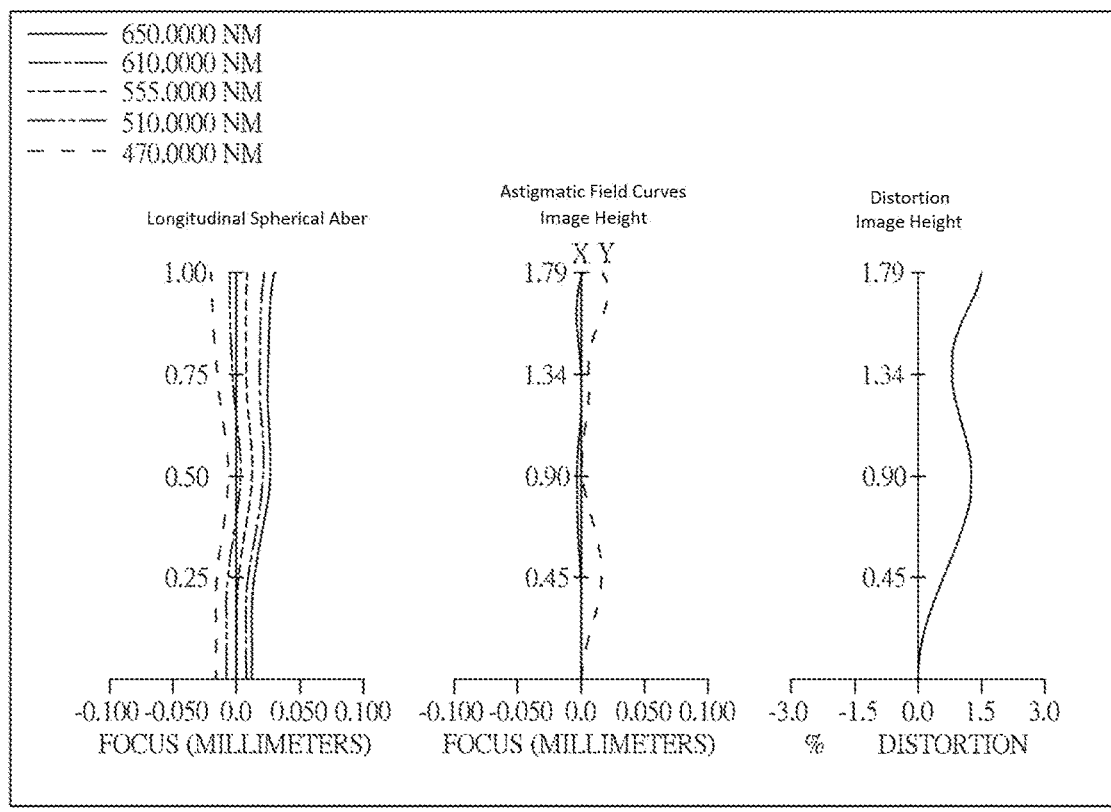
FIG. 7B shows curve diagrams of longitudinal spherical aberration, astigmatic field, and optical distortion of the optical image capturing module in the order from left to right of the sixth optical embodiment of the present application.

As shown in FIG. 7A and FIG. 7B, an optical image capturing module of the sixth optical embodiment of the present invention includes, along an optical axis from an object side to an image side, a first lens 610, an aperture 600, a second lens 620, a third lens 630, an IR-cut filter 670, an image plane 680, and an image sensor 690.

The first lens 610 has positive refractive power and is made of plastic. An object-side surface 612, which faces the object side, is a convex aspheric surface, and an image-side surface 614, which faces the image side, is a concave aspheric surface.

The second lens 620 has negative refractive power and is made of plastic. An object-side surface 622 thereof, which faces the object side, is a concave aspheric surface, and an image-side surface 624 thereof, which faces the image side, is a convex aspheric surface. The image-side surface 624 has an inflection point.

The third lens 630 has positive refractive power and is made of plastic. An object-side surface 632, which faces the object side, is a convex aspheric surface, and an image-side surface 634, which faces the image side, is a concave aspheric surface. The object-side surface 632 has two inflection points, and the image-side surface 634 has an inflection point.

The IR-cut filter 670 is made of glass and is disposed between the third lens 630 and the image plane 680. The IR-cut filter 670 gives no contribution to the focal length of the optical image capturing module.

The parameters of the lenses of the sixth optical embodiment are listed in Table 11 and Table 12.

TABLE 11

| f = 2.41135 mm; f/HEP = 2.22; HAF = 36 deg | | | | | | |
|---|---|---|---|---|---|---|
| Surface | | Radius of curvature (mm) | Thickness (mm) | Material | Refractive index | Abbe number | Focal length (mm) |
| 0 | Object | 1E+18 | 600 | | | | |
| 1 | 1$^{st}$ lens | 0.840352226 | 0.468 | plastic | 1.535 | 56.27 | 2.232 |
| 2 | | 2.271975602 | 0.148 | | | | |
| 3 | Aperture | 1E+18 | 0.277 | | | | |
| 4 | 2$^{nd}$ lens | −1.157324239 | 0.349 | plastic | 1.642 | 22.46 | −5.221 |
| 5 | | −1.968404008 | 0.221 | | | | |
| 6 | 3$^{rd}$ lens | 1.151874235 | 0.559 | plastic | 1.544 | 56.09 | 7.360 |
| 7 | | 1.338105159 | 0.123 | | | | |
| 8 | Infrared rays filter | 1E+18 | 0.210 | BK7 | 1.517 | 64.13 | |
| 9 | | 1E+18 | 0.547 | | | | |
| 10 | Image plane | 1E+18 | 0.000 | | | | |

Reference wavelength (d-line): 555 nm; the position of blocking light: the effective half diameter of the clear aperture of the first surface is 0.640 mm.

TABLE 12

| Coefficients of the aspheric surfaces | | | | | | |
|---|---|---|---|---|---|---|
| Surface | 1 | 2 | 4 | 5 | 6 | 7 |
| k | −2.019203E−01 | 1.528275E+01 | 3.743939E+00 | −1.207814E+01 | −1.276860E+01 | −3.034004E+00 |
| A4 | 3.944883E−02 | −1.670490E−01 | −4.266331E−01 | −1.696843E+00 | −7.396546E−01 | −5.308488E−01 |
| A6 | 4.774062E−01 | 3.857435E+00 | −1.423859E+00 | 5.164775E+00 | 4.449101E−01 | 4.374142E−01 |
| A8 | −1.528780E+00 | −7.091408E+01 | 4.119587E+01 | −1.445541E+01 | 2.622372E−01 | −3.111192E−01 |
| A10 | 5.133947E+00 | 6.365801E+02 | −3.456462E+02 | 2.876958E+01 | −2.510946E−01 | 1.354257E−01 |
| A12 | −6.250496E+00 | −3.141002E+03 | 1.495452E+03 | −2.662400E+01 | −1.048030E−01 | −2.652902E−02 |
| A14 | 1.068803E+00 | 7.962834E+03 | −2.747802E+03 | 1.661634E+01 | 1.462137E−01 | −1.203306E−03 |
| A16 | 7.995491E+00 | −8.268637E+03 | 1.443133E+03 | −1.327827E+01 | −3.676651E−02 | 7.805611E−04 |

An equation of the aspheric surfaces of the sixth optical embodiment is the same as that of the first optical embodiment, and the definitions are the same as well.

The exact parameters of the sixth optical embodiment based on Table 11 and Table 12 are listed in the following table:

| Sixth optical embodiment (Reference wavelength: 555 nm) | | | | | |
|---|---|---|---|---|---|
| |f/f1| | |f/f2| | |f/f3| | |f1/f2| | |f2/f3| | TP1/TP2 |
| 1.08042 | 0.46186 | 0.32763 | 2.33928 | 1.40968 | 1.33921 |
| Σ PPR | Σ NPR | ΣPPR/|Σ NPR| | IN12/f | IN23/f | TP2/TP3 |
| 1.40805 | 0.46186 | 3.04866 | 0.17636 | 0.09155 | 0.62498 |
| TP2/(IN12 + TP2 + IN23) | | (TP1 + IN12)/TP2 | | (TP3 + IN23)/TP2 | |
| 0.35102 | | 2.23183 | | 2.23183 | |
| HOS | InTL | HOS/HOI | InS/HOS | |ODT|% | |TDT|% |
| 2.90175 | 2.02243 | 1.61928 | 0.78770 | 1.50000 | 0.71008 |
| HVT21 | HVT22 | HVT31 | HVT32 | HVT32/HOI | HVT32/HOS |
| 0.00000 | 0.00000 | 0.46887 | 0.67544 | 0.37692 | 0.23277 |
| PhiA | PhiC | PhiD | TH1 | TH2 | HOI |
| 2.716 mm | 3.116 mm | 3.616 mm | 0.25 mm | 0.2 mm | 1.792 mm |
| PhiA/PhiD | TH1 + TH2 | (TH1 + TH2)/HOI | (TH1 + TH2)/HOS | 2(TH1 + TH2)/PhiA | InTL/HOS |
| 0.7511 | 0.45 mm | 0.2511 | 0.1551 | 0.3314 | 0.6970 |
| PLTA | PSTA | NLTA | NSTA | SLTA | SSTA |
| −0.002 mm | 0.008 mm | 0.006 mm | −0.008 mm | −0.007 mm | 0.006 mm |

The results of the equations of the sixth optical embodiment based on Table 11 and Table 12 are listed in the following table:

| Values related to the inflection points of the sixth optical embodiment (Reference wavelength: 555 nm) | | | | | | | |
|---|---|---|---|---|---|---|---|
| HIF221 | 0.5599 | HIF221/HOI | 0.3125 | SGI221 | −0.1487 | |SGI221|/(|SGI221| + TP2) | 0.2412 |
| HIF311 | 0.2405 | HIF311/HOI | 0.1342 | SGI311 | 0.0201 | |SGI311|/(|SGI311| + TP3) | 0.0413 |
| HIF312 | 0.8255 | HIF312/HOI | 0.4607 | SGI312 | −0.0234 | |SGI312|/(|SGI312| + TP3) | 0.0476 |
| HIF321 | 0.3505 | HIF321/HOI | 0.1956 | SGI321 | 0.0371 | |SGI321|/(|SGI321| + TP3) | 0.0735 |

The figures related to the profile curve lengths obtained based on Table 11 and Table 12 are listed in the following table:

| Sixth optical embodiment (Reference wavelength: 555 nm) | | | | | | |
|---|---|---|---|---|---|---|
| ARE | ½(HEP) | ARE value | ARE-½(HEP) | 2(ARE/HEP) % | TP | ARE/TP (%) |
| 11 | 0.546 | 0.598 | 0.052 | 109.49% | 0.468 | 127.80% |
| 12 | 0.500 | 0.506 | 0.005 | 101.06% | 0.468 | 108.03% |
| 21 | 0.492 | 0.528 | 0.036 | 107.37% | 0.349 | 151.10% |
| 22 | 0.546 | 0.572 | 0.026 | 104.78% | 0.349 | 163.78% |
| 31 | 0.546 | 0.548 | 0.002 | 100.36% | 0.559 | 98.04% |
| 32 | 0.546 | 0.550 | 0.004 | 100.80% | 0.559 | 98.47% |
| ARS | EHD | ARS value | ARS-EHD | (ARS/EHD)% | TP | ARS/TP (%) |
| 11 | 0.640 | 0.739 | 0.099 | 115.54% | 0.468 | 158.03% |
| 12 | 0.500 | 0.506 | 0.005 | 101.06% | 0.468 | 108.03% |
| 21 | 0.492 | 0.528 | 0.036 | 107.37% | 0.349 | 151.10% |
| 22 | 0.706 | 0.750 | 0.044 | 106.28% | 0.349 | 214.72% |
| 31 | 1.118 | 1.135 | 0.017 | 101.49% | 0.559 | 203.04% |
| 32 | 1.358 | 1.489 | 0.131 | 109.69% | 0.559 | 266.34% |

The optical image capturing module of the present invention could be one of a group consisting of an electronic portable device, an electronic wearable device, an electronic monitoring device, an electronic information device, an electronic communication device, a machine vision device, and a vehicle electronic device. In addition, the optical image capturing module of the present invention could reduce the required mechanism space and increase the visible area of the screen by using different lens groups with different number of lens.

Figure 8A:
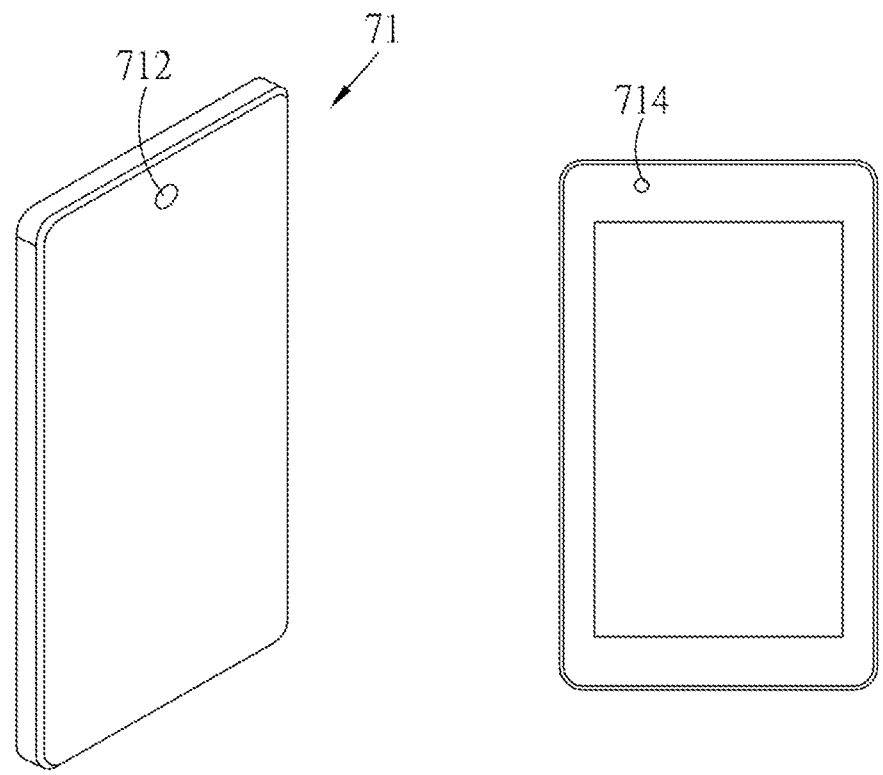
FIG. 8A is a schematic diagram, showing the optical image capturing module of the present invention is applied to the mobile communication device.
Figure 8B:
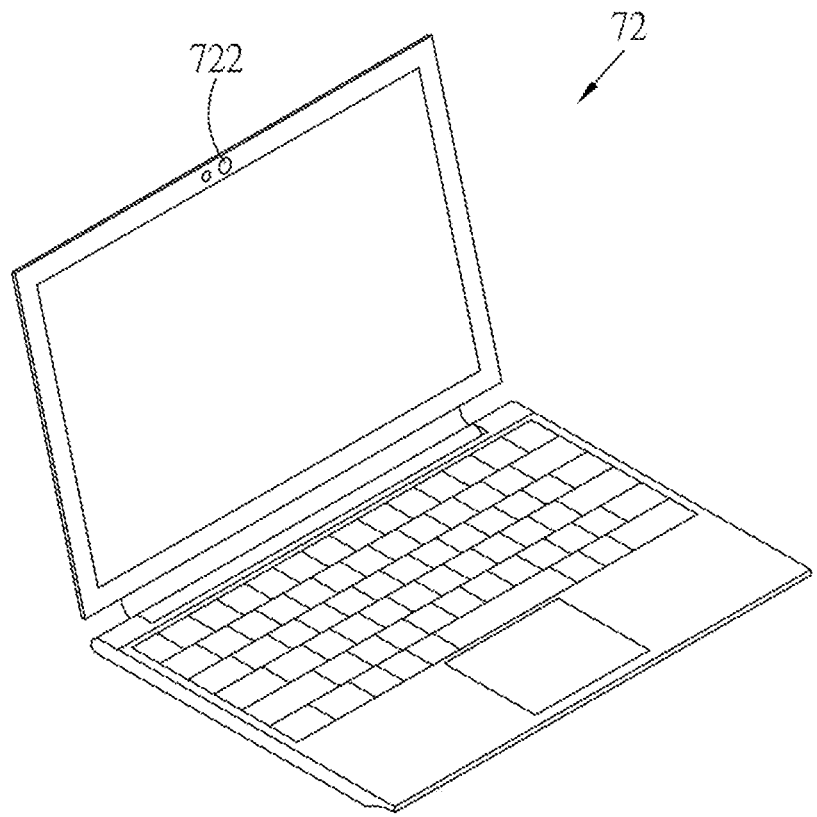
FIG. 8B is a schematic diagram, showing the optical image capturing module of the present invention is applied to the mobile information device.
Figure 8C:
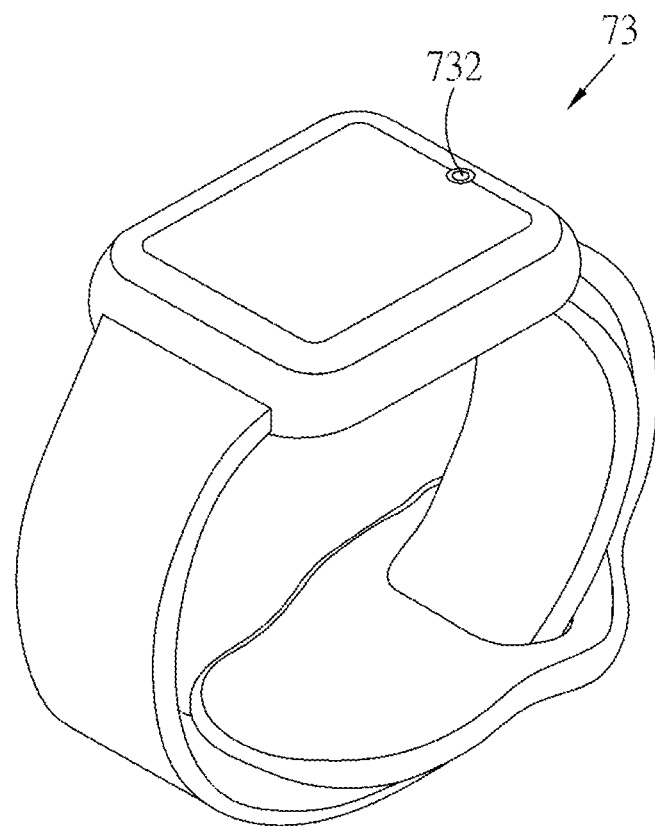
FIG. 8C is a schematic diagram, showing the optical image capturing module of the present invention is applied to the smart watch.
Figure 8D:
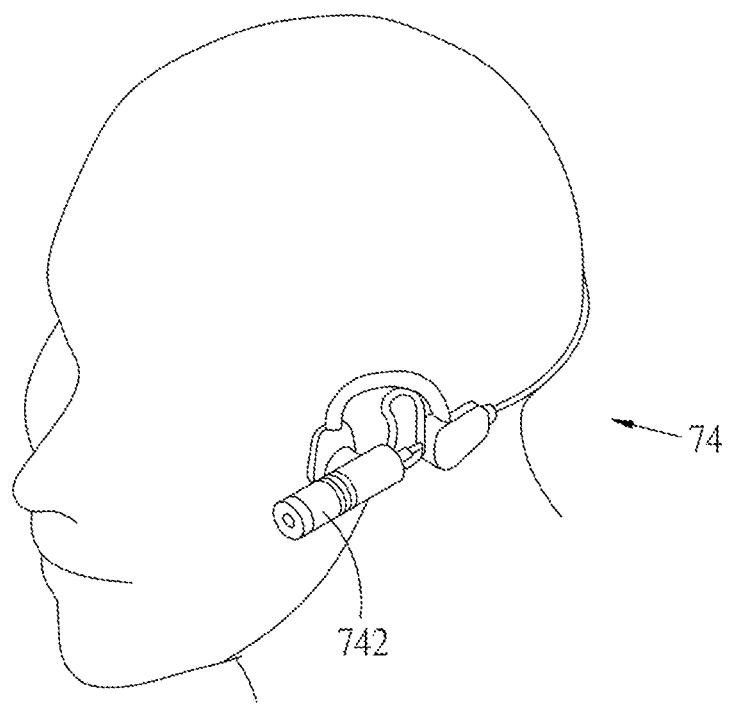
FIG. 8D is a schematic diagram, showing the optical image capturing module of the present invention is applied to the smart head-wearing device.
Figure 8E:
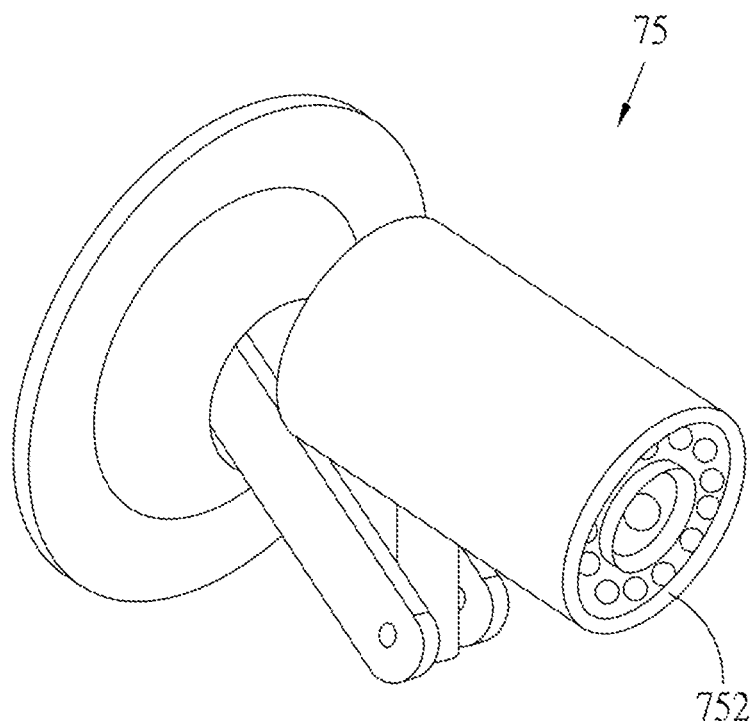
FIG. 8E is a schematic diagram, showing the optical image capturing module of the present invention is applied to the safety monitoring device.
Figure 8F:
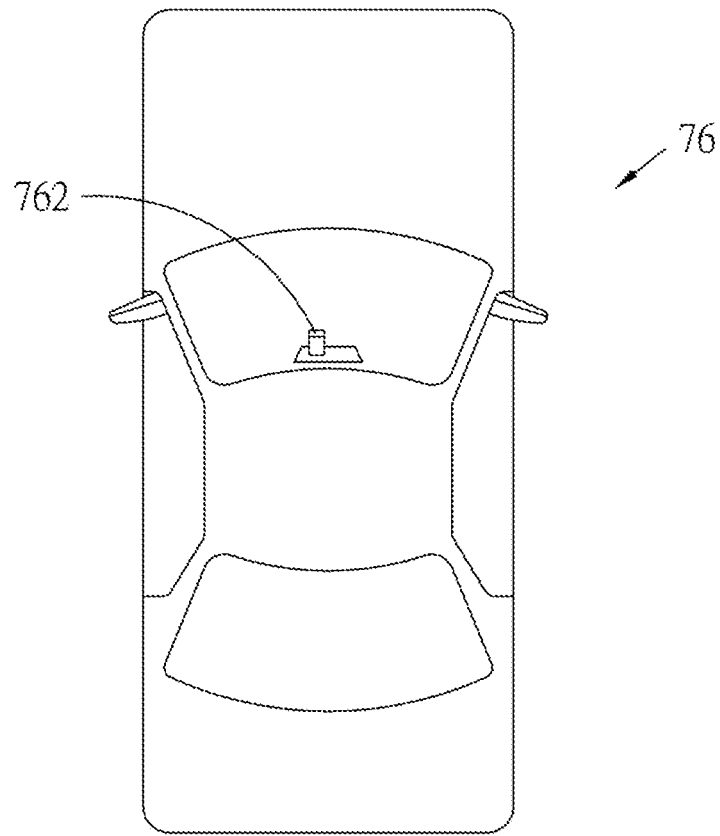
FIG. 8F is a schematic diagram, showing the optical image capturing module of the present invention is applied to the vehicle image device.
Figure 8G:
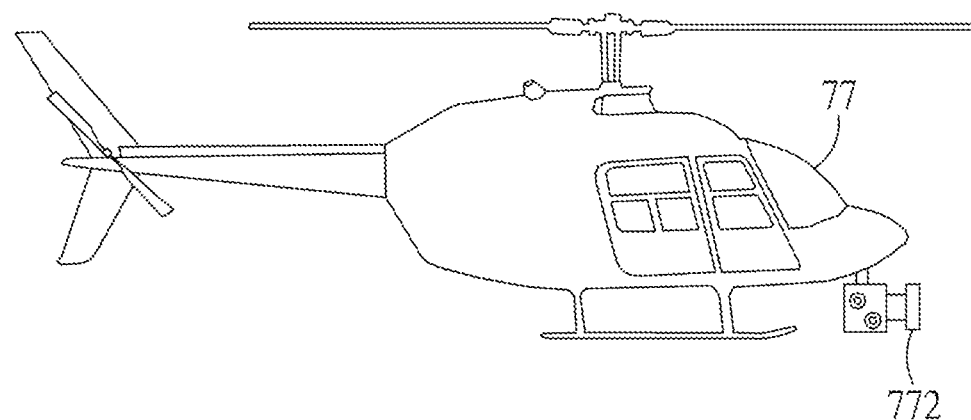
FIG. 8G is a schematic diagram, showing the optical image capturing module of the present invention is applied to the unmanned aircraft device.
Figure 8H:
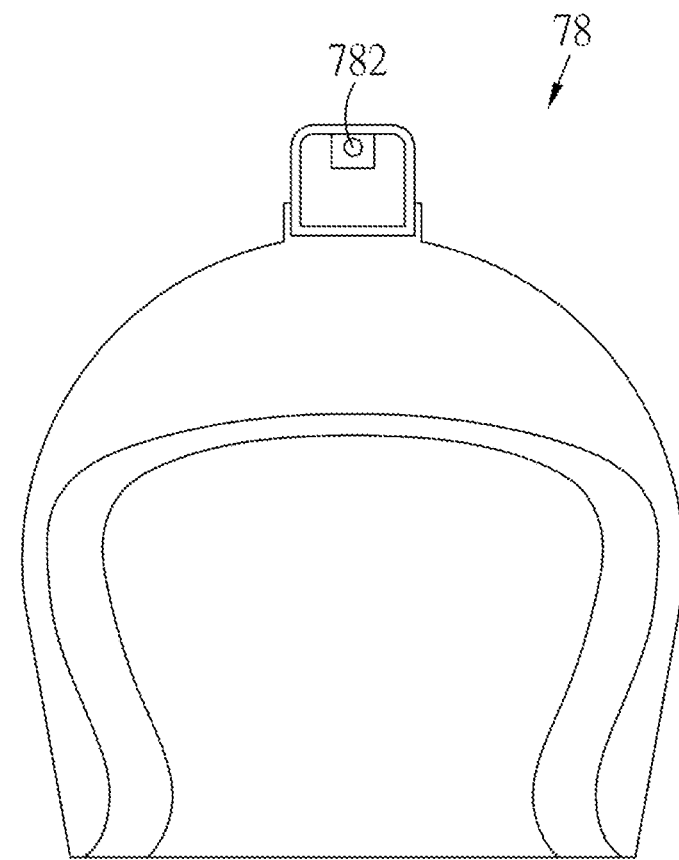
FIG. 8H is a schematic diagram, showing the optical image capturing module of the present invention is applied to the extreme sport image device.

As shown in FIG. 8A, an optical image capturing module 712 and an optical image capturing module 714 (front lens) of the present invention are applied to a mobile communication device 71 (e.g. a smart phone). As shown in FIG. 8B, an optical image capturing module 722 of the present invention is applied to a mobile information device 72 (e.g. a notebook). As shown in FIG. 8C, an optical image capturing module 732 of the present invention is applied to a smart watch 73. As shown in FIG. 8D, an optical image capturing module 742 of the present invention is applied to a smart head-wearing device 74 (e.g. a smart hat). As shown in FIG. 8E, an optical image capturing module 752 of the present invention is applied to a safety monitoring device 75 (e.g. an IP cam). As shown in FIG. 8F, an optical image capturing module 762 of the present invention is applied to a vehicle image device 76. As shown in FIG. 8G, an optical image capturing module 772 of the present invention is applied to an unmanned aircraft device 77. As shown in FIG. 8H, an optical image capturing module 782 of the present invention is applied to an extreme sport image device 78.

It must be pointed out that the embodiments described above are only some embodiments of the present invention. All equivalent structures which employ the concepts disclosed in this specification and the appended claims should fall within the scope of the present invention.

What is claimed is:

1. An optical image capturing module, comprising:
   a circuit assembly comprising a circuit substrate, a sensor holder, and an image sensing component, wherein the circuit substrate has a plurality of circuit contacts thereon; the sensor holder is disposed on the circuit substrate; the image sensing component has a first surface and a second surface, wherein the first surface is connected to the circuit substrate; the second surface has a sensing surface and a plurality of image contacts; each of the image contacts is electrically connected to one of the circuit contacts on the circuit substrate via a plurality of signal transmission elements; the image sensing component and the signal transmission elements are surrounded by the sensor holder; and
   a lens assembly comprising a lens base and a lens group, wherein the lens base is made of an opaque material and has a receiving hole penetrating through two ends of the lens base, so that the lens base is hollow; the lens base is disposed on the sensor holder, so that the receiving hole directly faces the image sensing component; the lens group comprises at least two lenses having refractive power, and is disposed on the lens base and is located in the receiving hole; an image plane of the lens group is located on the sensing surface, and an optical axis of the lens group overlaps with a central normal of the sensing surface, so that a light passes through the lens group in the receiving hole and projects onto the sensing surface;
   wherein the optical image capturing module satisfies:

$1.0 \leq f/HEP \leq 10.0$;

$0 \deg < HAF \leq 150 \deg$;

$0 \text{ mm} < PhiD \leq 18 \text{ mm}$;

$0 < PhiA/PhiD \leq 0.99$; and $0.9 \leq 2(ARE/HEP) \leq 2.0$;

where f is a focal length of the lens group; HEP is an entrance pupil diameter of the lens group; HAF is a half of a maximum field angle of the lens group; PhiD is a maximum value of a minimum length on a periphery of the lens base perpendicular to the optical axis of the lens group; PhiA is a maximum effective diameter of an image-side surface of the at least two lenses of the lens group closest to the image plane; ARE is a profile curve length measured from a start point where the optical axis of the lens group passes through any surface of one of the at least two lenses, along a surface profile of the corresponding lens, and finally to a coordinate point of a perpendicular distance where is a half of the entrance pupil diameter away from the optical axis.

2. The optical image capturing module of claim 1, wherein the optical image capturing module further satisfies:

$0.9 \leq ARS/EHD \leq 2.0$;

where for any surface of any lens, ARS is a profile curve length measured from a start point where the optical axis passes therethrough, along a surface profile thereof, and finally to an end point of a maximum effective half diameter thereof; EHD is the maximum effective half diameter thereof.

3. The optical image capturing module of claim 1, wherein the optical image capturing module further satisfies:

$PLTA \leq 100 \text{ μm}$;

$PSTA \leq 100 \text{ μm}$;

$NLTA \leq 100 \text{ μm}$;

$NSTA \leq 100 \text{ μm}$;

$SLTA \leq 100 \text{ μm}$;

$SSTA \leq 100 \text{ μm}$; and $|TDT| < 250\%$, where HOI is a maximum height for image formation perpendicular to the optical axis on the image plane; PLTA is a transverse aberration at 0.7 HOI in a positive direction of a tangential ray fan aberration after a longest operation wavelength passing through an edge of the entrance pupil; PSTA is a transverse aberration at 0.7 HOI in the positive direction of the tangential ray fan aberration after a shortest operation wavelength passing through the edge of the entrance pupil; NLTA is a transverse aberration at 0.7 HOI in a negative direction of the tangential ray fan aberration after the longest operation wavelength passing through the edge of the entrance pupil; NSTA is a transverse aberration at 0.7 HOI in the negative direction of the tangential ray fan aberration after the shortest operation wavelength passing through the edge of the entrance pupil; SLTA is a transverse aberration at 0.7 HOI of a sagittal ray fan aberration after the longest operation wavelength passing through the edge of the entrance pupil; SSTA is a transverse aberration at 0.7 HOI of the sagittal ray fan aberration after the shortest operation wavelength passing through the edge of the entrance pupil; TDT is a TV distortion for image formation in the optical image capturing module.

4. The optical image capturing module of claim 1, wherein the lens group comprises four lenses having refractive power, which are constituted by a first lens, a second lens, a third lens, and a fourth lens in order along an optical axis from an object side to an image side; the lens group satisfies:

$0.1 \leq InTL/HOS \leq 0.95$;

where HOS is a distance in parallel with the optical axis between an object-side surface of the first lens and the image plane; InTL is a distance in parallel with the optical axis from the object-side surface of the first lens to an image-side surface of the fourth lens.

5. The optical image capturing module of claim 1, wherein the lens group comprises five lenses having refractive power, which are constituted by a first lens, a second lens, a third lens, a fourth lens, and a fifth lens in order along an optical axis from an object side to an image side; the lens group satisfies:

$$0.1 \leq InTL/HOS \leq 0.95;$$

where HOS is a distance in parallel with the optical axis between an object-side surface of the first lens and the image plane; InTL is a distance in parallel with the optical axis from the object-side surface of the first lens to an image-side surface of the fifth lens.

6. The optical image capturing module of claim 1, wherein the lens group comprises six lenses having refractive power, which are constituted by a first lens, a second lens, a third lens, a fourth lens, a fifth lens, and a six lens in order along an optical axis from an object side to an image side; the lens group satisfies:

$$0.1 \leq InTL/HOS \leq 0.95;$$

where HOS is a distance in parallel with the optical axis between an object-side surface of the first lens and the image plane; InTL is a distance in parallel with the optical axis from the object-side surface of the first lens to an image-side surface of the sixth lens.

7. The optical image capturing module of claim 1, wherein the lens group comprises seven lenses having refractive power, which are constituted by a first lens, a second lens, a third lens, a fourth lens, a fifth lens, a sixth lens, and a seventh lens in order along an optical axis from an object side to an image side; the lens group satisfies:

$$0.1 \leq InTL/HOS \leq 0.95;$$

where HOS is a distance in parallel with the optical axis between an object-side surface of the first lens and the image plane; InTL is a distance in parallel with the optical axis from the object-side surface of the first lens to an image-side surface of the seventh lens.

8. The optical image capturing module of claim 1, wherein the optical image capturing module further satisfies:

$$MTFQ0 \geq 0.2;$$

$$MTFQ3 \geq 0.01; \text{ and}$$

$$MTFQ7 \geq 0.01;$$

where HOI is a maximum height for image formation perpendicular to the optical axis on the image plane; MTFQ0, MTFQ3, and MTFQ7 are respectively a value of modulation transfer function of visible light in a spatial frequency of 110 cycles/mm at the optical axis, 0.3 HOI, and 0.7 HOI on an image plane for visible light.

9. The optical image capturing module of claim 1, further comprising an aperture, wherein the optical image capturing module further satisfies:

$$0.2 \leq InS/HOS \leq 1.1;$$

where InS is a distance on the optical axis between the aperture and the image plane; HOS is a distance in parallel with the optical axis between an object-side surface of one of the at least two lenses of the lens group furthest from the image plane and the image plane.

10. The optical image capturing module of claim 1, wherein the lens base further comprises a lens barrel and a lens holder; the lens holder is fixed on the circuit substrate and has a lower through hole penetrating through two ends of the lens holder, so that the image sensing component is located in the lower through hole; the lens barrel is disposed in the lens holder and is located in the lower through hole, and has an upper through hole penetrating through two ends of the lens barrel, so that the upper through hole communicates with the lower through hole to form the receiving hole; the lens base is firmly disposed on the sensor holder; the upper through hole of the lens barrel directly faces the sensing surface of the image sensing component; the lens group is disposed in the lens barrel to be located in the upper through hole; PhiD is a maximum value of a minimum length on a periphery of the lens holder perpendicular to an optical axis of the lens group.

11. The optical image capturing module of claim 10, wherein the optical image capturing module further satisfies:

$$0 \text{ mm} < TH1+TH2 \leq 1.5 \text{ mm};$$

where TH1 is a maximum thickness of the lens holder; TH2 is a minimum thickness of the lens barrel.

12. The optical image capturing module of claim 10, wherein the optical image capturing module further satisfies:

$$0 < (TH1+TH2)/HOI \leq 0.95;$$

where TH1 is a maximum thickness of the lens holder; TH2 is a minimum thickness of the lens barrel; HOI is a maximum height for image formation perpendicular to the optical axis on the image plane.

13. The optical image capturing module of claim 10, wherein an outer peripheral wall of the lens barrel has an external thread thereon, and an inner wall of the lower through hole has an inner thread thereon, wherein the inner thread is screwed with the external thread, so that the lens barrel is disposed in the lens holder to be fixed in the lower through hole.

14. The optical image capturing module of claim 10, wherein a glue is coated between the lens barrel and the lens holder, and the lens barrel and the lens holder are fixed to each other via the glue, so that the lens barrel is disposed in the lens holder and is fixed in the lower through hole.

15. The optical image capturing module of claim 1, wherein the lens base is integrally formed as a monolithic unit.

16. The optical image capturing module of claim 15, wherein the optical image capturing module further comprises an IR-cut filter which is disposed in the lens base or on the sensor holder to be located above the image sensing component.

17. The optical image capturing module of claim 10, wherein the optical image capturing module further comprises an IR-cut filter which is disposed in the lens barrel or in the lens holder or on the sensor holder to be located above the image sensing component.

18. The optical image capturing module of claim 1, wherein the optical image capturing module further comprises an IR-cut filter; the lens base comprises a filter holder; the filter holder has a through hole penetrating through two ends of the filter holder; the IR-cut filter is disposed in the filter holder and is located in the through hole of the filter holder; the filter holder is disposed on the sensor holder, so that the IR-cut filter is located above the image sensing component.

19. The optical image capturing module of claim 18, wherein the lens base further comprises a lens barrel and a lens holder; the lens barrel has an upper through hole penetrating through two ends of the lens barrel, and the lens holder has a lower through hole penetrating through two ends of the lens holder; the lens barrel is disposed in the lens holder and is located in the lower through hole, and the lens holder is fixed on the filter holder, so that the upper through hole, the lower through hole, and the through hole of the filter holder communicate with one another to form the receiving hole; the upper through hole of the lens barrel directly faces the sensing surface of the image sensing component; the lens group is disposed in the lens barrel to be located in the upper through hole; PhiD is a maximum value of a minimum length on a periphery of the lens holder perpendicular to an optical axis of the lens group.

20. The optical image capturing module of claim 19, wherein the optical image capturing module further satisfies:

$0\ mm < TH1+TH2 \leq 1.5\ mm;$ where TH1 is a maximum thickness of the lens holder; TH2 is a minimum thickness of the lens barrel.

21. The optical image capturing module of claim 19, wherein the optical image capturing module further satisfies:

$0 < (TH1+TH2)/HOI \leq 0.95;$ where TH1 is a maximum thickness of the lens holder; TH2 is a minimum thickness of the lens barrel; HOI is a maximum height for image formation perpendicular to the optical axis on the image plane.

22. The optical image capturing module of claim 19, wherein an outer peripheral wall of the lens barrel has an external thread thereon, and an inner wall of the lower through hole has an inner thread thereon, wherein the inner thread is screwed with the external thread, so that the lens barrel is disposed in the lens holder and is located in the lower through hole; a glue is coated between the lens holder and the filter holder, and the lens holder and the filter holder are fixed to each other via the glue, so that the lens holder is fixed on the filter holder.

23. The optical image capturing module of claim 19, wherein a glue is coated between the lens barrel and the lens holder, and the lens barrel and the lens holder are fixed to each other via the glue, so that the lens barrel is disposed in the lens holder and is located in the lower through hole; a glue is coated between the lens holder and the filter holder, and the lens holder and the filter holder are fixed to each other via the glue, so that the lens holder is fixed on the filter holder.

24. The optical image capturing module of claim 1, wherein each of the signal transmission elements is a gold wire, a projection, a pin, a flexible circuit board, a spring probe, or a group of their constituents.

25. An electronic device comprising the optical image capturing module of claim 1, wherein the electronic device is one of the group consisting of an electronic portable device, an electronic wearable device, an electronic monitoring device, an electronic information device, an electronic communication device, a machine vision device, and a vehicle electronic device.

* * * * *